(12) United States Patent
Hayakawa et al.

(10) Patent No.: US 8,073,033 B2
(45) Date of Patent: Dec. 6, 2011

(54) OPTICAL SEMICONDUCTOR DEVICE AND DRIVING METHOD THEREOF

(75) Inventors: Akinori Hayakawa, Kawasaki (JP); Ken Morito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/617,637

(22) Filed: Nov. 12, 2009

(65) Prior Publication Data

US 2010/0061414 A1  Mar. 11, 2010

(51) Int. Cl.
*H01S 5/00* (2006.01)

(52) U.S. Cl. ........... 372/50.11; 372/20; 372/96; 372/97; 372/46.01

(58) Field of Classification Search ............... 372/38.07, 372/20, 50.11, 26, 50.12, 96, 97, 46.01
See application file for complete search history.

(56) References Cited

U.S. PATENT DOCUMENTS

| | | | |
|---|---|---|---|
| 4,802,182 A | 1/1989 | Thornton et al. | |
| 4,920,542 A * | 4/1990 | Brosson et al. | 372/50.12 |
| 5,187,717 A | 2/1993 | Horita et al. | |
| 5,267,255 A | 11/1993 | Paoli | |
| 5,568,311 A | 10/1996 | Matsumoto | |
| 5,808,314 A * | 9/1998 | Nakajima et al. | 257/17 |
| 7,366,220 B2 | 4/2008 | Takabayashi | |

FOREIGN PATENT DOCUMENTS

| | | |
|---|---|---|
| JP | 4-147686 A | 5/1992 |
| JP | 4-147686 A | 5/1992 |
| JP | 5-283809 A | 10/1993 |
| JP | 5-283809 A | 10/1993 |
| JP | 7-326820 A | 12/1995 |
| JP | 7-326820 A | 12/1995 |
| JP | 8-97505 A | 4/1996 |
| JP | 8-172237 A | 7/1996 |
| JP | 2891741 B2 | 2/1999 |
| JP | 2966485 B2 | 8/1999 |
| JP | 2004-055647 A | 2/2004 |
| JP | 2004-055647 A | 2/2004 |
| JP | 2004-235600 A | 8/2004 |

(Continued)

OTHER PUBLICATIONS

"Japanese Office Action", mailed by JPO and corresponding to Japanese application No. 2005-104750 on Nov. 10, 2009.

(Continued)

*Primary Examiner* — Patrick Stafford
(74) *Attorney, Agent, or Firm* — Fujitsu Patent Center

(57) ABSTRACT

Objects are achieved by an optical semiconductor device comprising: a structure 61 including a substrate 50, a diffraction grating 52a, an active layer 54 and a refractive index control layer 60; and an laser element 100 including an electrode 92a for the active layer, an electrode 92b for the refractive index control layer and an electrode 92c for switching, wherein a pre-bias current is previously supplied from the electrode 92a for the active layer to the active layer 54 in a state where a switching current is not supplied from the electrode 92c for switching to the active layer 54, and then while a current $I_{drive}$ for activation is supplied from the electrode 92a for the active layer to the active layer 54, the laser element 100 is turned on by supplying the switching current $I_{sw}$ from the electrode 92c for switching to a part of the active layer 54, as well as turning off the laser element 100 by halting the supply of the switching current $I_{sw}$.

4 Claims, 53 Drawing Sheets

FOREIGN PATENT DOCUMENTS

| JP | 2005-64300 | A | | 3/2005 |
|----|------------|---|---|--------|
| JP | 2005-64300 | A | | 3/2005 |
| JP | 2006286928 | A | * | 10/2006 |

OTHER PUBLICATIONS

USPTO, (NIU) Supplemental Notice of Allowability, Nov. 12, 2009, in parent U.S. Appl. No. 11/250,434 [now issued USP 7,633,984].

USPTO, (NIU) Notice of Allowance and Notice of Allowability, Aug. 5, 2009, in parent U.S. Apppl. No. 11/250,434 [now issued USP 7,633,984].

USPTO, (NIU) Non-Final Rejection, Jan. 6, 2009, in parent U.S. Appl. No. 11/250,434 [now issued USP 7,633,984].

USPTO, (NIU) Non-Final Rejection, May 13, 2008, in parent U.S. Appl. No. 11/250,434 [now issued USP 7,633,984].

USPTO, (NIU) Election/Restriction Requirement, Mar. 4, 2008, in parent U.S. Appl. No. 11/250,434 [now issued USP 7,633,984].

"Japanese Office Action", Partial English-language translation, mailed by JPO and corresponding to Japanese application No. 2005-104750 on Nov. 10, 2009.

Paoletti et al., "Small chip size, low power consumption, fully electronic controlled tunable laser source with 40 nm tuning rand and 20 mW output power for WDM applications," ECOC2003 Proceeding, vol. 4, pp. 887-888 (1 page).

* cited by examiner

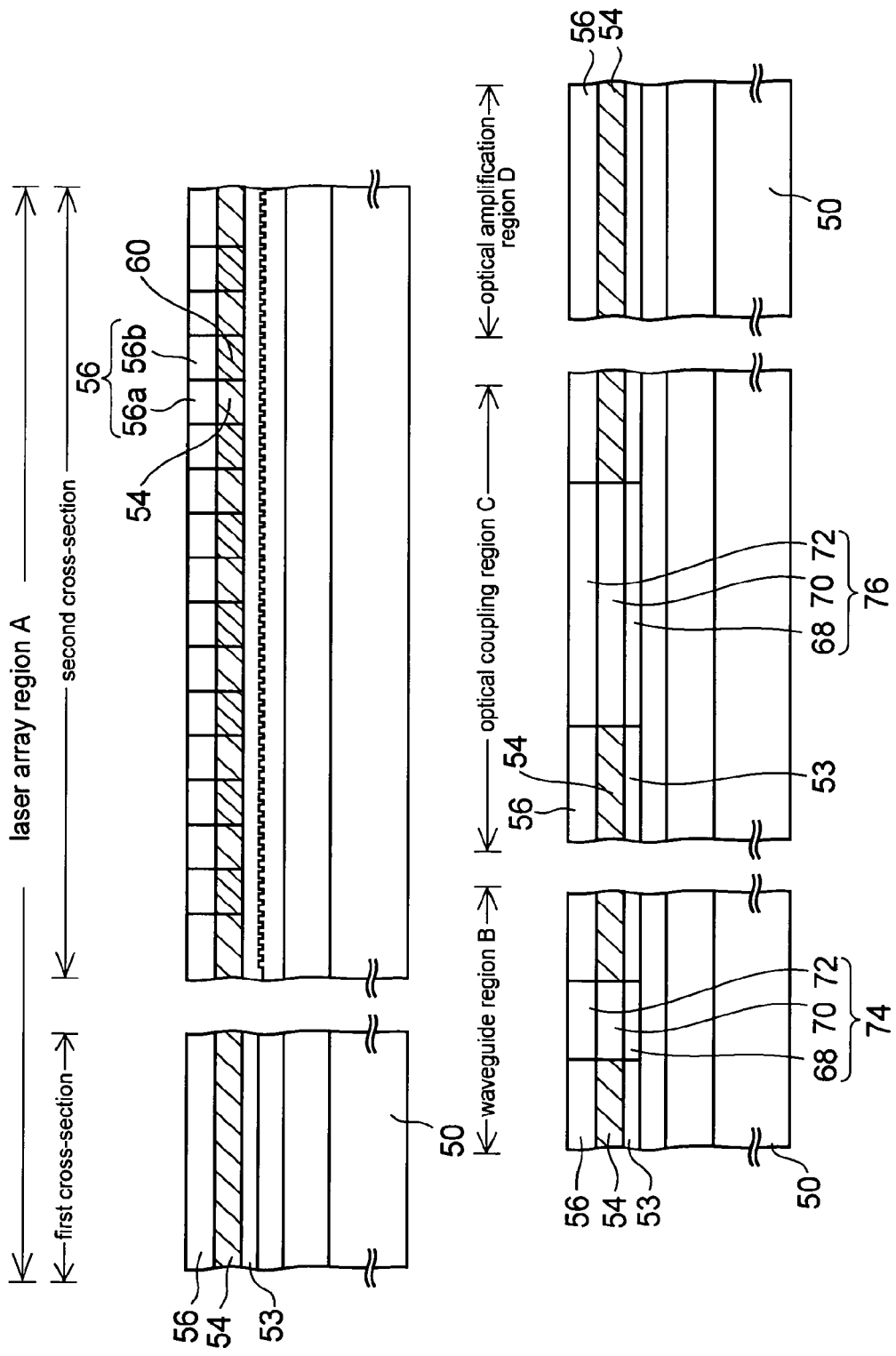

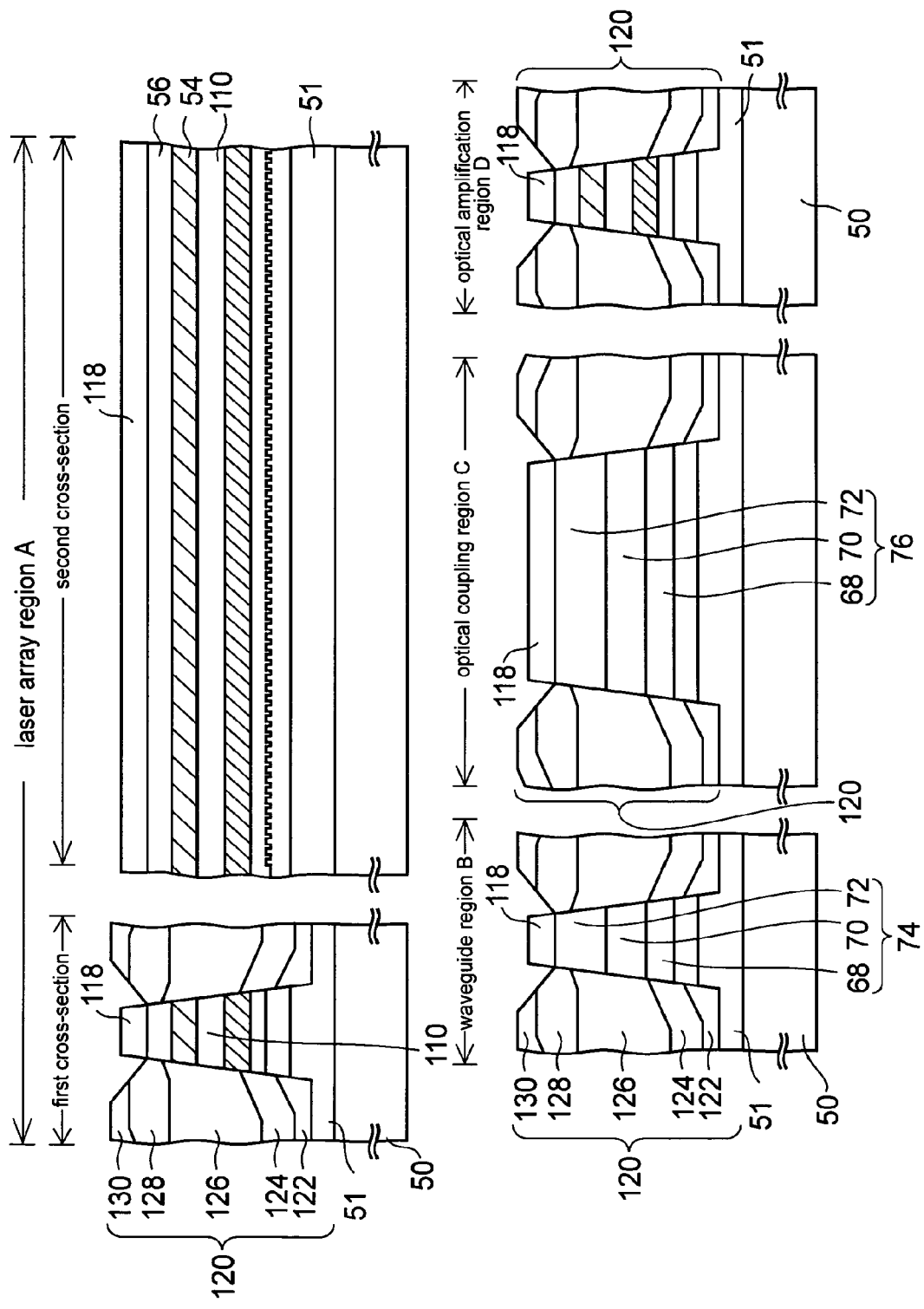

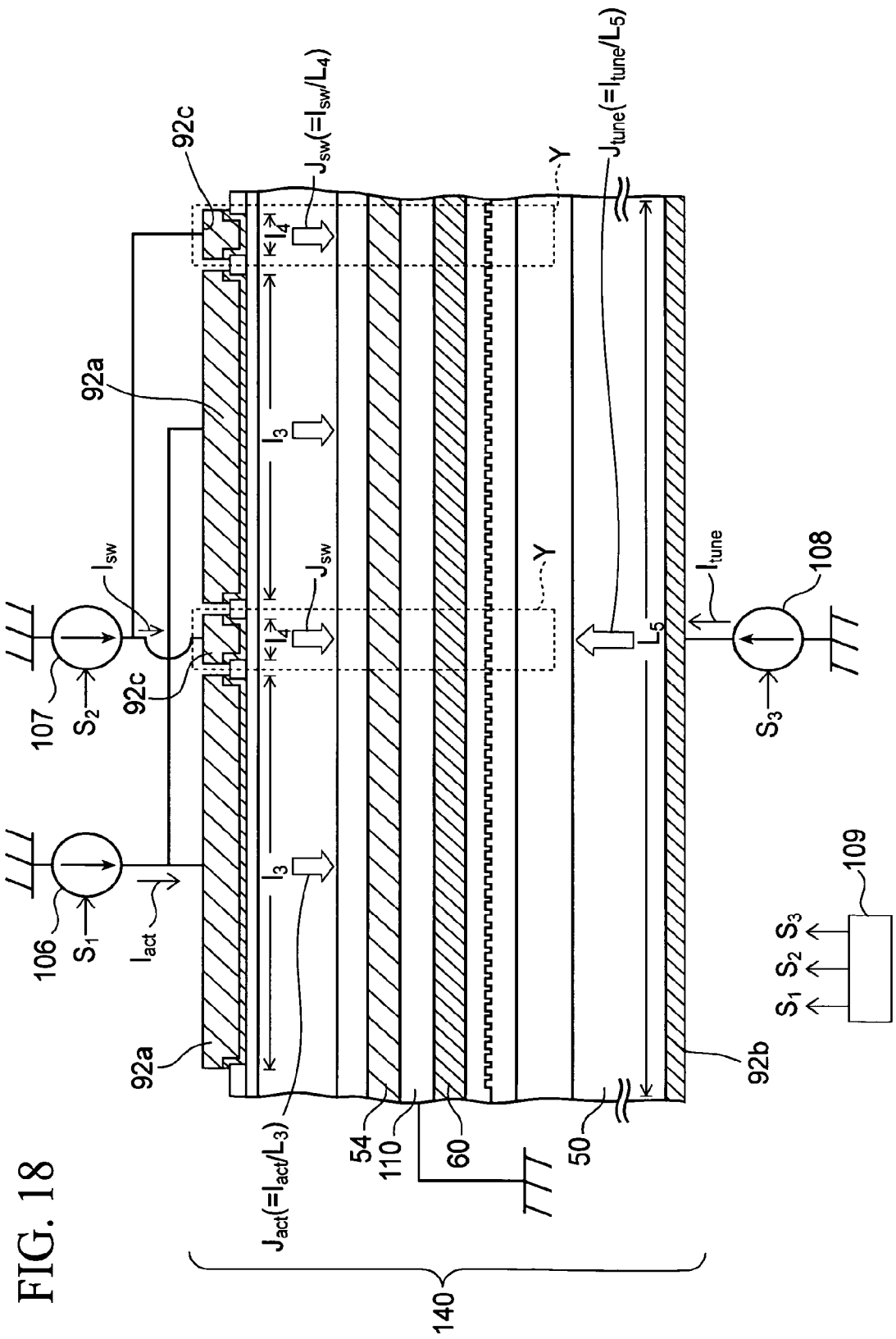

OPTICAL SEMICONDUCTOR DEVICE AND DRIVING METHOD THEREOF

CROSS-REFERENCE TO RELATED APPLICATIONS

This application is based on and claims priority of Japanese Patent Application No. 2005-104750 filed on Mar. 31, 2005, the entire contents of which are incorporated herein by reference.

BACK GROUND OF THE INVENTION

1. Field of the Invention

The present invention relates to an optical semiconductor device and a driving method thereof.

2. Description of the Related Art

With a significant increase in recent communications demand, a development of a wavelength division multiplexing system (a WDM system), which enables a large-capacity transmission with one optical fiber by multiplexing a plurality of optical signals to have different wavelengths, is under way. It is strongly required for the wavelength division multiplexing system to provide a wavelength-tunable optical semiconductor device which can select a desired wavelength from a wide range of wavelengths at high speed and output it upon realizing a flexible and advanced communication system.

As an example of a broadband wavelength-tunable semiconductor device of this kind, proposed is a wavelength-tunable optical semiconductor device of an array integrated type, which is formed on one common substrate by integrating a plurality of wavelength-tunable laser elements having a range of tunable wavelengths from several nm to several dozens nm.

FIG. 1 is a perspective view of the wavelength-tunable optical semiconductor device of the array integrated type. In this wavelength-tunable semiconductor, a plurality of wavelength-tunable laser elements 2 whose oscillation wavelengths are slightly different from each other are integrated on a compound semiconductor substrate 1. Moreover, the wavelength-tunable laser elements 2 are joined to bend waveguides 3, respectively. A signal is inputted to an optical amplifier 5 through an optical coupler 4 provided at the output ends of the waveguides 3, and is then outputted to the outside after the signal is amplified.

To achieve a broadband and high-speed wavelength-tunable operation, such a wavelength-tunable optical semiconductor device of the array integrated type is required that the tunable wavelength of every single laser element 2 be wide-ranging and that the wavelength-tunable operation be performed quickly.

Following Non-Patent Literature 1 discloses a point of using a distributed Bragg reflector (DBR) laser as the above-mentioned wavelength-tunable laser element 2.

FIG. 2 is a cross-sectional view along the cavity axis of the DBR laser. The DBR laser is broadly divided into an active region 18a, a phase control region 18b and a diffraction grating region 18c. Moreover, a diffraction grating 11 is formed on a compound semiconductor substrate 10 in the diffraction grating region 18c, and the diffraction grating 11 is embedded in a spacer layer 12 made of an n-type compound semiconductor. Furthermore, while an active layer 14 is formed on the spacer layer 12 in the active region 18a, a refractive index control layer 13, in which the band gap is wider than that of the active layer 14 and it has a low absorption coefficient, is formed on the spacer layer 12 in each of the phase control region 18b and the diffraction grating region 18c. In addition, a cladding layer 15 made of a p-type compound semiconductor is formed on each of the refractive index control layer 13 and the active layer 14. First to third electrodes 16a to 16c are formed on the cladding layer 15. Then, a ground electrode 17 is formed on the back side of the compound semiconductor substrate 10.

By use of the DBR laser fabricated as described above, laser light 19 is generated by injecting a current $I_{act}$ for activation to the active layer 14 from the first electrode 16a. Moreover, independently of the current $I_{act}$ for activation, the phase of the laser light 19 is adjusted by use of a plasma effect by injecting a current $I_{ps}$ for phase control into the refractive index control layer 13 from the second electrode 16b. Additionally, a current $I_{DBR}$ for refractive index control is injected from the third electrode 16c to the refractive index control layer 13. By adjusting the current amount of $I_{DBR}$, pitch of the diffraction grating 11 felt by the laser light 19 is made changed, thereby changing the wavelength of output light within a range of several nm.

Furthermore, following Patent Literature 1 discloses a point of using a tunable twin guide distributed feedback (TTG-DFB) laser as the wavelength-tunable laser element 2 which was explained in FIG. 1.

FIG. 3 is a cross-sectional view along the cavity axis of this TTG-DFB laser. The TTG-DFB laser is formed on a compound semiconductor substrate 20 by stacking layers in the following order: a diffraction grating 21, a spacer layer 22 made of a p-type compound semiconductor, a refractive index control layer 23, an interlayer 24 made of a p-type semiconductor layer, an active layer 25 whose band gap is wider than that of the refractive index control layer 23, a cladding layer 26 made of a p-type compound semiconductor.

Then, while the interlayer 24 is grounded, a first electrode 27 for injecting the current $I_{act}$ for activation into the active layer 25 is formed on the cladding layer 26, and a second electrode 28 for injecting a current $I_{tune}$ for refractive index control into the refractive index control layer 23 independently of the current $I_{act}$ for activation is formed on the back side of a compound semiconductor substrate 20.

The TTG-DFB laser of this kind generates laser light 29 by injecting the current $I_{act}$ for activation into the active layer 25. In addition, the refractive index of the refractive index control layer 23 is changed by adjusting the current amount of $I_{tune}$ and thus changing the carrier density of the refractive index control layer 23. Hence, the pitch of the diffraction grating 21 felt by laser light 29 is made changed, thereby making it possible to change the wavelength of output light.

Both of the DBR laser described in FIG. 2 and the TTG-DFB laser described in FIG. 3 change their oscillation wavelengths due to the plasma effect caused by injecting the current into the refractive index control layers 13 and 23. Therefore, it is possible to perform an operation of switching wavelengths at a nanosecond order. Moreover, it is reported that the range of tunable wavelengths per laser element is equal to or more than 10 nm in a DBR laser and equal to or more than 7 nm in a TTG-DFB laser. A wavelength tuning operation is made possible within a range of 1530 to 1560 nm (C band), which is important in the WDM communication, by integrating four to seven laser elements 2 on one substrate (see FIG. 1).

Technologies related to the present invention are disclosed in the following Patent Literature 2 to 5 apart from the above-mentioned technology.

Out of the literature, Patent Literature 2 discloses a point of integrating a wavelength-tunable three-electrode DBR laser together with a modulator, as described in its FIG. 1.

Furthermore, Patent Literature 3 discloses a point where in the three-electrode DFB laser, output fluctuations at the time of wavelength control are detected by an optical detecting element, thus maintaining the constant intensity of laser light in a manner that a light output control circuit provides a current as feedback to an electrode for light output control based on the detected signal, as described in its FIG. 6.

On the other hand, Patent Literature 4 discloses a point of dividing an active region of the DFB laser into two and controlling electrodes in the respective active regions independently of each other, thus controlling a polarized plane, as described in its FIG. 7 and paragraph 0035.

Moreover, Patent Literature 5 discloses a point of forming a plurality of electrodes in a guided wave direction and sequentially supplying currents to these electrodes, thus shifting a position of a light intensity peak in a semiconductor laser array for scanning light as described in its FIG. 21 and paragraph 41.

[Patent Literature 1]
Japanese Patent Application Publication No. 2004-235600
[Patent Literature 2]
Japanese Patent Publication No. 2891741
[Patent Literature 3]
Japanese Patent Publication No. 2966485
[Patent Literature 4]
Japanese Patent Application Publication No. Hei8-172237
[Patent Literature 5]
Japanese Patent Application Publication No. Hei8-97505
[Non-Patent Literature 1]
ECOC2003 PROCEEDING vol. 4 pp 887 (Th1.2.4)

Incidentally, in the optical semiconductor device of the array integrated type shown in FIG. 1, when laser light exceeding a wavelength range which one laser element 2 covers is outputted, it is necessary to switch an operation to another laser element 2 capable of outputting the laser light of the relevant wavelength. Time required for a switching operation of this kind includes time to injecting the currents ($I_{DBR}$, $I_{tune}$) into a laser element 2 which is intended to be hereafter operated and to reaching thermal equilibrium in the laser element 2. Since time required for thermal equilibrium is on the order of several milliseconds, the switching time required for the laser element 2 is several milliseconds after all. However, it is difficult to realize a wavelength selection at high speed, which is required for the WDM system.

FIG. 4 is a plan view of an optical semiconductor device, which is being proposed to accelerate a wavelength selection operation to high speed.

This optical semiconductor device includes a compound semiconductor substrate 30 in which a laser array region 30a, a switch region 30b, a waveguide region 30c, an optical coupling region 30d and an optical amplification region 30e are defined.

Furthermore, on the compound semiconductor substrate 30 of the laser array region 30a, active layers 33 for oscillation and refractive index control layers 34, which have a low absorption coefficient due to their shorter composition wavelengths than that of the active layer 33 for oscillation, are disposed one after the other in a laser oscillation direction. In addition, an electrode 31 for the active layer and an electrode 32 for the refractive index control layer are formed respectively on the active layer 33 for oscillation and the refractive index control layer 34, both electrodes being for injecting currents into these layers independently of each other.

Moreover, a plurality of laser elements 35 constituting each of the above-mentioned layers 33 and 34 and each of the electrodes 31 and 32 are arranged in the laser array region 30a, and the oscillation wavelength of each laser element 35 is set to be slightly changed, by changing the pitch length of diffraction grating in the laser.

On the other hand, an active layer 37 for switching, which has the same composition wavelength as the above-described active layer 33 for oscillation is formed on the compound semiconductor substrate 30 in the switch region 30b in order to facilitate the absorption of laser light. Additionally, switching electrodes 36 for injecting a current into the active layer 37 is provided on this active layer 37 for switching, thus forming gate elements 38 by use of the switching electrodes 36 and the active layer 37.

The gate element 38 is turned on by injecting a current into the active layer 37 for switching from the switching electrode 36. Then, the laser light generated by the laser element 35 is passed to optical waveguide 39, which is a subsequent stage. On the other hand, when the injection of the current is halted, the laser light is absorbed in the active layer 37 for switching, thus turning off the gate element 38.

The laser light, which has passed through the gate element 38 in an "on" state, passes the waveguide 39 formed in the waveguide region 30c, thus being inputted to an optical coupler 40 formed in an optical coupling region 30d.

Subsequently, the laser light passes the waveguide 39 connected to the back of the optical coupler 40, thus being inputted into an optical amplifier 43 formed in the optical amplification region 30e.

The optical amplification 43 includes: an active layer 41 for amplification with the same composition wavelength as that of the active layer 33 for oscillation in the laser array region 30a; and an amplifier electrode 42 for amplifying laser light in a manner of injecting a current into the active layer 41 for amplification. When laser light is inputted to the optical amplifier 43 in a state where a current is injected to the active layer 41 for amplification, the laser light is amplified in the active layer 41. Thus, eventually, laser light 49 whose intensity is enhanced is outputted from the optical amplifier 43 to the outside.

An optical semiconductor device of this kind is set to previously oscillate laser in the second laser element 35 before an output is switched from the first laser element 35 to the second laser element 35. Then, the gate element 38, which is a subsequent stage of the second laser element 35, is turned off, thereby preventing laser from leaking. When the output is switched from the first to second laser elements 35, the above-mentioned gate element 38 is turned on, thus setting the laser light outputted from the second laser element 35 to be guided to the waveguide 39.

For this reason, since laser has already been oscillated by the second laser element 35 before switching the output, time required for switching is only the time of switching on and off the gate element 38. This time does not include time to reaching thermal equilibrium, thus speeding up the operation of switching in comparison with the example of FIG. 1.

Incidentally, if the laser light which is previously oscillated by the laser element 35 leaks to the subsequent stage before the laser is switched, it causes noise in this optical semiconductor device. Therefore, it is necessary to make each length $L_0$ of the active layer 37 for switching and the switching electrode 36 long enough, both of which constituting the gate element 38, in order to sufficiently absorb the laser light oscillated by the laser element 35.

However, the above cannot satisfy the requirement for the miniaturization of an optical semiconductor device, the miniaturization having been demanded in recent years, since an optical semiconductor device is enlarged by the length $L_0$.

Moreover, this optical semiconductor device requires an extra process for forming the gate electrodes 38, thus making the entire manufacturing process longer. As a consequence, the manufacturing cost of an optical semiconductor device finally fabricated increases.

Similarly, it is not possible to satisfy the requirement for the miniaturization of an optical semiconductor device disclosed in the Patent Literature 2, since the device is enlarged by the length of a modulator.

SUMMARY OF THE INVENTION

According to an aspect of the present invention, there is provided an optical semiconductor device comprising: a semiconductor substrate; a structure formed on one surface of the semiconductor substrate and including at least a diffraction grating, an active layer generating light by a current injection, and a refractive index control layer whose refractive index is allowed to be changed by a current injection; and a laser element including an electrode for the active layer, an electrode for the refractive index control layer, and an electrode for switching, the electrodes being formed independently of each other and formed any one of above the structure and on an other surface of the semiconductor substrate, wherein, in a state of supplying no switching current from the electrode for switching to a part of the active layer, a pre-bias current for the active layer is supplied from the electrode for the active layer to the active layer, and a pre-bias current for the refractive index control layer is supplied from the electrode for the refractive index control layer to the refractive index control layer in advance, and then while a current for activation is supplied from the electrode for the active layer to the active layer, the switching current is supplied from the electrode for switching to a part of the active layer, thus turning on the laser element, and the switching current is halted to be supplied, thus turning off the laser element.

According to the present invention, before the laser element is turned on, the pre-bias currents for the active layer and for the refractive index control layer are previously supplied to the active layer and the refractive index control layer, respectively. Therefore, when the laser element is turned on, the carrier densities and the like in these active layer and refractive index control layer have already become a state of thermal equilibrium. Hence, the laser light oscillated by the laser element in an on state is controlled over its instability of a wavelength caused by the thermal fluctuations of the carrier density. Accordingly, it is made possible to provide a high-quality optical semiconductor device whose laser wavelength is stable.

At least two laser elements of this kind may be provided for the above-mentioned optical semiconductor device. In that case, when one laser element is turned on, the other laser element is supplied with the above-mentioned pre-bias current. Then, when the former laser element is turned off, the latter laser element is supplied with a switching current to be turned on, thus twitching a laser output from the former laser element to the latter laser element.

According to this kind of the operation of switching the laser output, since the carrier density and the like in the active layer of the latter laser element is put in thermal equilibrium due to the pre-bias current in advance, it is possible to immediately turn on the latter laser element without waiting until the relevant active layer is thermally stabilized. For this reason, time required for switching from one laser element to the other laser element can be sped up by time required until the carrier density reaches thermal equilibrium. Additionally, high quality laser light whose wavelength shift associated with thermal instability is reduced can be outputted from the laser element.

Furthermore, the current density of the above-mentioned pre-bias current for the active layer may be set greater than the current density of the current for activation in a state where the laser element is in the on state.

In this manner, the active layer into which the pre-bias current for the active layer is injected is previously heated to a temperature higher than that at the time of laser oscillation. Consequently, a temperature in the active layer in a portion to which the switching current is not supplied in an "off" state is previously increased due to thermal diffusion from the active layer in a portion into which the pre-bias current for the active layer is injected. Thus, even if the laser element is turned on, since carriers in the active layer in a portion into which the pre-bias current for the active layer has not been injected in the "off" state reach the thermal equilibrium in a short time, it is possible to prevent the wavelength fluctuations of the laser oscillation in the active layer. As a result, it is possible to obtain higher-quality laser light than the above.

In addition, the above-mentioned electrode for switching may be formed at an output end of the laser element.

In this manner, spontaneously emitted light generated in the active laser before the output end is absorbed in the active layer under the electrode for switching provided at the output end. Thus, it is possible to effectively prevent the spontaneously emitted light from leaking to the subsequent stage of the laser element.

Furthermore, according to another aspect of the present invention, there is provided a method of driving an optical semiconductor device, where the optical semiconductor device comprising: a semiconductor substrate; a structure formed on one surface of the semiconductor substrate and including at least a diffraction grating, an active layer generating light by a current injection, and a refractive index control layer whose refractive index is allowed to be changed by a current injection; and a laser element including an electrode for the active layer, an electrode for the refractive index control layer, and an electrode for switching, the electrodes being formed independently of each other and formed any one of above the structure and on an other surface of the semiconductor substrate, and the method comprising the steps of: in a state of supplying no switching current from the electrode for switching to the active layer, supplying a pre-bias current for the active layer from the electrode for the active layer to the active layer, as well as supplying a pre-bias current for the refractive index control layer from the electrode for the refractive index control layer to the refractive index control layer in advance, turning on the laser element by supplying switching current from the electrode for switching to a part of the active layer while supplying a current for activation from the electrode for the active layer to the active layer, and turning off the laser element by halting the supply of the switching current.

BRIEF DESCRIPTION OF THE DRAWINGS

FIG. 18 is a cross-sectional view for explaining the behavior of the laser element included in the optical semiconductor device according to the fifth embodiment of the present invention.

DESCRIPTION OF THE PREFERRED EMBODIMENTS

(1) First Embodiment

A description will be given of an optical semiconductor device according to a first embodiment of the present invention, following manufacturing processes thereof.

Figure 5A:
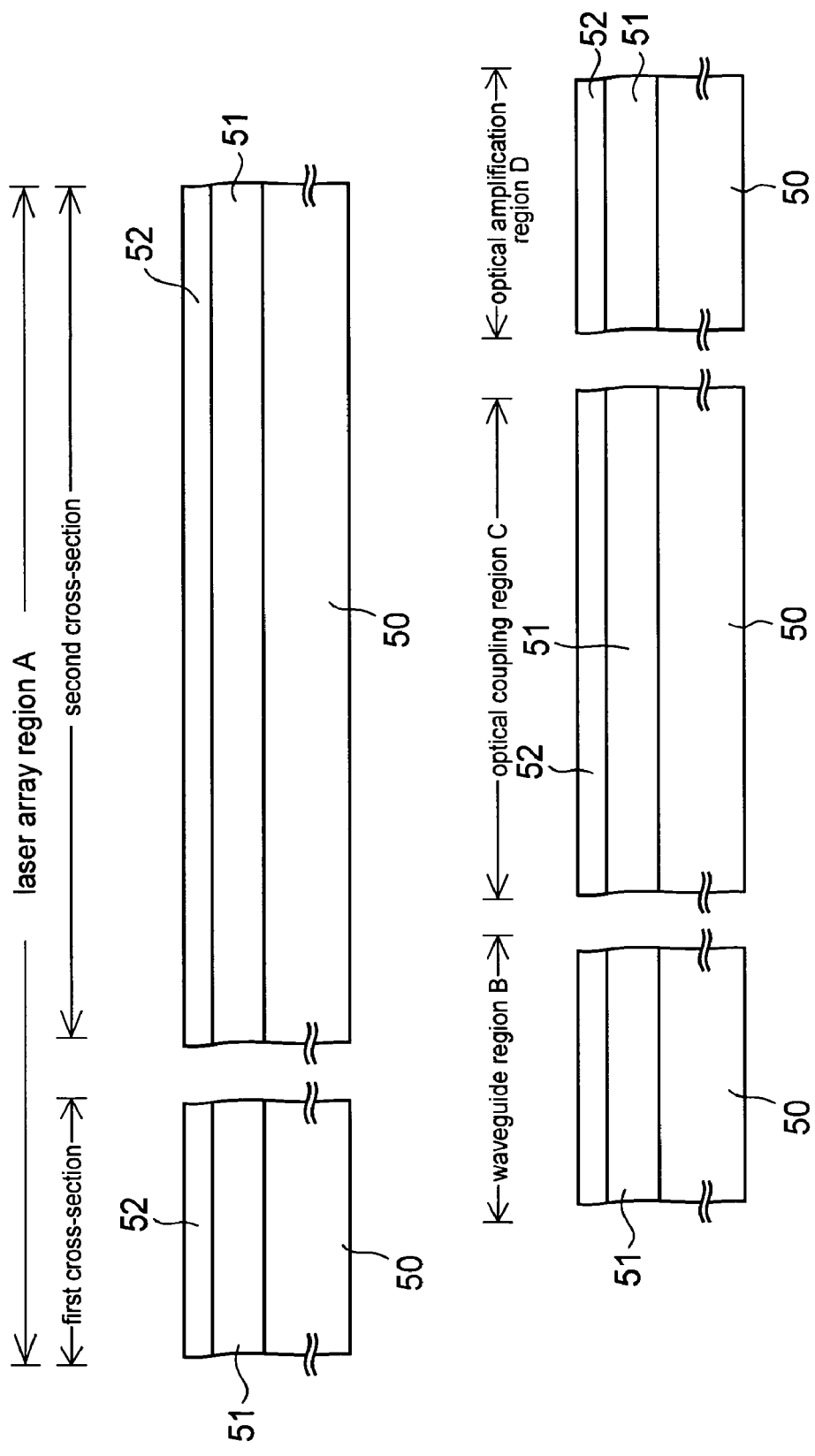
FIGS. 5A to 5P are cross-sectional views of an optical semiconductor device in course of manufacture according to a first embodiment of the present invention.
Figure 5B:
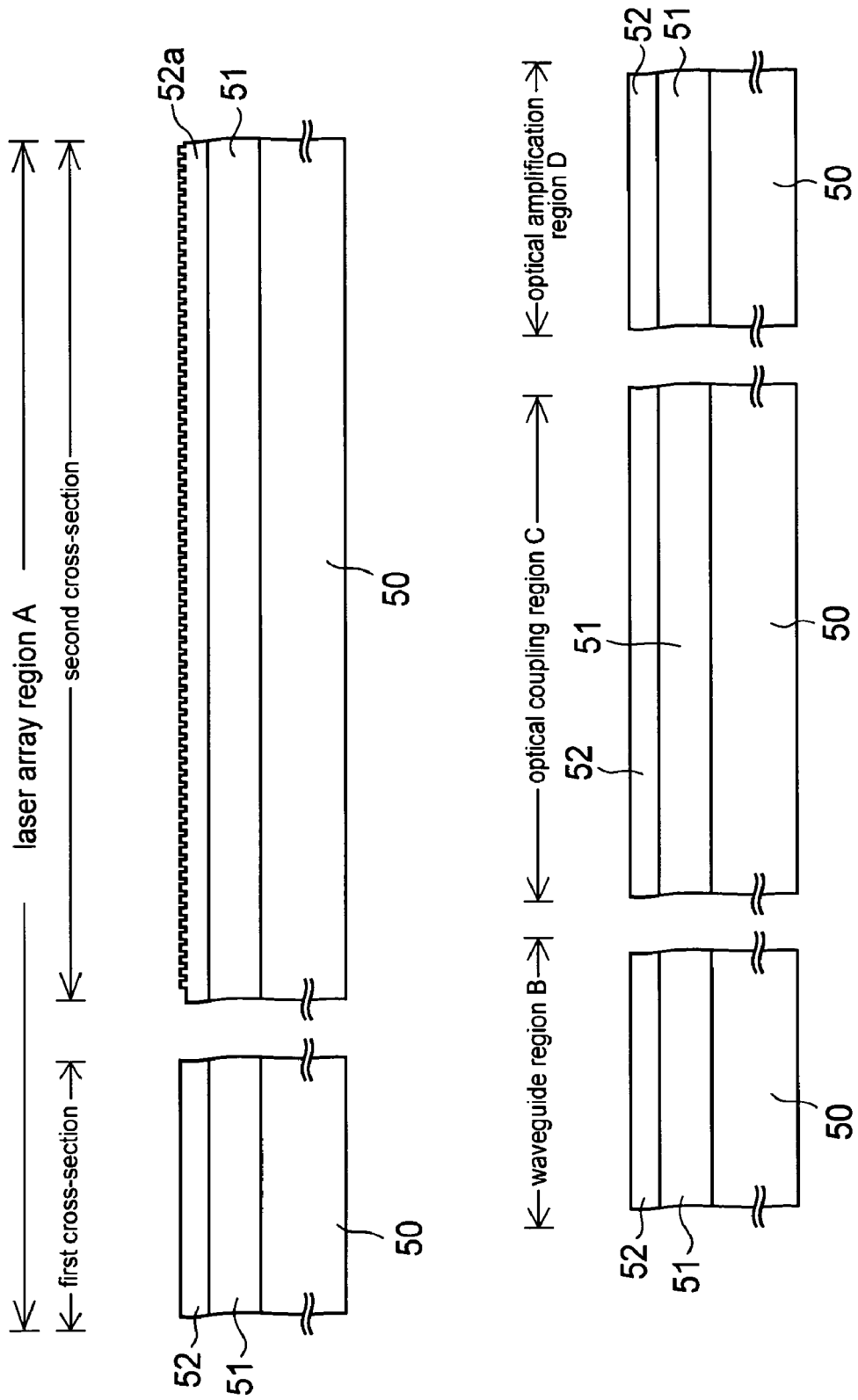
Figure 5C:
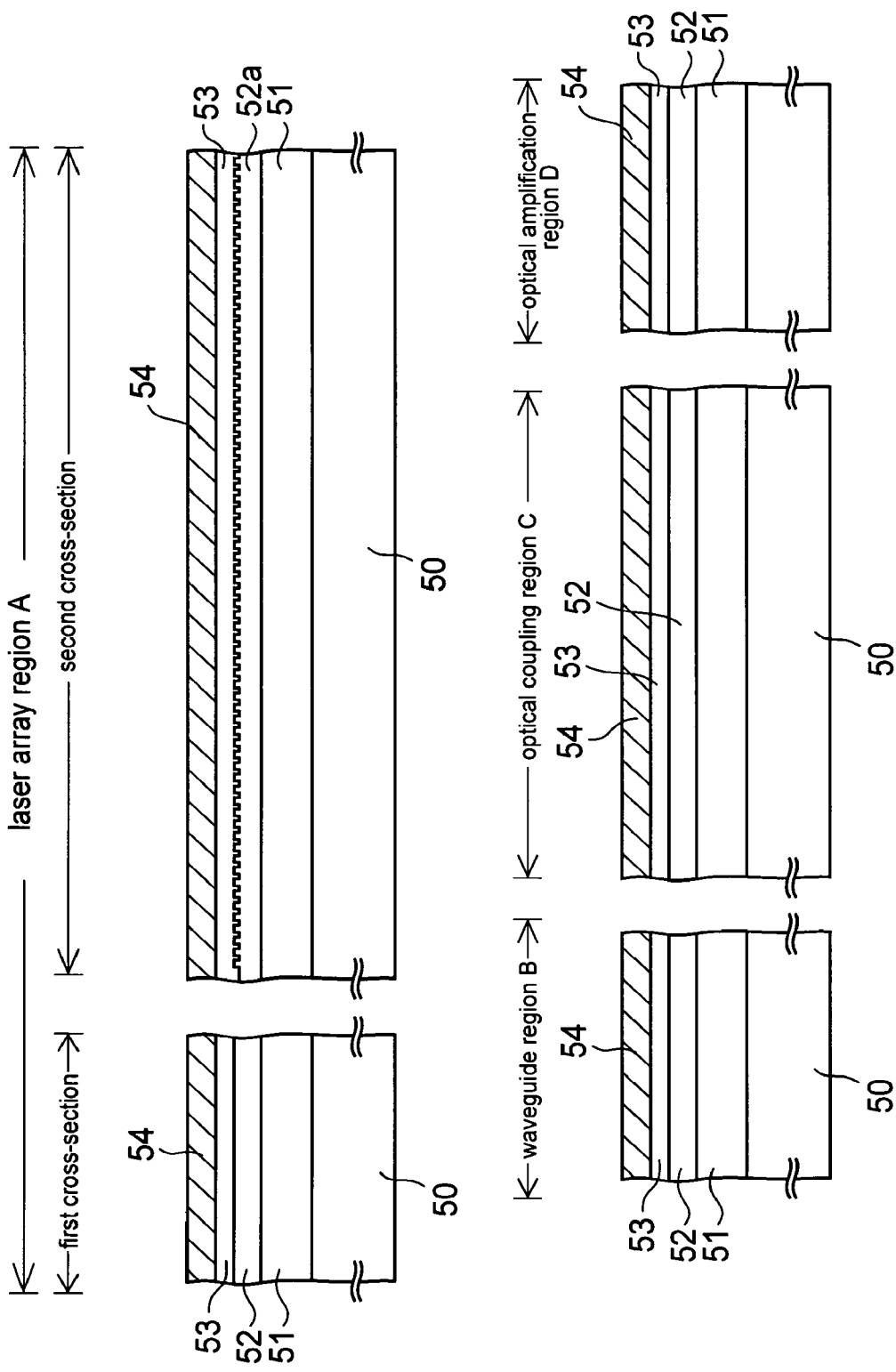
Figure 5D:
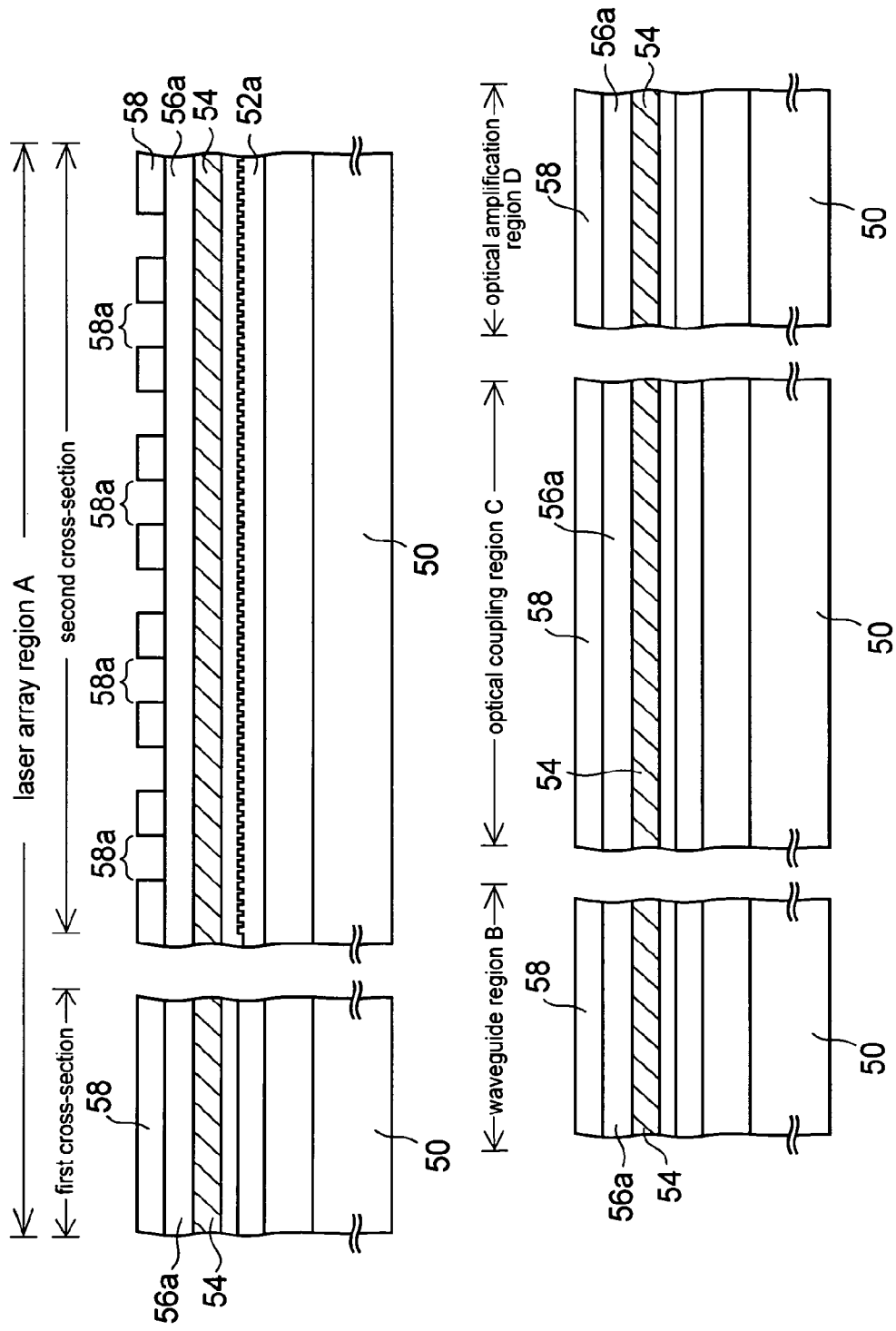
Figure 5E:
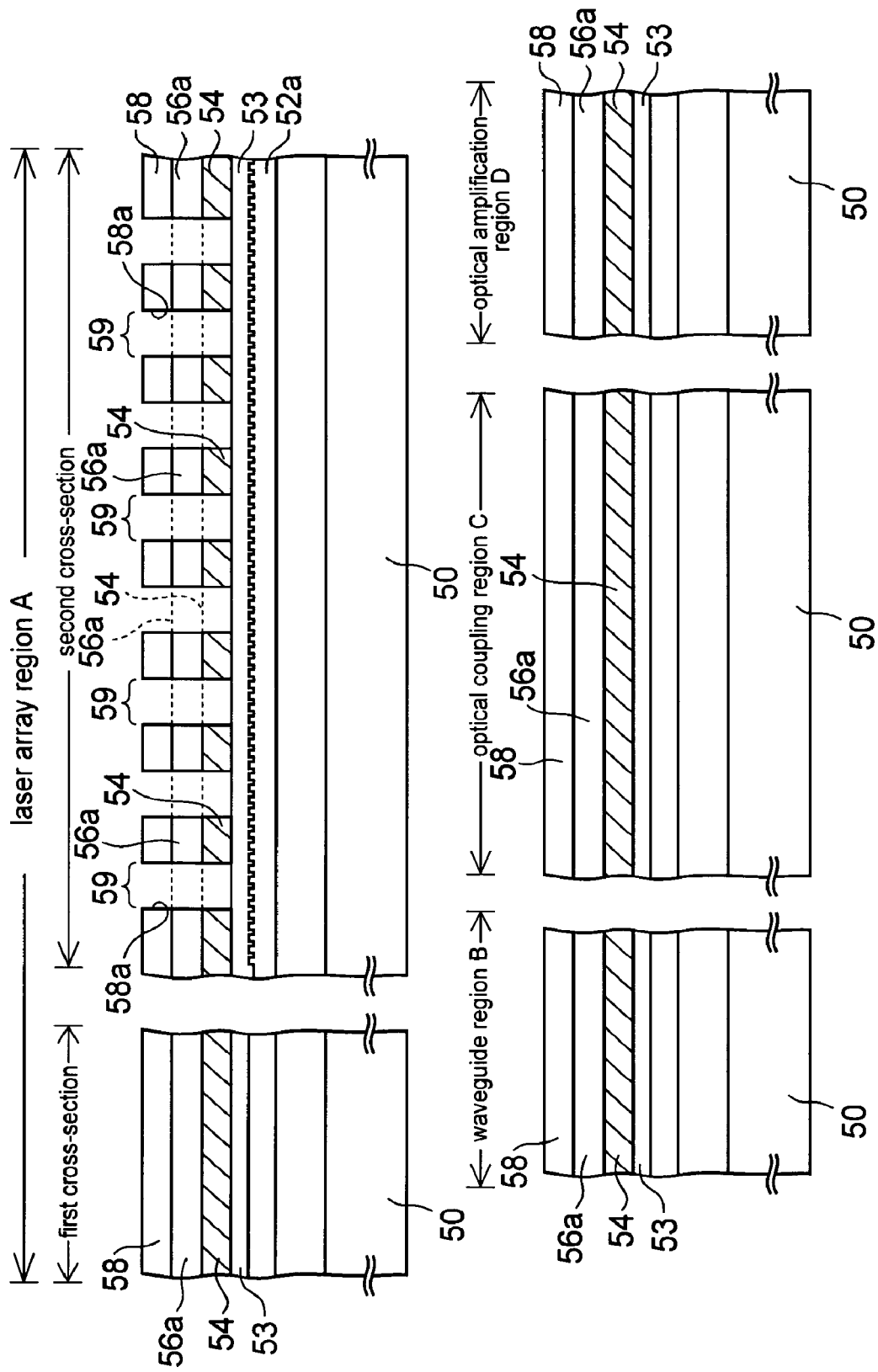
Figure 5F:
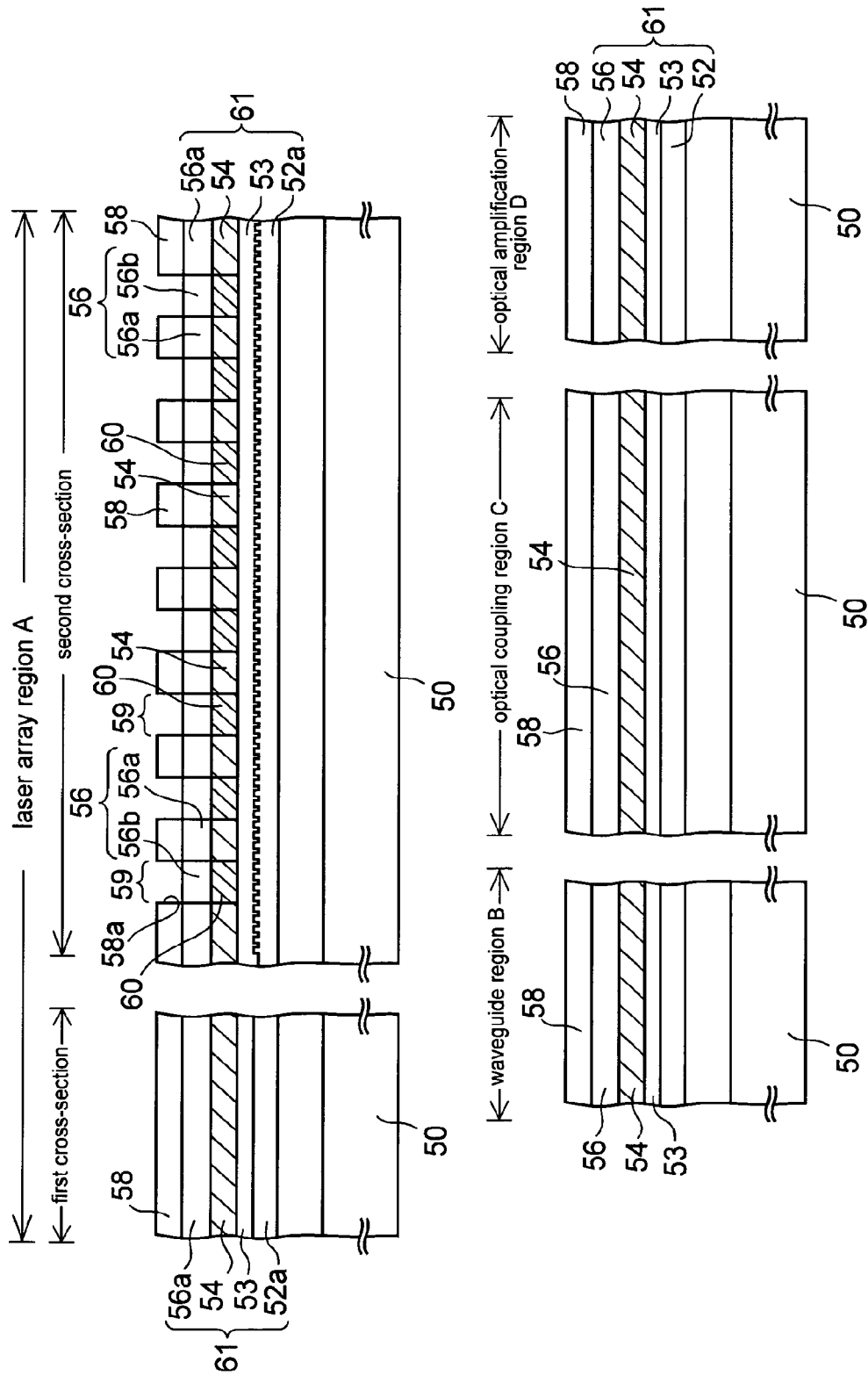
Figure 5G:
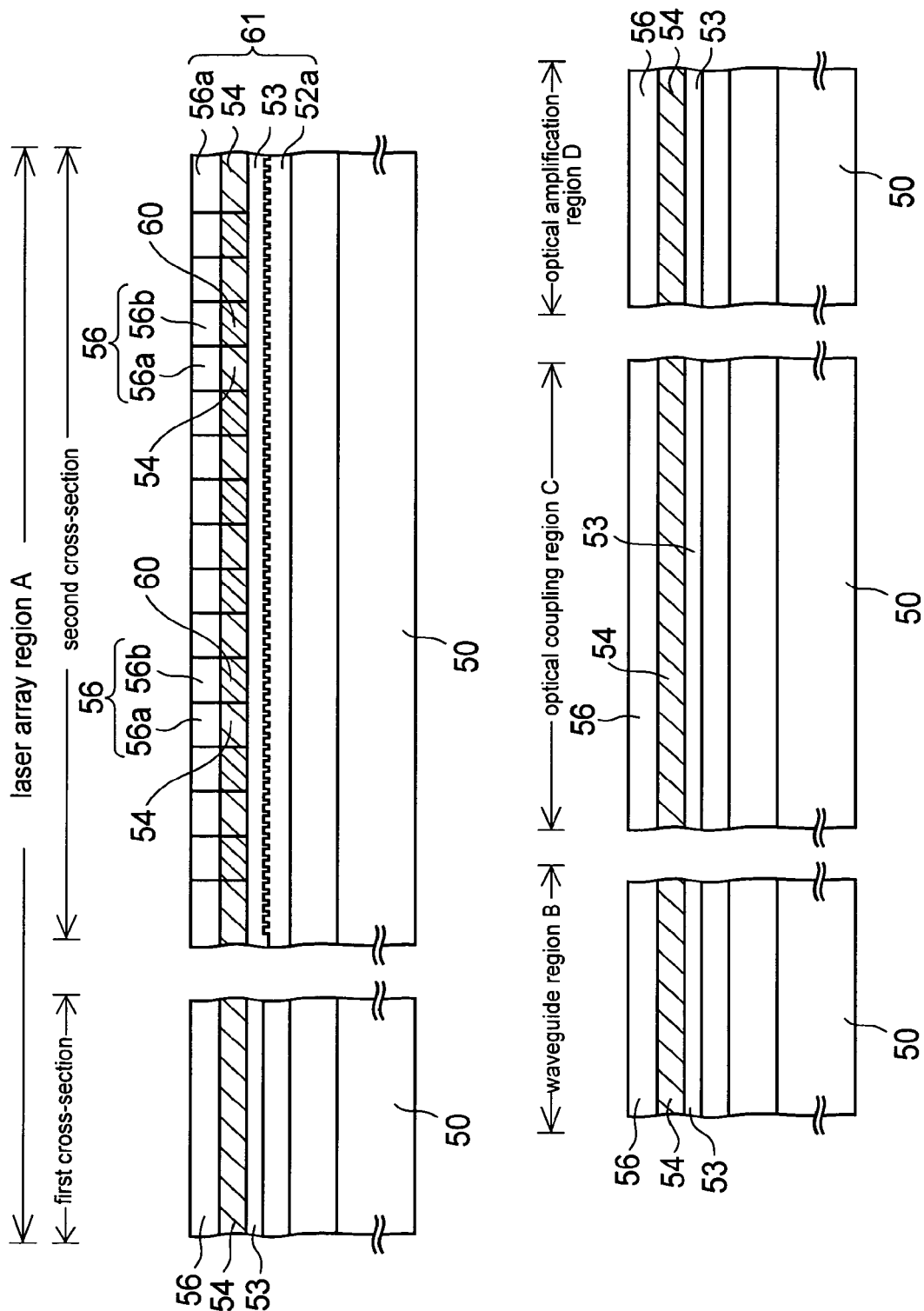
Figure 5H:
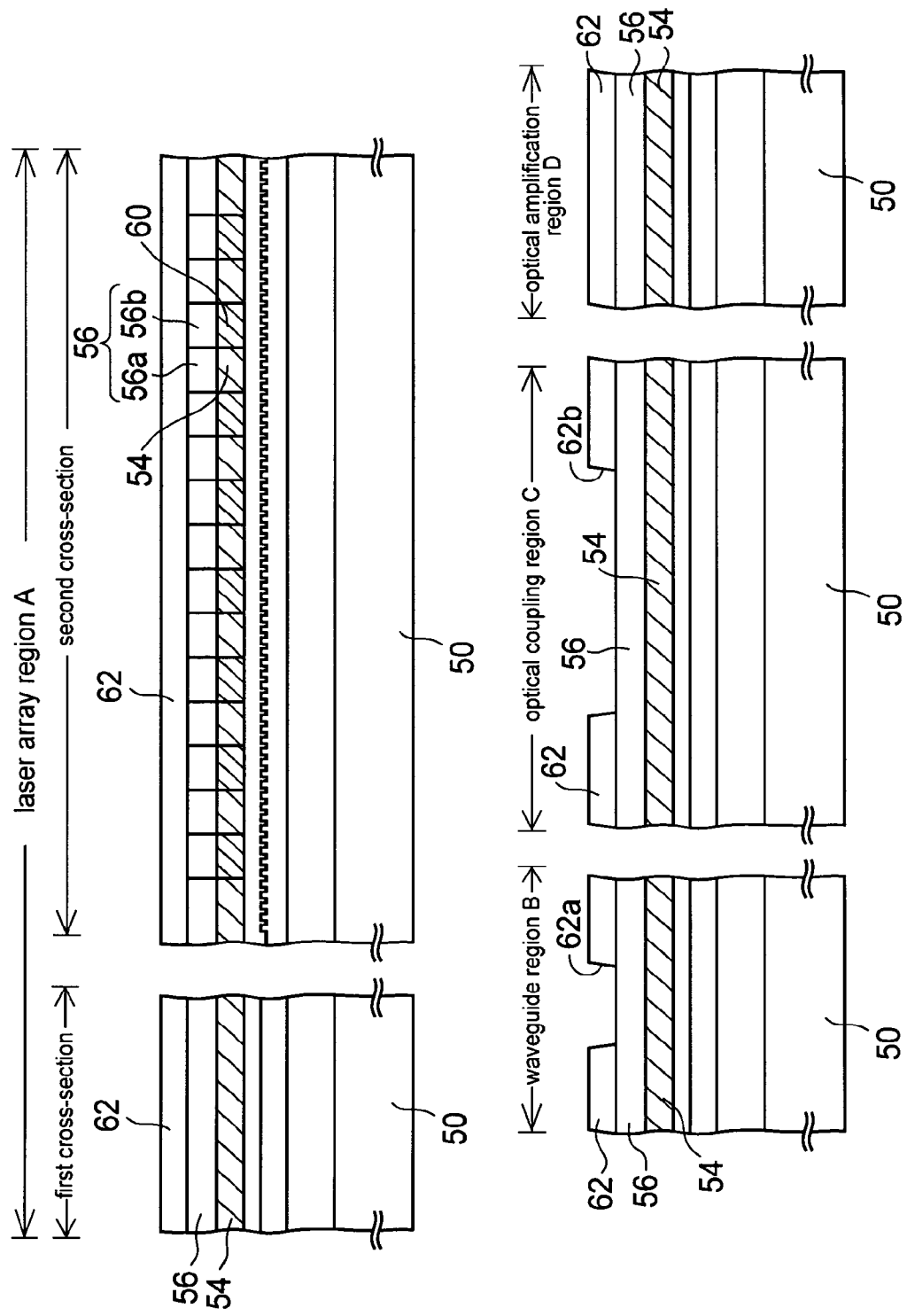
Figure 5I:
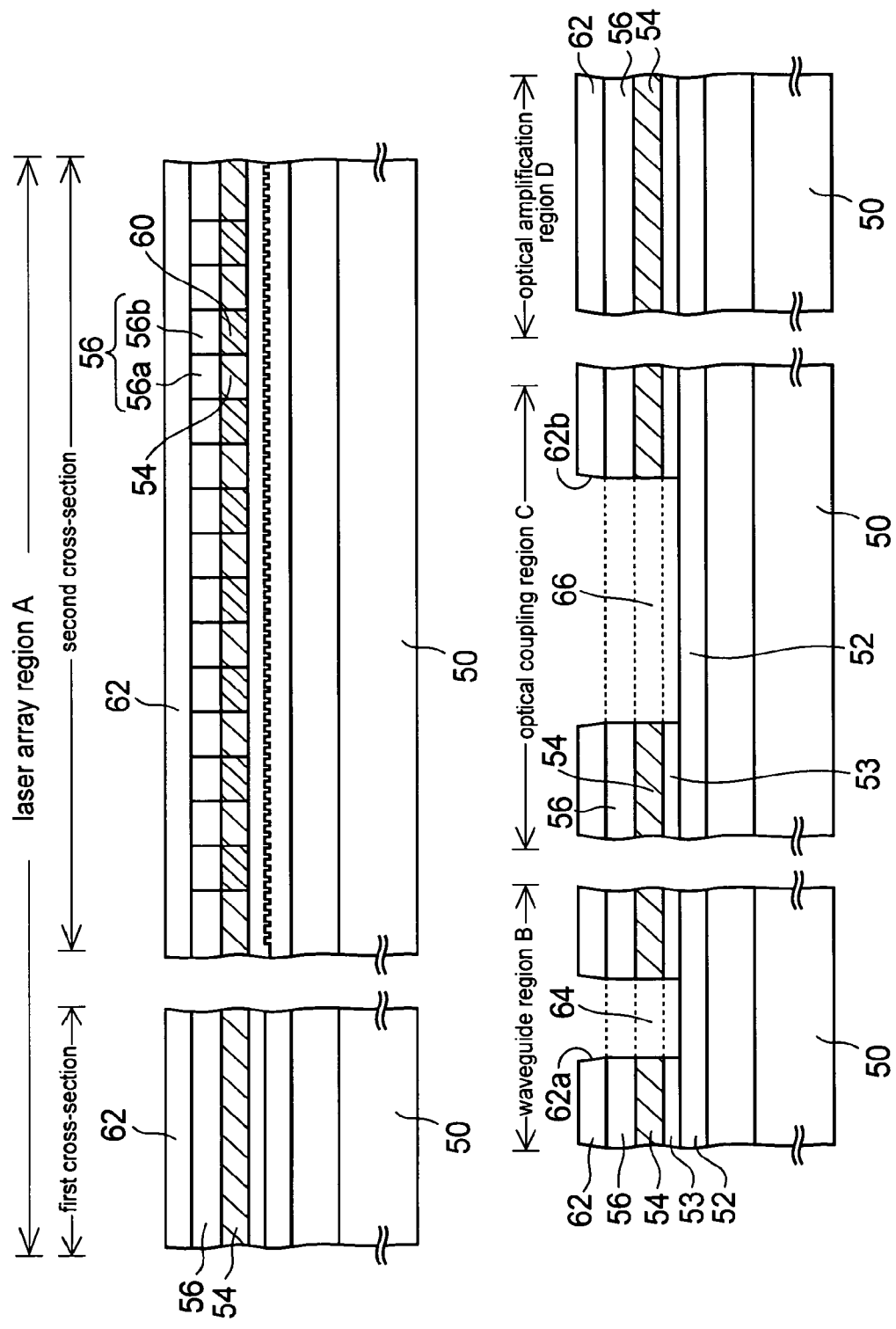
Figure 5J:
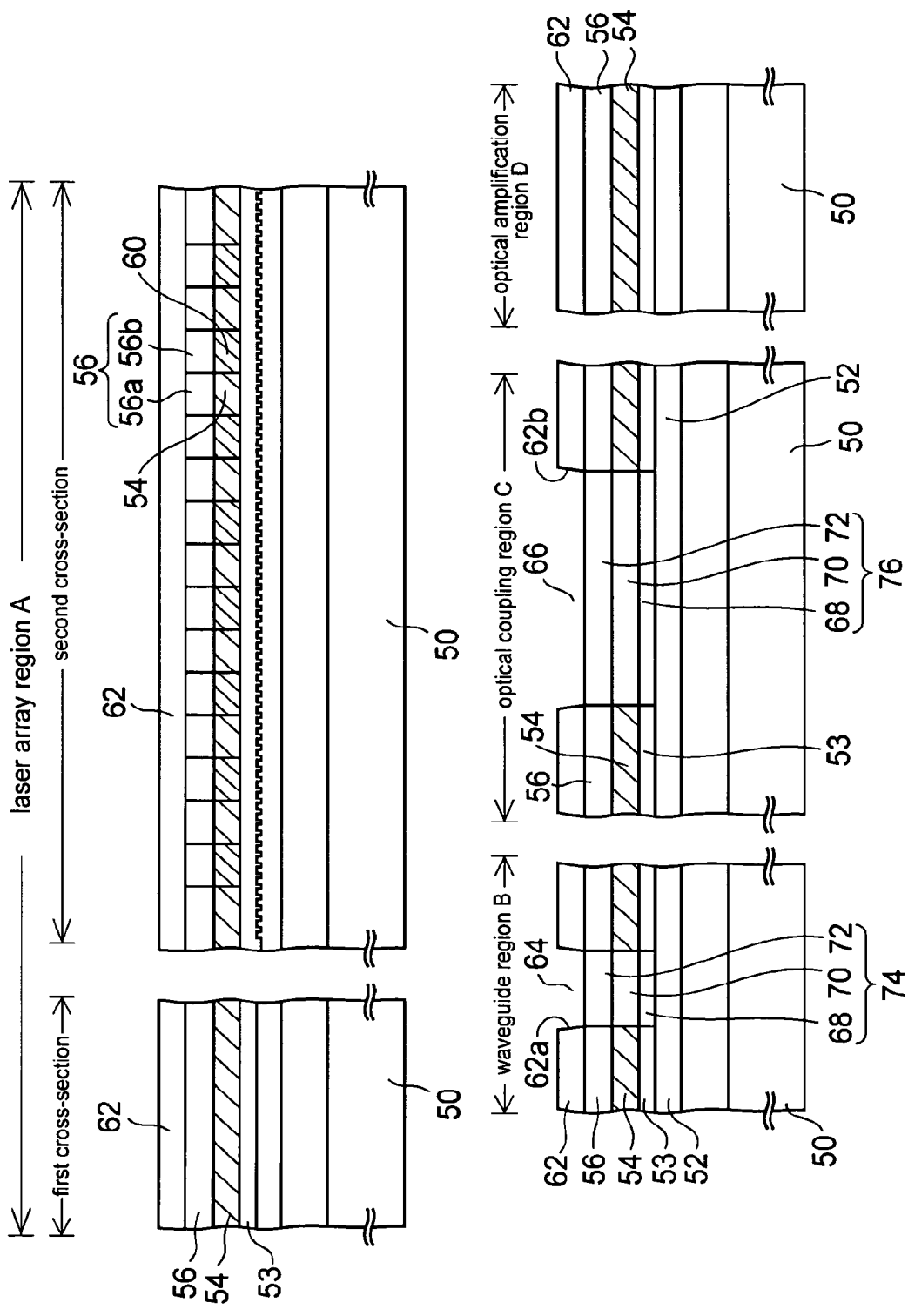
Figure 5L:
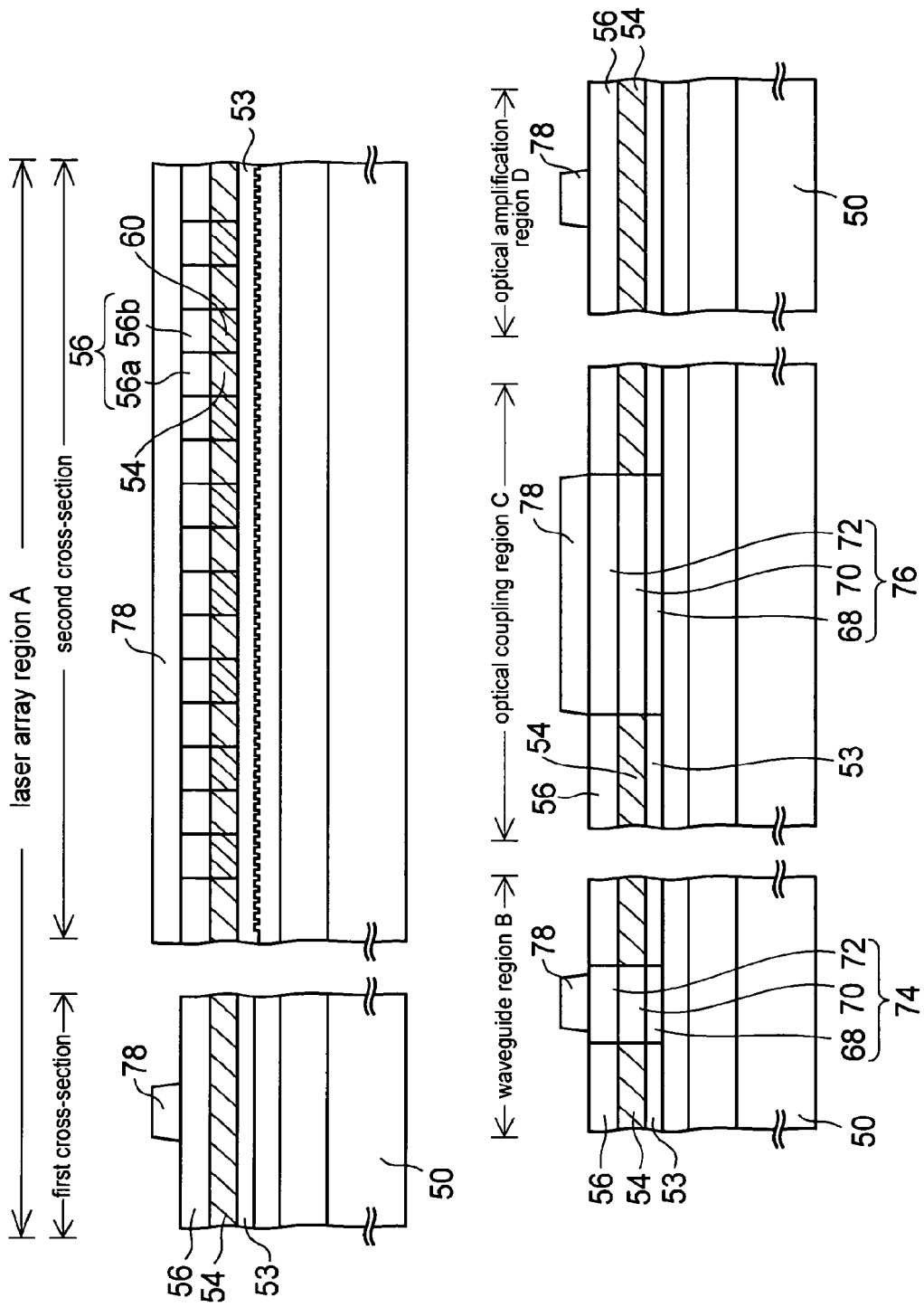
Figure 5M:
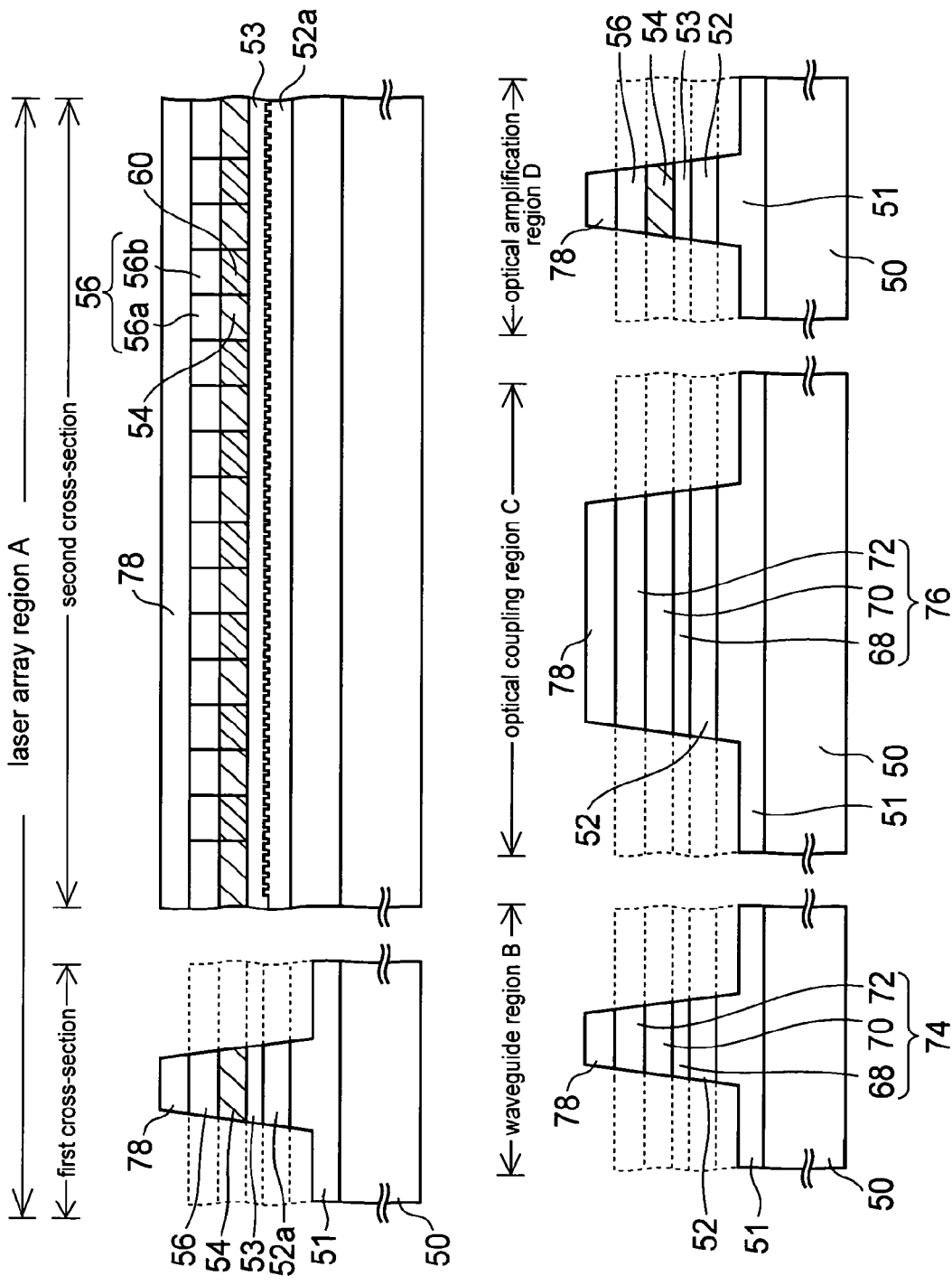
Figure 5N:
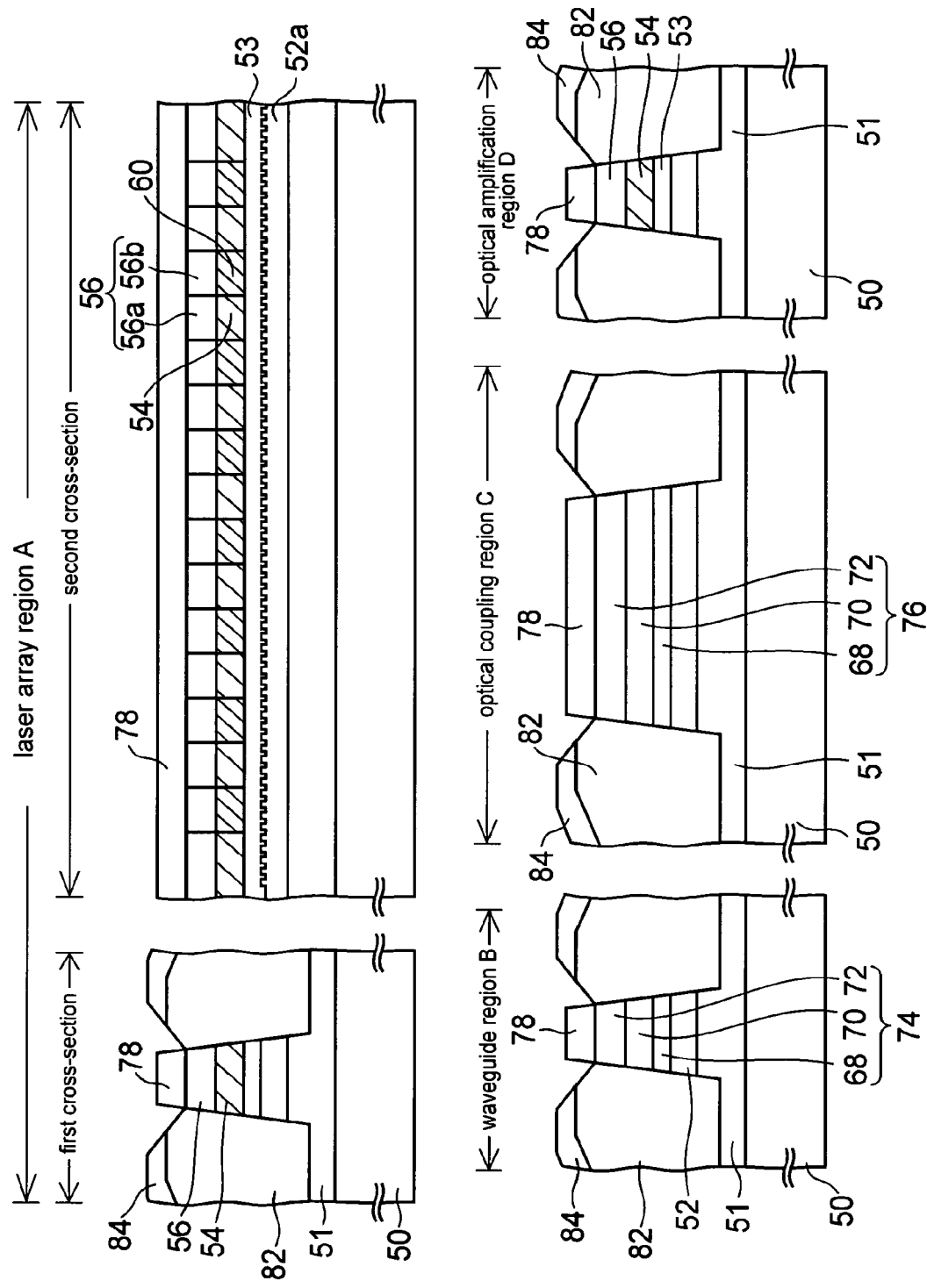
Figure 50:
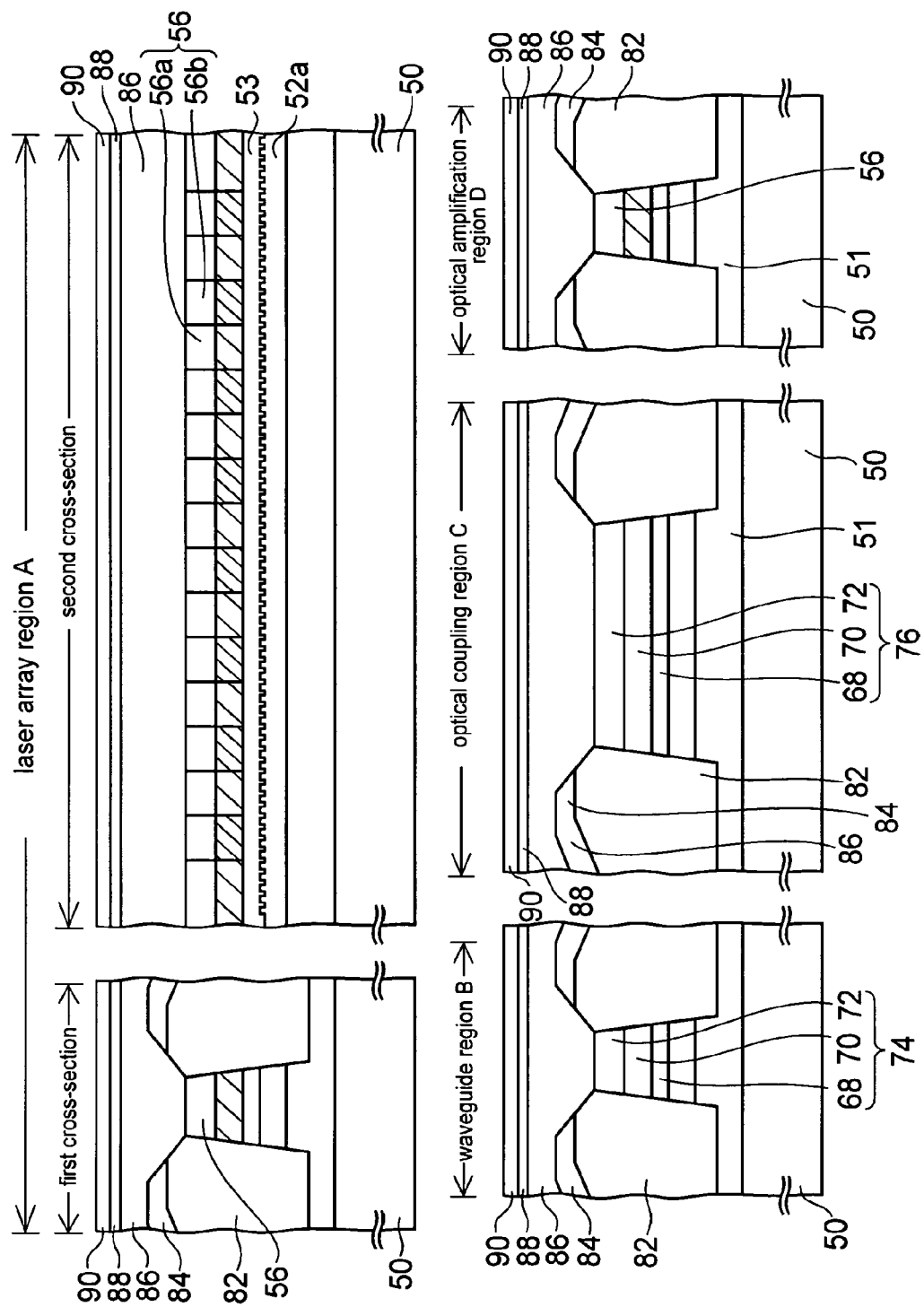
Figure 5P:
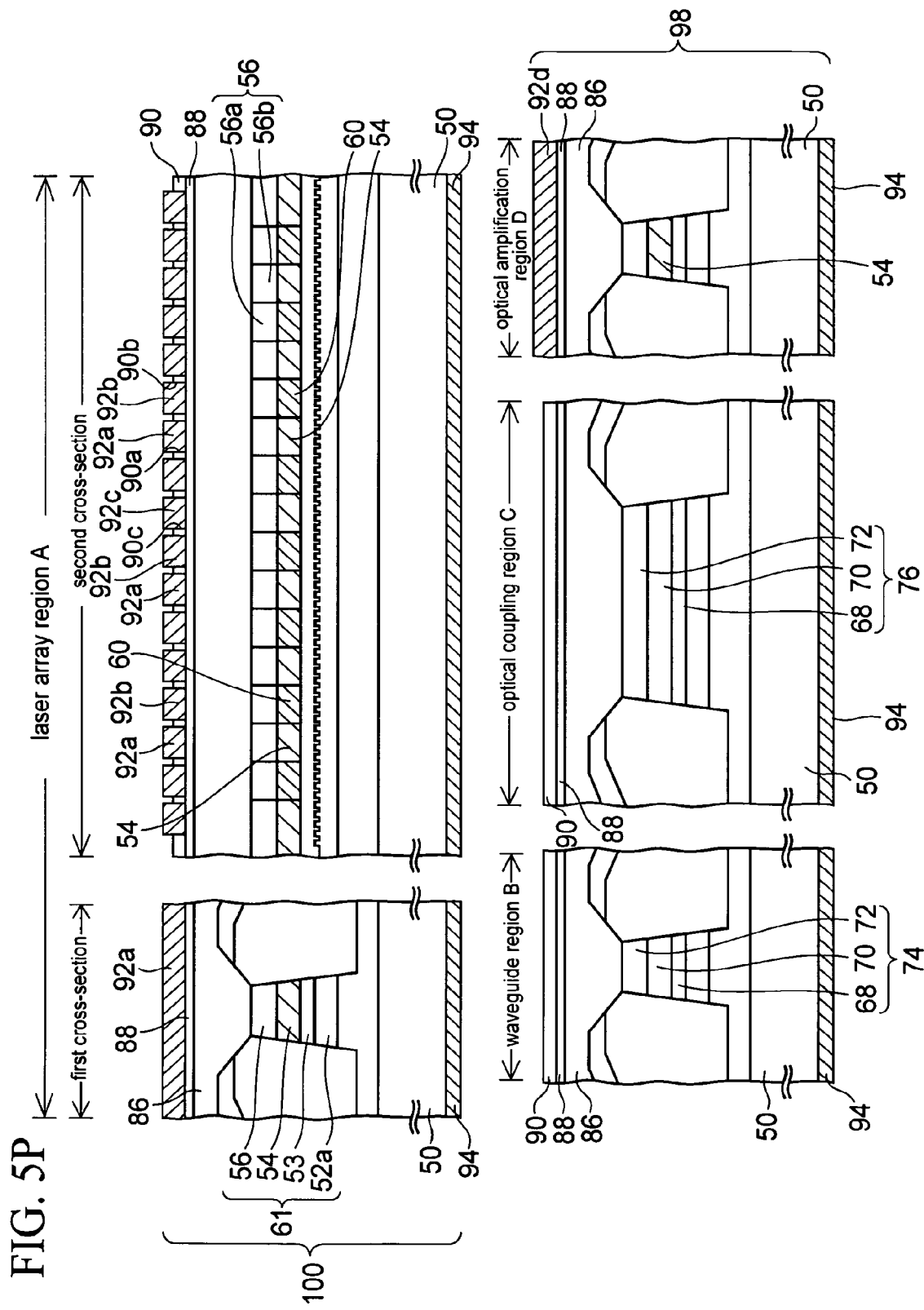

FIGS. 5A to 5P are cross-sectional views of the optical semiconductor device in course of manufacture according to this embodiment, and FIGS. 6A to 6D are plan views thereof.

Firstly, a description will be given of a process to obtaining a cross-sectional structure shown in FIG. 5A.

To begin with, an n-type InP layer is formed by metal organic CVD (MOCVD) to a thickness of approximately 1 µm as a buffer layer 51 on an n-type InP substrate (a semiconductor substrate) 50 having a laser array region A, a waveguide region B, an optical coupling region C and an optical amplification region D. Although n-type impurities to be doped in the buffer layer 51 are not particularly limited, sulfur (S) is adopted as the n-type impurities in this embodiment. Next, an n-type InGaAsP layer, which is doped with S as the n-type impurities, is formed by MOCVD to a thickness of approximately 0.07 µm on the buffer layer 51, thus setting the n-type InGaAsP layer to be a semiconductor layer 52. Using MOCVD, the composition ratio of In, Ga, As and P is respectively set in a manner that the composition wavelength of n-type InGaAsP to be the semiconductor 52 is set to be approximately 1.2 µm by adjusting the flowing amount of source gases.

Figure 6A:
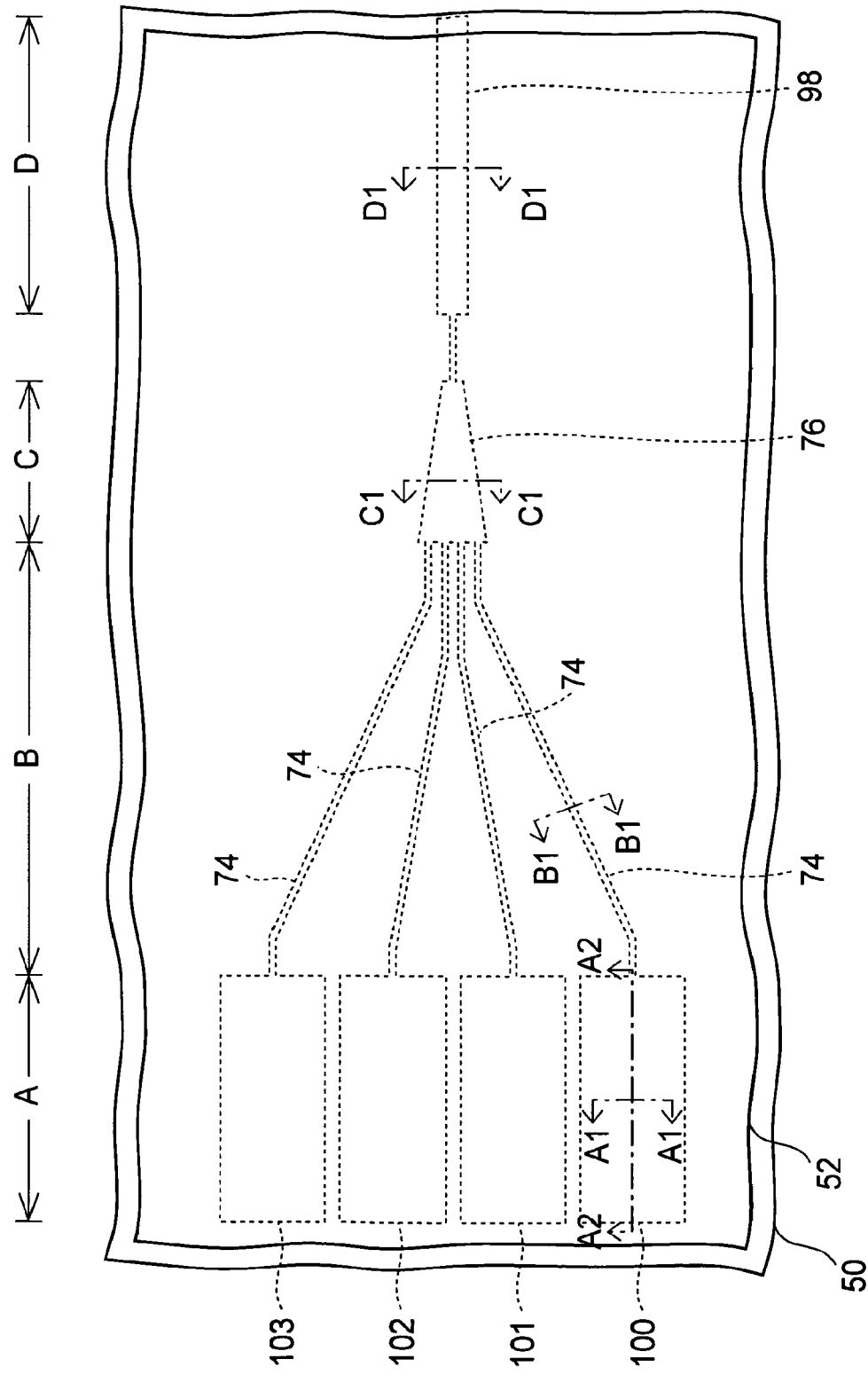
FIGS. 6A to 6D are plan views of the optical semiconductor device in course of manufacture according to the first embodiment of the present invention.

FIG. 6A is a plan view of after this process is completed.

As shown in FIG. 6A, four wavelength-tunable laser elements 100 to 103 are eventually formed in the laser array region A on the InP substrate 50, together with an optical waveguide 74, an optical coupler 76 and an optical amplifier 98 respectively in the regions B to D, which are the subsequent stages of the laser array region A.

Furthermore, in the above-mentioned FIG. 5A, a first cross-section of the laser array region A corresponds to a cross-section taken along the A1-A1 line in FIG. 6A, and a second cross-section corresponds to a cross-section taken along the A2-A2 line in FIG. 6A. Moreover, cross-sections of the waveguide region B, the optical coupling region C and the optical amplification region D in FIG. 5A correspond to cross-sectional views taken along the B1-B1 line, the C1-C1 line and the D1-D1 line in FIG. 6A, respectively.

Next, as shown in FIG. 5B, an unillustrated resist pattern, which is obtained, for example, by electron beam (EB) exposure, is formed all over the surface. Using it as a mask, the semiconductor layer 52 is etched down to a mid-depth thereof by reactive ion etching (RIE). Projections and depressions, which are repeated in a direction of the laser oscillation in a predetermined pitch length of approximately 240 nm, are thereby formed on a surface of the semiconductor layer 52 in the laser array region A. Thus, the semiconductor layer 52 in the laser array region A becomes a diffraction grating 52a.

On the other hand, the semiconductor layer 52 in the waveguide region B, the optical coupling region C and the optical amplification region D, except the laser array region A, is not etched since these three regions are covered with the above-mentioned resist pattern. Afterwards, the resist patterns are removed.

Next, a description will be given of a process to obtaining a cross-sectional structure shown in FIG. 5C.

Firstly, an n-type InP layer is formed by MOCVD as a spacer layer 53 on the semiconductor layer 52. Subsequently, the projections and depressions on the surface of the diffraction grating 52a are completely buried in the spacer layer 53. Although the thickness of the spacer layer 53 is not particularly limited, the thickness is set to be approximately 0.1 µm on the flat surface of the semiconductor layer 52 in the embodiment. In addition, S is adopted as n-type impurities which are doped in the n-type InP layer to be the spacer layer 53, for example.

Thereafter, using MOCVD, an active layer 54 with a separate confinement heterostructure (SCH)-multi quantum well (MQW) structure is formed on the spacer layer 53 by stacking a lower SCH layer, a quaternary distortion MQW layer and an upper SCH layer in this order. The lower and upper SCH layers to constitute the active layer 54 are formed of, for example, an InGaAsP layer with a composition wavelength of approximately 1.15 µm and with a thickness of approximately 20 nm. Moreover, the quaternary distortion MQW layer is formed by stacking well layers and barrier layers one after the other till building only ten layers, the well layers being an InGaAsP layer with a composition wavelength of approximately 1.58 µm and with a thickness of approximately 5 nm and the barrier layers being an InGaAsP layer with a composition wavelength of approximately 1.3 μm and with a thickness of approximately 10 nm.

Then, as shown in FIG. 5D, a p-type InP layer, which is doped with zinc (Zn) as p-type impurities, is formed by MOCVD to a thickness of approximately 0.2 μm on the active layer 54. The p-type InP layer is set to be a first cladding layer 56a.

Subsequently, a SiO$_2$ layer is formed by sputtering or the like to a thickness of approximately 300 nm on the first cladding layer 56a. The SiO$_2$ layer is set to be a first mask layer 58 after patterned using EB lithography or the like. A plurality of first windows 58a is formed in the first mask layer 58 in the laser array region A at intervals in the direction of the laser oscillation by the above-mentioned EB lithography.

Next, as shown in FIG. 5E, the first cladding layer 56a and the active layer 54 under the first windows 58a are sequentially etched through the windows using the first mask layer 58 as an etching mask. First apertures 59 are formed in portions where a refractive index control layer is to be formed later.

Next, as shown in FIG. 5F, an n-type InP layer with a thickness of approximately 0.1 μm is formed by MOCVD in the first apertures 59 as an unillustrated buffer layer. Thereafter, a refractive index control layer 60 is formed by MOCVD on the n-type InP layer. The refractive index control layer 60 is an InGaAsP layer with a composition wavelength of approximately 1.3 μm and with a thickness of approximately 200 nm, for example.

Having formed the refractive index control layer 60 in this manner, the active layers 54 and the refractive index control layers 60 are arranged one after the other in the direction of the laser oscillation above the semiconductor substrate 50 in the laser array region A. Although the pitch of the arrangement is not particularly limited, these active layers 54 and refractive index control layers 60 are periodically arranged at a pitch of approximately 30 μm in the embodiment.

Afterwards, a p-type InP layer is formed by MOCVD to a thickness of approximately 0.2 μm as a second cladding layer 56b on the refractive index control layer 60. The first apertures 59 are completely buried with the second cladding layer 56b. The second cladding layer 56b, together with the first cladding layer 56a, constitutes a cladding layer 56. Furthermore, this cladding layer 56 constitutes a structure 61, together with the active layer 54, the refractive index control layer 60, the spacer layer 53 and the diffraction grating 52a, which are below the cladding layer 56.

Note that a film does not grow on the first mask layer 58 made of SiO$_2$, and thus each of the above-mentioned layers 56b and 60 grow only in the first apertures 59 in the MOCVD process for forming the above-mentioned refractive index control layer 60 and the second cladding layer 56b.

Next, as shown in FIG. 5G, the first mask layer 58 made of SiO$_2$ is removed by etching with buffer hydrofluoric acid solution.

Then, as shown in FIG. 5H, a SiO$_2$ layer is formed by sputtering all over the surface again. The SiO$_2$ layer is patterned using EB photolithography or optical photolithography to be set as a second mask layer 62.

In the second mask layer 62, as a result of the above-mentioned lithography, a second window 62a is formed on a portion, which is to be a waveguide later, in the waveguide region B, and a third window 62b is formed in the optical coupling region C.

Figure 6B:
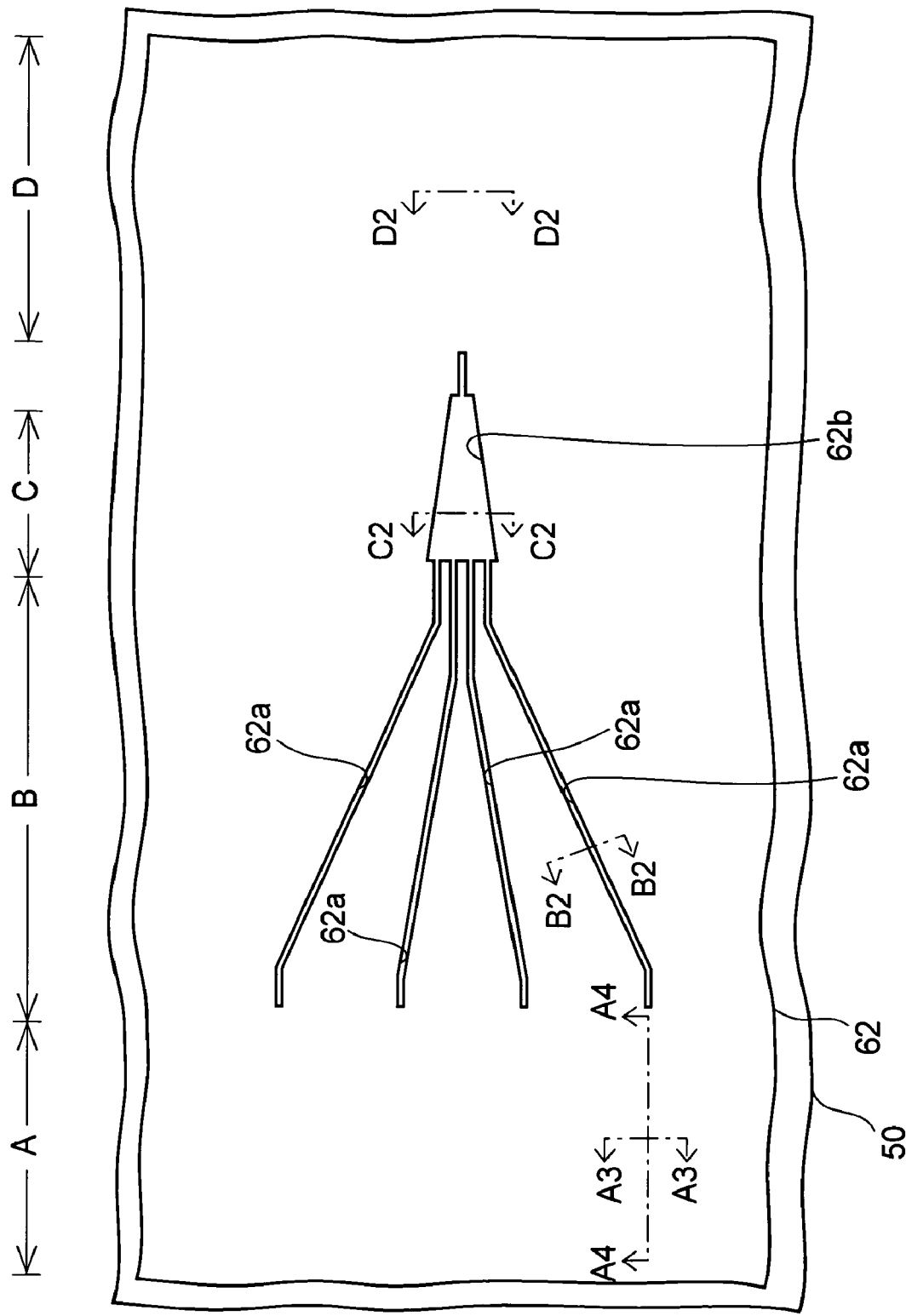

FIG. 6B is a plan view of after this process is completed. A first cross-section in the laser array region A of the above-mentioned FIG. 5H corresponds to a cross-sectional view taken along the A3-A3 line in FIG. 6B, and a second cross-section corresponds to a cross-sectional view taken along the A4-A4 line of FIG. 6B. Additionally, the cross-sectional views of the regions B to D in FIG. 5H correspond to cross-sectional views taken along the B2-B2 line, the C2-C2 line and the D2-D2-line in FIG. 6B, respectively.

Subsequently, as shown in FIG. 5I, second and third apertures 64 and 66 are formed by etching the cladding layer 56, the active layer 54 and the spacer layer 53 by RIE through the above-mentioned second and third windows 62a and 62b.

Next, as shown in FIG. 5J, an InP layer is formed by MOCVD to a thickness of approximately 0.1 μm as a lower cladding layer 68 on the semiconductor layer 52 which is exposed in the second and third apertures 64 and 66. Furthermore, an InGaAsP layer with a composition wavelength of approximately 1.2 to 1.3 μm is formed by MOCVD to a thickness of approximately 0.15 μm on the lower cladding layer 68 to be set as a core layer 70. Thereafter, an InP layer with a thickness of approximately 0.2 μm is formed by MOCVD on the core layer 70 as an upper cladding layer 72.

In such an MOCVD process, the InP layer and the InGaAsP layer do not grow on the second mask layer 62 made of SiO$_2$, and thus these layers selectively grow only in the second and third apertures 64 and 66.

Then, the lower cladding layer 68, the core layer 70 and the upper cladding layer 72, which have been formed as described above, constitute a waveguide 74 in the second aperture 64 in the waveguide region B as well as constituting an optical coupler 76 in the third aperture 66 in the optical coupling region C.

Following this, as shown in FIG. 5K, the second mask layer 62 made of SiO$_2$ is removed by wet etching using the buffer hydrofluoric acid solution as etchant.

Next, as shown in FIG. 5L, a SiO$_2$ layer is formed by sputtering or the like to a thickness of approximately 300 nm all over the surface. Moreover, the SiO$_2$ layer is patterned by EB lithography or the like to be a third mask layer 78. The third mask layer 78 has a striped flat shape in the laser array region A, the waveguide region B and the optical amplification region D. Additionally, the width of the third mask layer 78 is, for example, approximately 1.5 μm in the laser array region A, the waveguide region B and the optical amplification region D.

Subsequently, as shown in FIG. 5M, the layers from the cladding layer 56 to the mid-depth of the buffer layer 51 in the laser array region A are etched by RIE using the third mask layer 78 as an etching mask. Thus, a layered product of these layers is made to be a mesa stripe. Also, by this etching, the layers from the upper cladding layer 72 to the mid-depth of the buffer layer 51 are etched in the waveguide region B and the optical coupling region C, thus making a layered product of these layers mesa stripes. Moreover, the layers from the first cladding layer 56a to the mid-depth of the buffer layer 51 are etched in the optical amplification region D, too, thus making it possible to obtain a mesa stripe.

Note that although the height of the above-mentioned mesa stripe in each region is not particularly limited, the height is set to be approximately 1.5 μm in the embodiment.

Figure 6C:
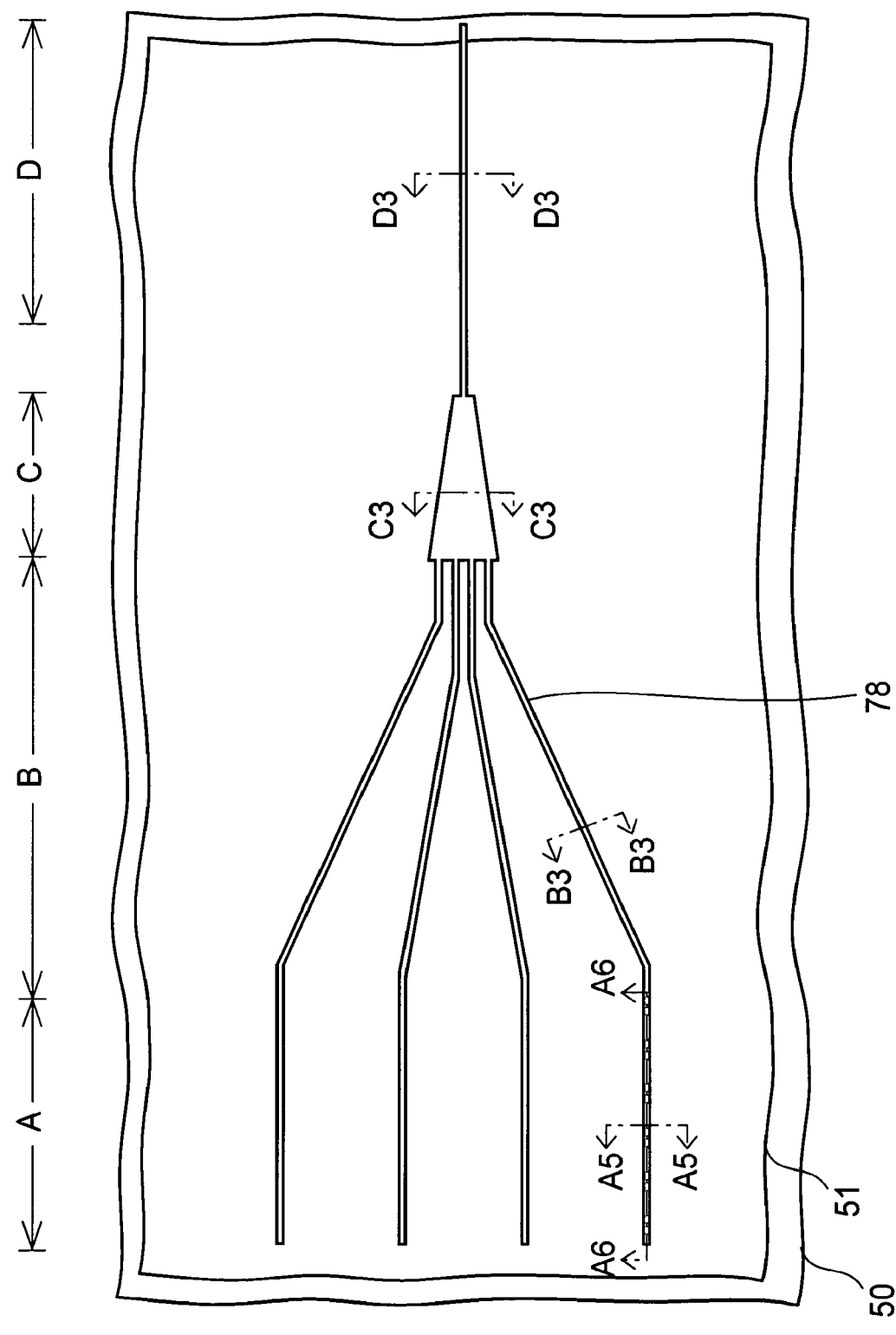

FIG. 6C is a plan view of after this process is completed. A first cross-section in the laser array region A in the above-mentioned FIG. 5M corresponds to a cross-sectional view taken along the A5-A5 line in FIG. 6C, and a second cross-section corresponds to a cross-sectional view taken along the A6-A6 line in FIG. 6C. Also, the cross-sectional views of the regions B to D in FIG. 5M correspond to cross-sectional views taken along the B3-B3 line, the C3-C3 line and the D3-D3 line in FIG. 6C, respectively.

Next, a description will be given of a process to obtaining a cross-sectional shape shown in FIG. 5N.

Firstly, a p-type InP layer is formed by MOCVD to a thickness of approximately 1.5 μm as a burying layer 82 on both sides of the mesa stripe in each region. Thus, the sides of the mesa stripes are covered with the burying layer 82. Zn is doped as p-type impurities in the p-type InP layer constituting the burying layer 82.

Next, an n-type InP layer, which is doped with S as n-type impurities, is formed by MOCVD to a thickness of approximately 0.4 μm on the burying layer 82. The n-type InP layer is set to be a current blocking layer 84.

In the MOCVD process for forming the burying layer 82 and the current blocking layer 84, an InP layer selectively grows only on the sides of the mesas and the upper surface of the buffer layer 51, and these layers do not grow on the third mask layer 78 made of $SiO_2$.

Thereafter, the third mask layer 78 is removed by wet etching with the buffer hydrofluoric acid solution.

Subsequently, as shown in FIG. 5O, a p-type InP layer is formed by MOCVD to a thickness of approximately 2.5 μm on each of the burying layer 82 and the current blocking layer 84. The p-type InP layer is set to be an upper side layer 86 of the cladding layer. P-type impurities to be doped in the p-type InP layer constituting the upper side layer 86 is not particularly limited. However, Zn is doped in the embodiment.

Next, a p-type InGaAs layer, which has been doped with Zn as p-type impurities, is formed by MOCVD to a thickness of approximately 0.1 μm on the upper side layer 86 of the cladding layer. The p-type InGaAs layer is set to be a contact layer 88.

Thereafter, a $SiO_2$ layer is formed by sputtering to a thickness of approximately 0.5 μm as a protective layer 90 on the contact layer 88.

Next, a description will be given of a process to obtaining a cross-sectional structure shown in FIG. 5P.

Firstly, the protective layer 90 is patterned by EB lithography or optical lithography, thus forming an electrode window 90a for an active layer, an electrode window 90b for a refractive index control layer and an electrode window 90c for switching respectively above the active layer 54 and the refractive index control layer 60 in the laser array region A. The protective layer 90 in the optical amplification region D is removed by the patterning, thus exposing the contact layer 88 in the optical amplification region D.

Following this, a Ti layer with a thickness of approximately 0.2 μm and a Pt layer with a thickness of approximately 0.25 μm are sequentially formed by an evaporation method all over the surface. Then, a plating resist (not shown) having apertures respectively on the above-mentioned windows 90a to 90c is formed on the Pt layer. Afterwards, an Au layer is formed on the Pt layer exposing in the apertures is formed by electrolytic plating to a thickness of approximately 3.0 μm. Subsequently, the excess Ti and Pt layers are removed by etching using the Au plating layer as a mask after the plating resist is removed.

Therefore, metal deposition films, in which the Ti, Pt and Au layers are formed in this order, is left in the window 90a as an electrode 92a for the active layer, as well as being left in the window 90b as an electrode 92b for the refractive index control layer.

In a first cross-section of FIG. 5P, these electrodes 92a and 92b are arranged one after the other in the direction of the laser oscillation (a direction of a mesa stripe's extension) at the same pitch of approximately 30 μm as that of the active layer 54 and the refractive index control layer 60 below the electrodes. The electrodes 92a and 92b function to selectively inject a current respectively into the active layer 54 and the refractive index control layer 60.

Although the electrodes 92a for the active layer are shown to be separated in a second cross-section in the laser array region A of FIG. 5P, as described later, each electrode 92a for the active layer is linked at a point away from the mesa stripe and is connected electrically. Regarding this respect, it is true to the electrodes 92b for refractive index control.

Moreover, the above-mentioned metal deposition films of the Ti, Pt and Au layers are left as an electrode 92c for switching in the electrode window 90c for switching in the central area of the second cross-section in the laser array region A. The electrode 92c for switching functions to inject a current into the active layer 54 therebelow.

On the other hand, the above-mentioned metal deposition films are left as an electrode 92d for amplification on the contact layer 88 in the optical amplification region D.

Thereafter, an Au—Ge alloy layer and an Au layer are formed in this order by the evaporation method on the back side of the InP substrate 50. For example, the Au—Ge alloy layer is approximately 0.05 μm thick, and the Au layer is approximately 0.25 μm thick. Furthermore, an Au layer is formed by electrolytic plating to approximately 3.0 μm on the above-mentioned Au layer. Thus, an n-side electrode layer 94, which is constituted of these metal deposition films, is formed on the back side of the InP substrate 50.

As described above, the basic structure of the optical semiconductor device according to the embodiment is completed.

It should be noted that although the core layer 70 in the regions B to C is formed in the different step from the refractive index control layer 60 in the above embodiment, layers 70 and 60 may be simultaneously formed when they have the same composition wavelength.

A wavelength-tunable laser element 100 is constituted of the above-described structure 61, and the electrode 92a for the active layer and the electrode 92b for the refractive index control layer, which are formed above the structure 61, in the laser array region A in this optical semiconductor device. The laser element 100 is called a tunable distributed amplifier (TDA) laser, too.

In the laser element 100, a laser oscillation is performed in the active layer 54 by injecting a current from the electrode 92a for the active layer.

Then, a filter wavelength of the laser element 100 has a distribution where the Bragg wavelength of the active layer 54, the Bragg wavelength being determined by the pitch length of the diffraction grating 52a, is set to be its peak.

Upon the laser oscillation, a current is injected from the electrode 92b for the refractive index control layer into the refractive index control layer 60 next to the active layer 54, too. If the amount of the current injection at this point is changed, the carrier density is changed in the refractive index control layer 60. Consequently, the refractive index of the refractive index control layer 60 is changed due to a plasma effect. Additionally, due to such a change in refractive index, the Bragg wavelength of the refractive index control layer 60 to be determined by the pitch of the diffraction grating 52a is changed and the filter wavelength of the refractive index control layer 60 is changed, too.

Hence, among the lasers oscillated from the active layer 54, only lasers with a wavelength matching the filter wavelength of the refractive index control layer 60 are taken out. Thus, it is made possible to change the wavelength of a laser outputted from the laser element 100 by changing the amount of the current injection into the refractive index control layer 60.

On the other hand, the optical amplifier 98 including the active layer 54 is formed in the optical amplification region D.

Thereby, the intensity of an optical signal passing through the active layer 54 is amplified by use of the current injected from the electrode 92d for amplification into the active layer 54, thus outputting the signal to the outside.

Figure 7:
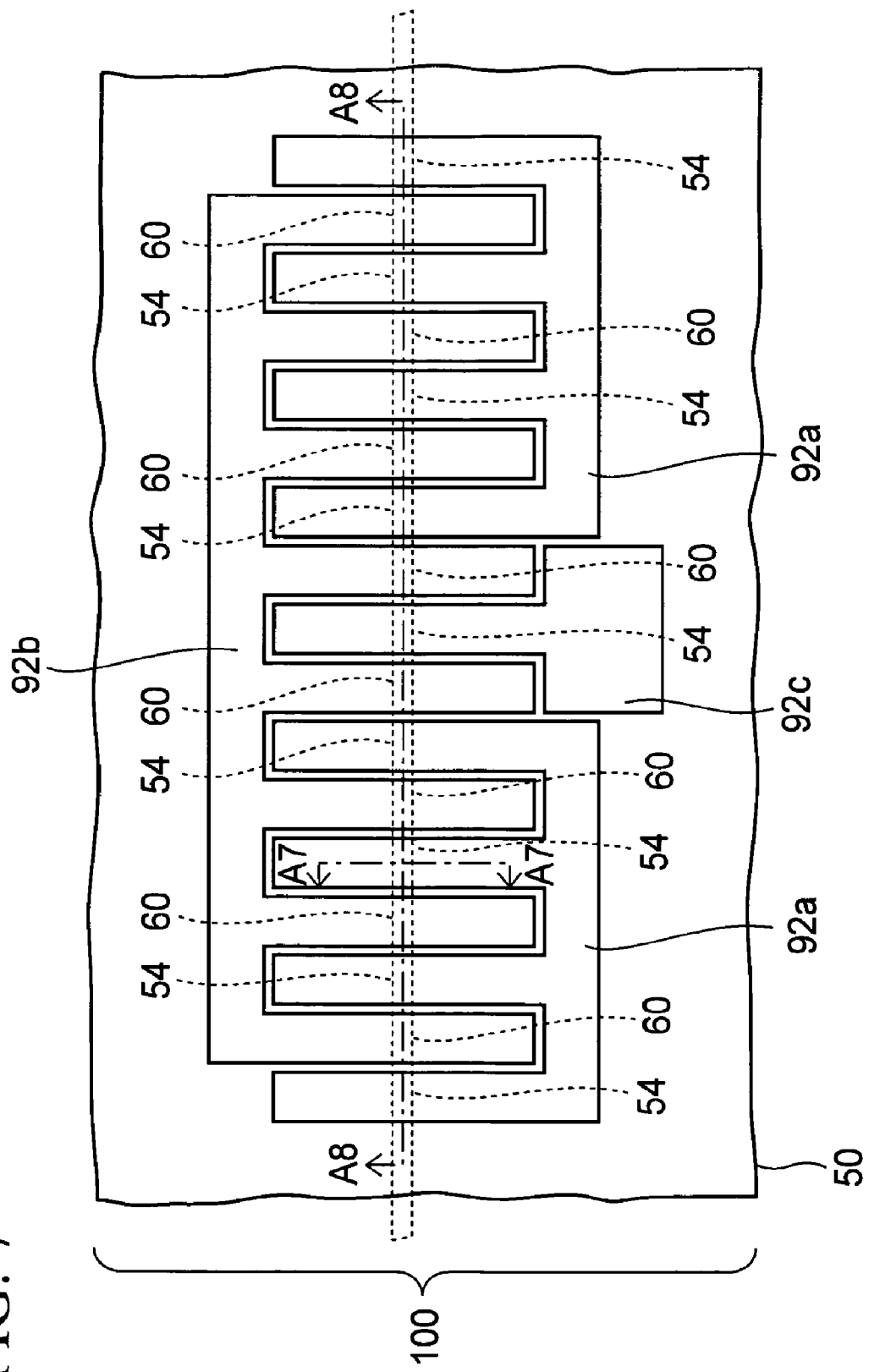
FIG. 7 is a plan view of a laser element included in the optical semiconductor device according to the first embodiment of the present invention.

FIG. 7 is a plan view of the above-mentioned laser element 100. A first cross-section in the laser array region A in the above-mentioned FIG. 5P corresponds to a cross-sectional view taken along the A7-A7 line in FIG. 7, and a second cross-section corresponds to a cross-sectional view taken along the A8-A8 line in the same drawing.

As shown in FIG. 7, each of the electrode 92a for the active layer and the electrode 92b for the refractive index control layer is comb-shaped, and is formed on the above-described structure 61 in a manner that their combs are engaged. A part of the electrode 92a for the active layer is separated, thus making it the electrode 92c for switching.

Figure 6D:
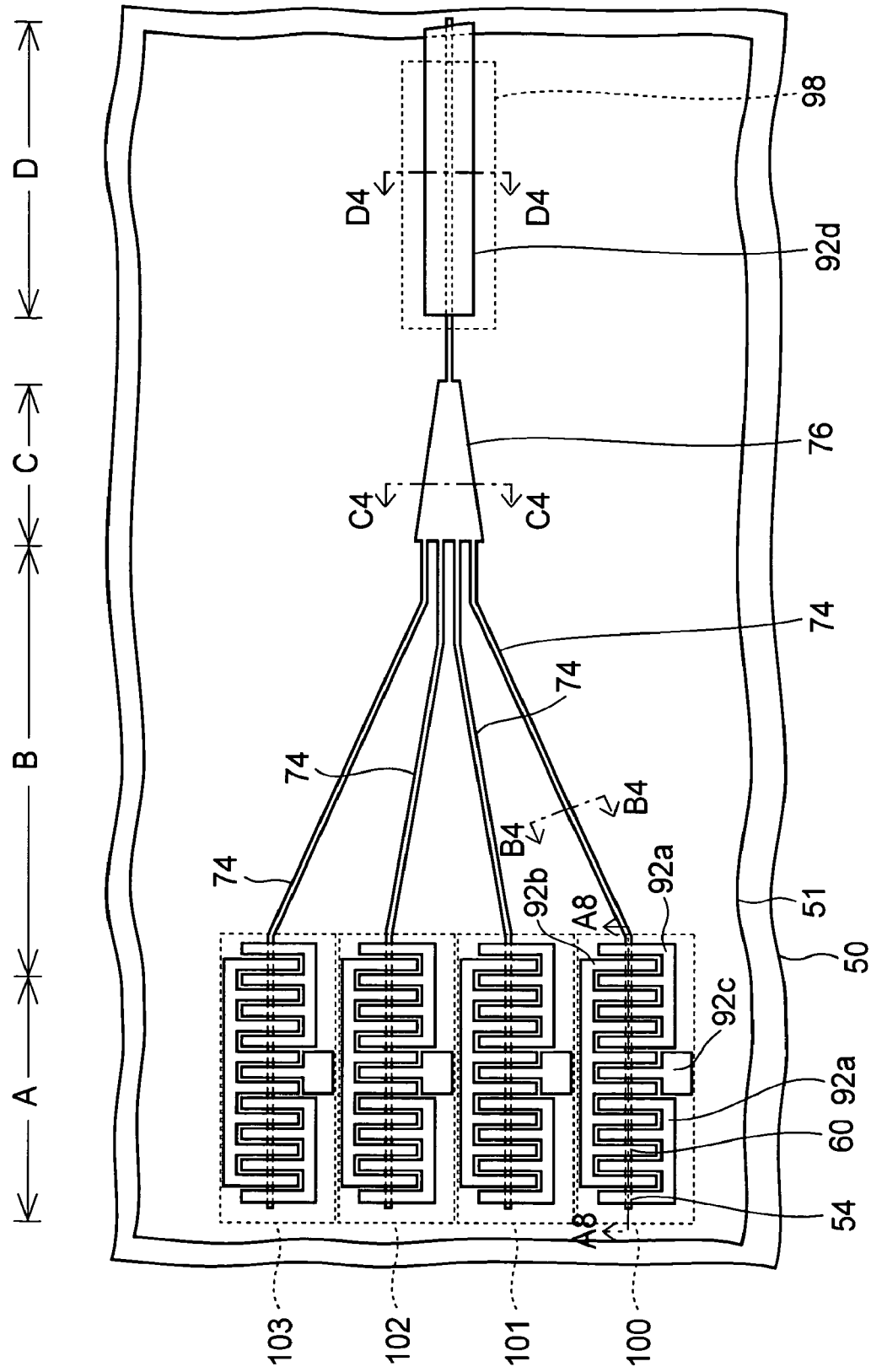

FIG. 6D is a plan view of the optical semiconductor device. Note that the cross-sectional views in the regions B to D in the above-mentioned FIG. 5P correspond to cross-sectional views taken along the B4-B4 line, the C4-C4 line and the D4-D4 line in FIG. 6D, respectively.

As shown in FIG. 6D, in addition to the above-described laser element 100, three more wavelength-tunable laser elements 100 to 103 having the same structure as the laser element 100, are formed in the laser array region A of the optical semiconductor device.

The oscillation wavelength of each laser element 100 to 103 is slightly different from each other by changing the pitch of a diffraction grating constituting each laser element. Thus, the laser elements work for different channels from each other in the WDM. Moreover, each single laser element 100 to 103 can change the wavelength of the laser oscillation as described above, thus even one of the laser elements 100 to 103 can work for a plurality of channels.

Furthermore, after passing through the waveguide 74 and the optical coupler 76 as the optical signal, the laser outputted from each laser element 100 to 103 is amplified for its intensity in the optical amplifier 98, and is then outputted to the outside.

Next, a description will be given of the more detailed behavior of the optical semiconductor device.

Figure 8:
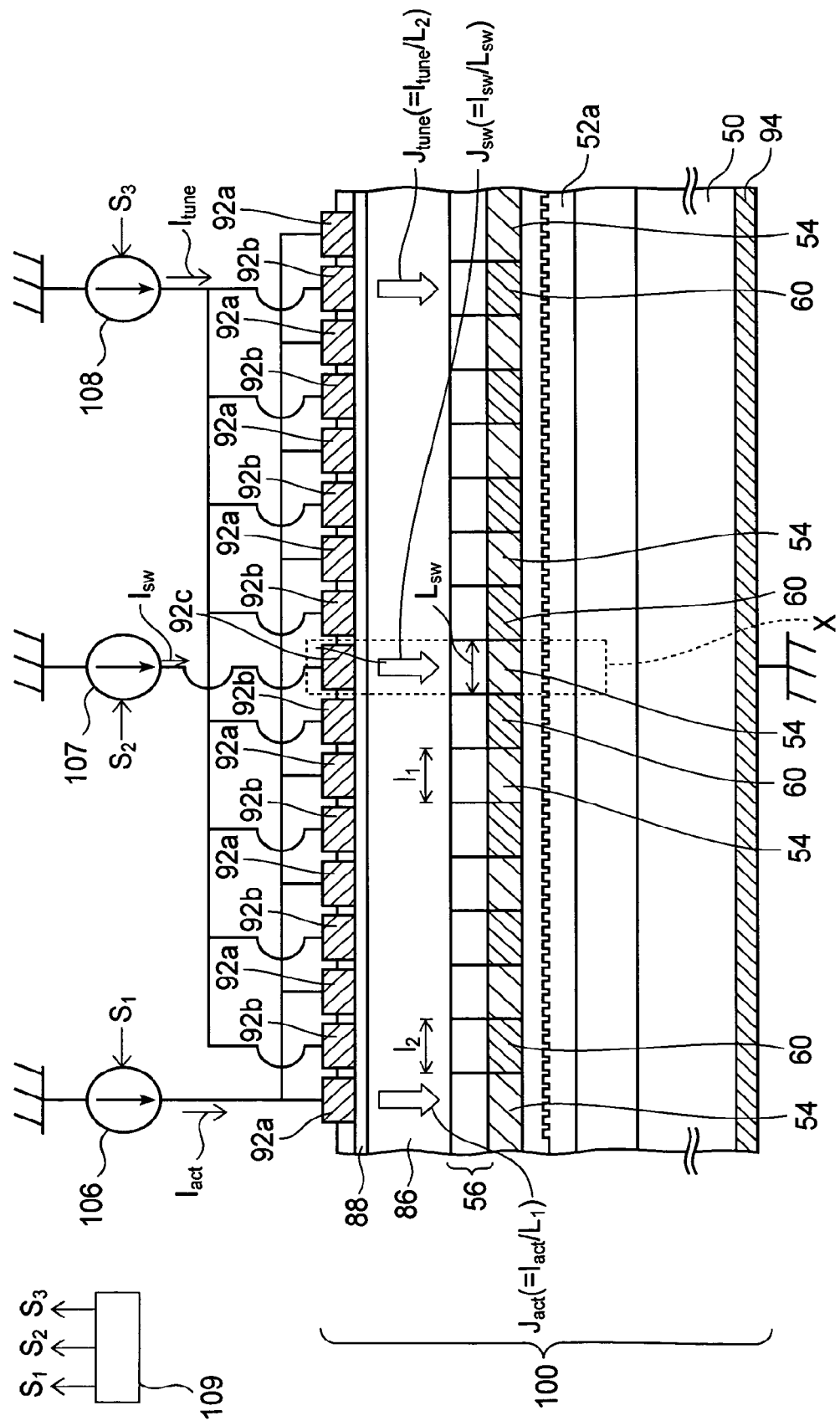
FIG. 8 is a cross-sectional view for explaining the behavior of the laser element included in the optical semiconductor device according to the first embodiment of the present invention.

FIG. 8 is a cross-sectional view for explaining the behavior of the laser element 100, and the remaining three laser elements 101 to 103 in FIG. 6D have the same structure as that of the laser element 100.

Under practical use, the laser element 100 is electrically connected to a current source 106 for activation, a current source 107 for switching and a current source 108 for refractive index control as shown in FIG. 8.

Out of these current sources, the current source 106 for activation is electrically connected to the electrode 92a for the active layer, and supplies a current $I_{act}$ for activation to the electrode 92a for the active layer. Additionally, the current source 108 for refractive index control is electrically connected to the electrode 92b for the refractive index control layer, and supplies a current $I_{tune}$ for refractive index control to the electrode 92b for the refractive index control layer.

On the other hand, the current source 107 for switching is electrically connected to the electrode 92c for switching disposed in the central area of the laser element 100, and supplies a current $I_{sw}$ for switching to the electrode 92c for switching.

These current sources 106 to 108 are controlled over the current amounts thereof by control signals $S_2$ to $S_3$ outputted from a control unit 109.

The currents $I_{act}$, $I_{tune}$ and $I_{sw}$, which have been supplied from each of the current sources 106 to 108 in this manner, flow through each of the layers 54 and 60 at a current density of $J_{act}$ ($=I_{act}/L_1$), $J_{tune}$ ($=I_{tune}/L_2$) and $J_{sw}$ ($=I_{sw}/L_{sw}$) respectively, where $L_1$ and $L_2$ denote total lengths of the lengths $l_1$ and $l_2$ of the active layer 54 and the refractive index control layer 60 respectively. Note that the current density indicates a current per unit length in the specification.

Figure 9:
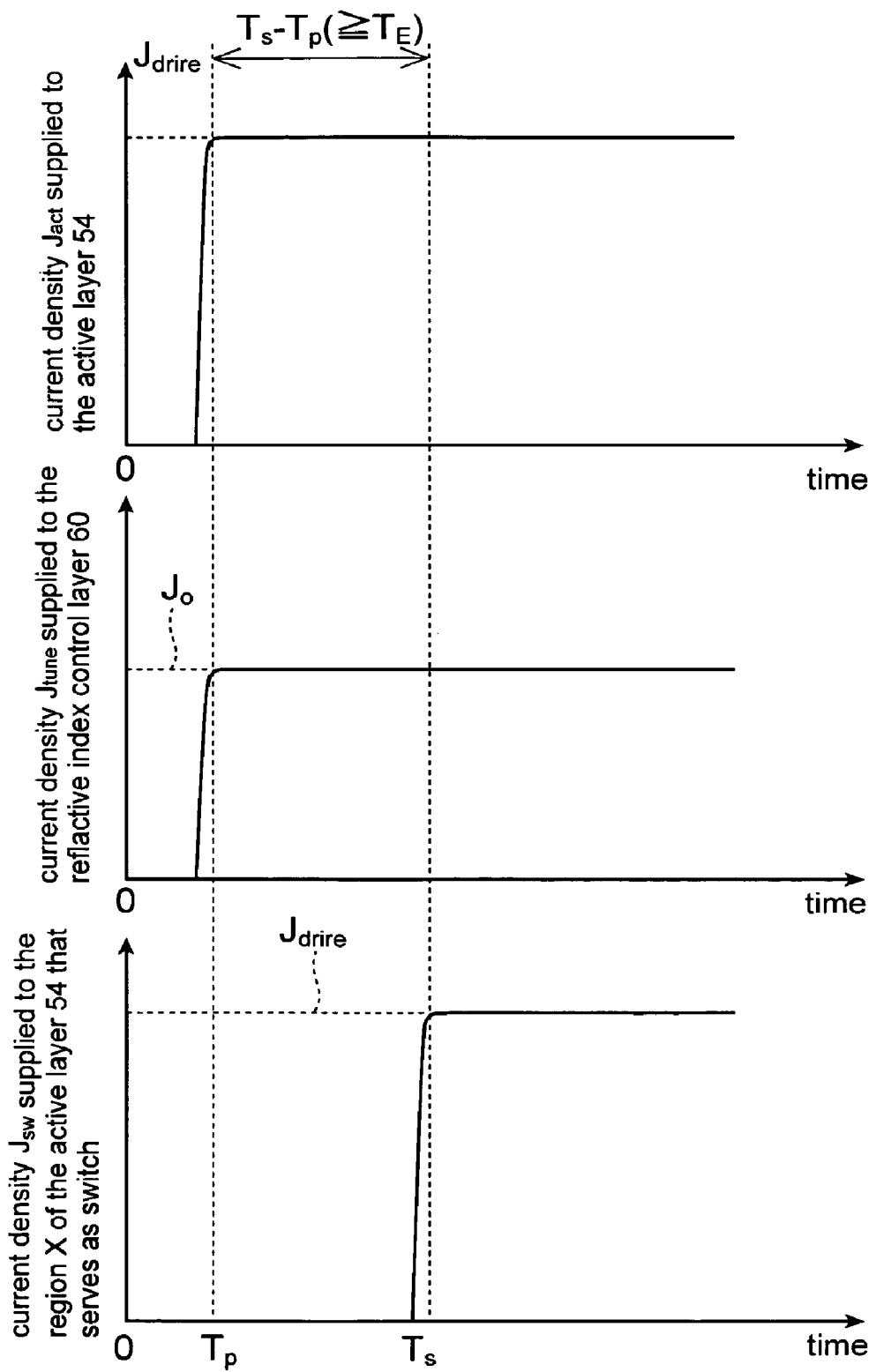
FIG. 9 is a timing chart showing timings of supplying a current to the optical semiconductor device according to the first embodiment of the present invention.

FIG. 9 is a timing chart of supplying currents from these current sources 106 to 108. With reference to FIGS. 8 and 9, a description will be given of the behavior of the laser element 100 before and after the oscillation.

Firstly, as shown in FIG. 9, a current $I_{drive}$ whose current density is $J_{drive}$ is previously supplied to the active layer 54 as a pre-bias current for the active layer at time $T_p$ which is time before the laser element 100 is oscillated. The current density $J_{drive}$ in this case means a current density of the current $I_{drive}$ for activation, which is necessary for letting the active layer 54 perform laser oscillation later.

At the same time, the current $I_{tune}$ at the current density $J_0$ is supplied to the refractive index control layer 60 as a pre-bias current for the refractive index control layer. The current density $J_0$ is the same as a current density of a current to be supplied to the refractive index control layer 60 upon driving the laser, and is determined in accordance with the wavelength of the laser light oscillated from the laser element 100.

When the pre-bias current for the active layer is supplied as described above, spontaneously emitted light is generated in the active layer 54. However, since the carrier density in the active layer 54 is not thermally stable immediately after the pre-bias current for the active layer is supplied, the wavelength of the above-mentioned spontaneously emitted light is not stable.

Therefore, in order to prevent the laser oscillation from occurring due to spontaneously emitted light whose wavelength is unstable, the current $I_{sw}$ is not supplied to the active layer 54 in a region X functioning as a switch (see FIG. 8) at the above-mentioned time $T_p$, and the active layer 54 in the region X is set to be off state. Hereinafter, the region X is also referred to as the switching region X.

As described above, the active layer 54 in the switching region X and the active layer 54 in the other areas are formed of InGaAsP which has the same composition wavelength in both regions. Hence, even if the pre-bias current for the active layer is supplied to the active layer 54 in the other areas than the region X and thus the spontaneously emitted light is generated from the active layer 54 as described above, the spontaneously emitted light is absorbed in the active layer 54 in the switching region X. Hence, the spontaneously emitted light cannot feedback and forth over the diffraction grating 52a inside the laser element 100. As a result, the laser oscillation does not occur in the laser element 100.

Then, after time, which is equal to or more than time $T_E$ necessary for the carrier densities and the like to reach thermal equilibrium in the refractive index control layer 60 and the active layer 54 except in the switching region X, elapses, the switching current $I_{sw}$ whose current density is $J_{drive}$ is supplied to the active layer 54 in the switching region X at time $T_3$.

In this manner, spontaneously emitted light is generated even in the active layer 54 in the switching region X. Thus, the spontaneously emitted light generated in the active layer 54 except in the switching region X is not absorbed in the active layer 54 in the switching region X. As a consequence, the above-mentioned spontaneously emitted light freely travels inside the laser element 100, and thus the standing waves of the spontaneously emitted light occur by the diffraction grating. Eventually, the laser element 100 brings about the laser oscillation by the stimulated emission of photons caused by the standing waves.

In this manner, in the embodiment, the laser element 100 can be made into "on" state by supplying a current from the electrode 92c for switching to the active layer 54 in the switching region X, and can be made into "off" state by halting the supply of the current.

Figure 10:
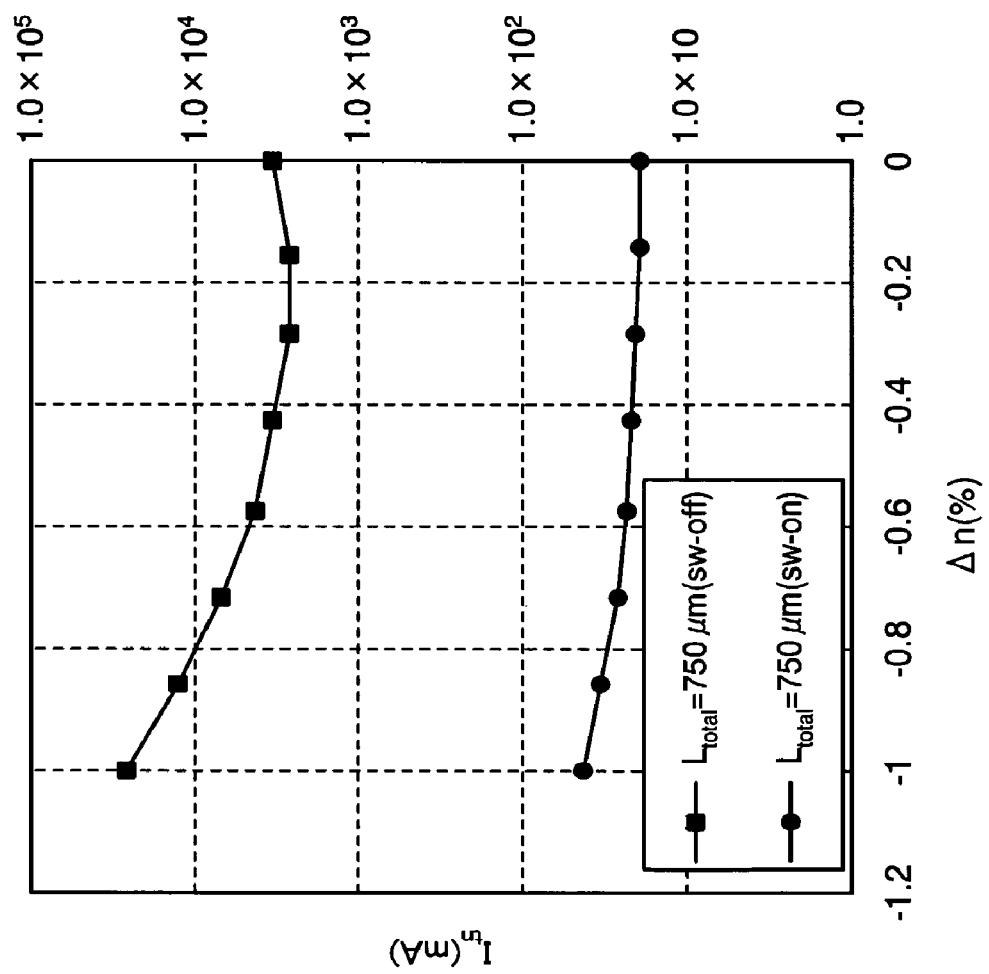
FIG. 10 is a graph obtained by researching in a threshold current of the laser element included in the optical semiconductor device according to the first embodiment of the present invention.

FIG. 10 is a graph obtained by researching in a threshold current of the laser element 100 in such "on" and "off" states.

In FIG. 10, a series indicated with • is a threshold current $I_{th}$ in the "on" state, and a series indicated with is the threshold current in the "off" state.

Furthermore, in the research, a refractive index n of the refractive index control layer 60 was changed by variously changing the injection current $I_{tune}$ into the refractive index control layer 60, and the above-mentioned threshold current $I_{th}$ at each refractive index is researched. Δn indicated in the horizontal axis in FIG. 10 shows the amount of a change in the refractive index n of the refractive index control layer 60 when a case of injecting no current $I_{tune}$ into the refractive index control layer 60 is set to be the criterial refractive index. Moreover, in the research, a length $L_{total}$ in the axis direction of a resonator of the laser element 100 is set to be 750 μm.

As clearly seen from FIG. 10, even if the change amount of the above-mentioned refractive index Δn is changed within a range from 0% to −1.0%, each threshold current $I_{th}$ of the "on" and "off" states are sufficiently apart. Therefore, it was made clear that the "on" and "off" states of the laser element 100 can definitely be switched by use of the switching current $I_{sw}$.

According to the embodiment as described above, as shown in the timing chart of FIG. 9, firstly, while the "off" state of the laser element 100 is maintained without supplying a current to the active layer 54 functioning as a switch in the switching region X (see FIG. 8), a current whose current density is $J_{drive}$ is supplied to the active layer 54 except in the switching region X as the pre-bias current for the active layer, as well as supplying a current whose current density is $J_0$ to the refractive index control layer 60 as the pre-bias current for the refractive index control layer.

Then, after the time $T_E$, which is a time necessary for the carriers in these active layer 54 and refractive index control layer 60 to reach thermal equilibrium, elapses, a current is supplied to the active layer 54 in the switching region X at the time $T_s$, thus turning on the laser element 100.

According to this, even if spontaneously emitted light whose wavelength is unstable due to the thermally unstable carriers is generated between the time $T_p$ and the time $T_s$, the spontaneously emitted light is absorbed by the active layer 54 in the switching region X. Hence, it is possible to prevent laser light whose wavelength is unstable from being oscillated. In addition, it is also possible to prevent the wavelength from becoming unstable due to the refractive index control layer 60 which is not in thermal equilibrium. Moreover, the laser element 100 is turned on at the time $T_s$ when the wavelength of the spontaneously emitted light becomes stable since the carriers have reached thermal equilibrium, thus making it possible to output laser light whose wavelength is stable.

Figure 1:
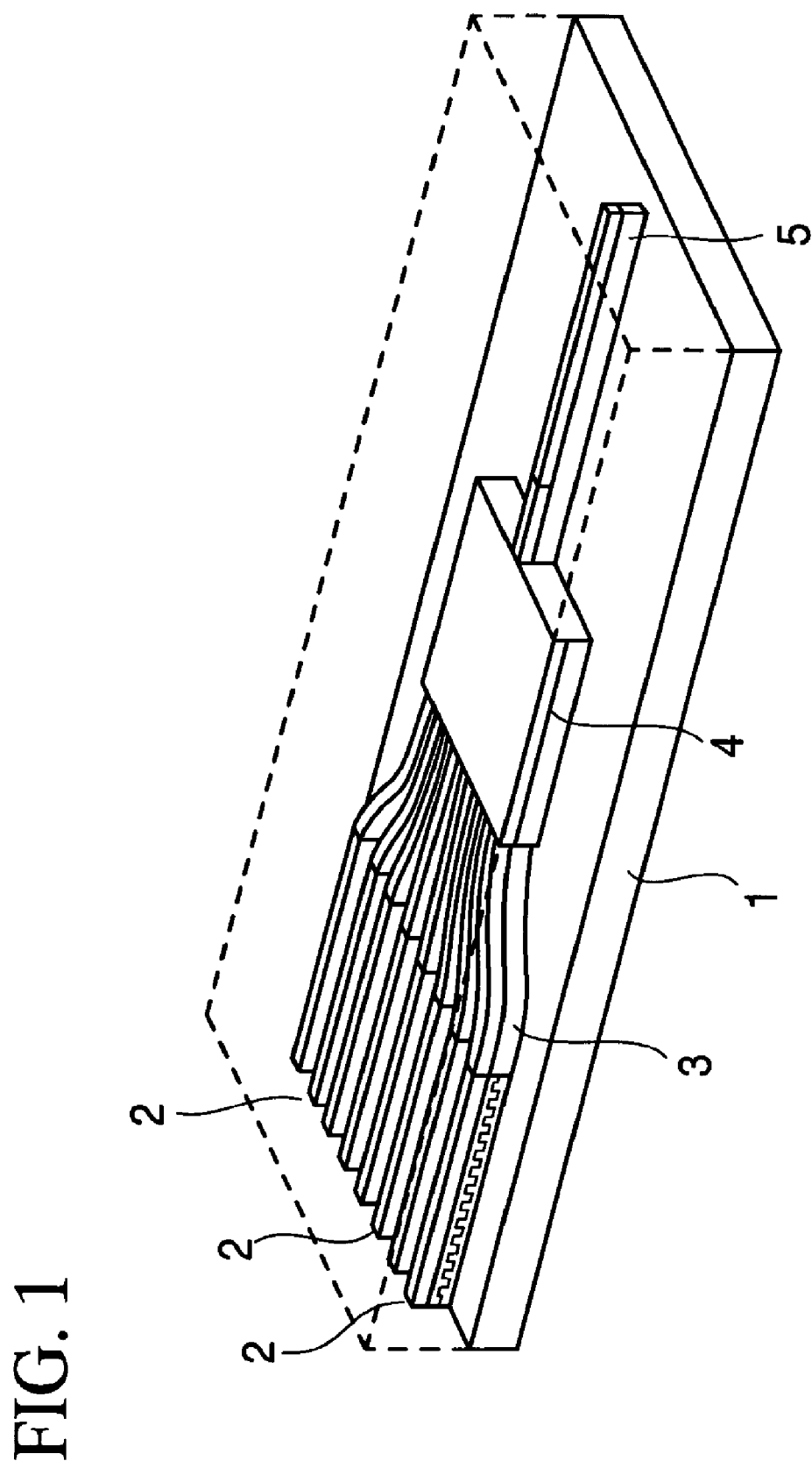
FIG. 1 is a perspective view of a wavelength-tunable optical semiconductor device of an array integrated type according to a conventional example.
Figure 2:
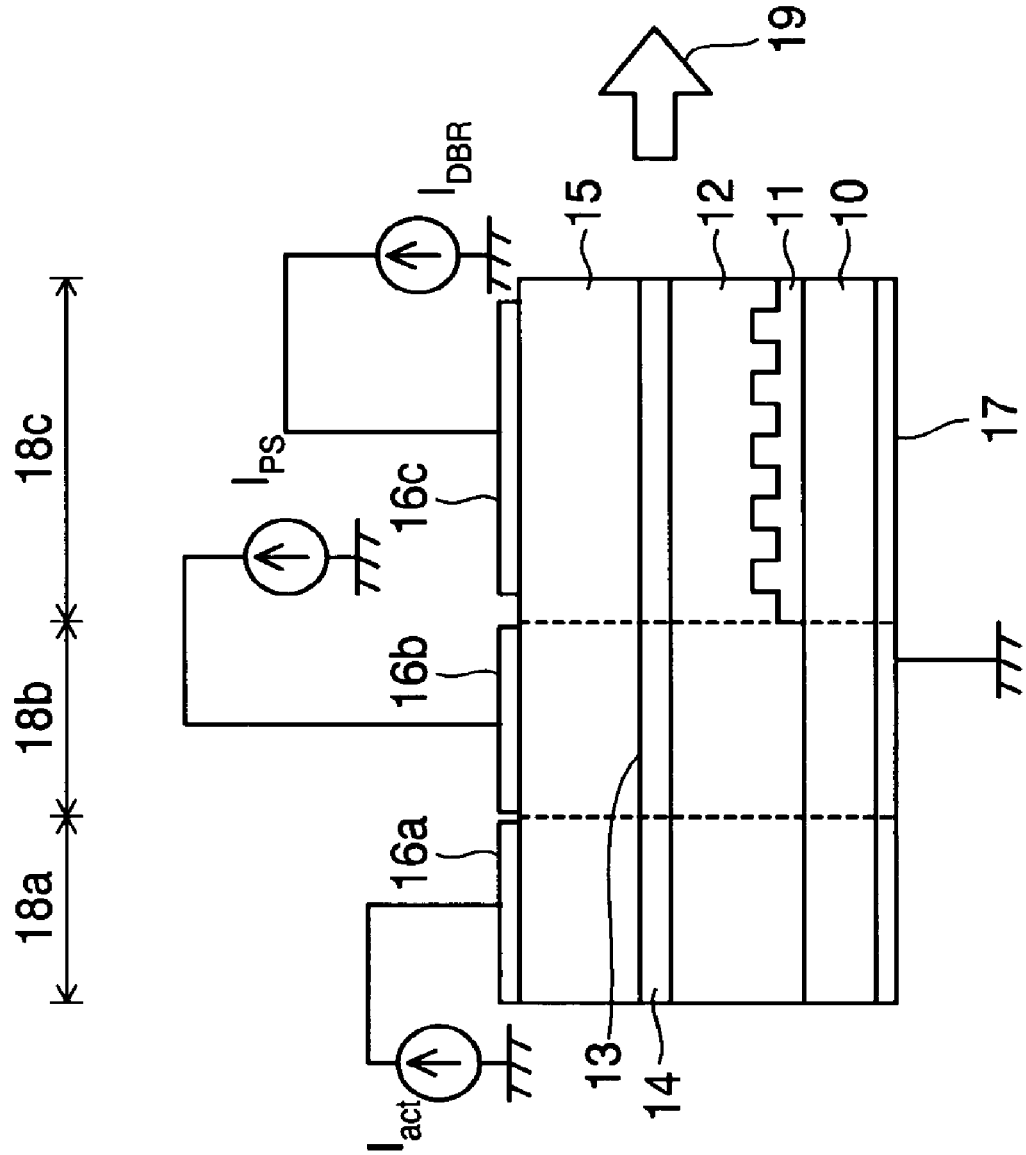
FIG. 2 is a cross-sectional view along the cavity axis of a DBR laser according to the conventional example.
Figure 3:
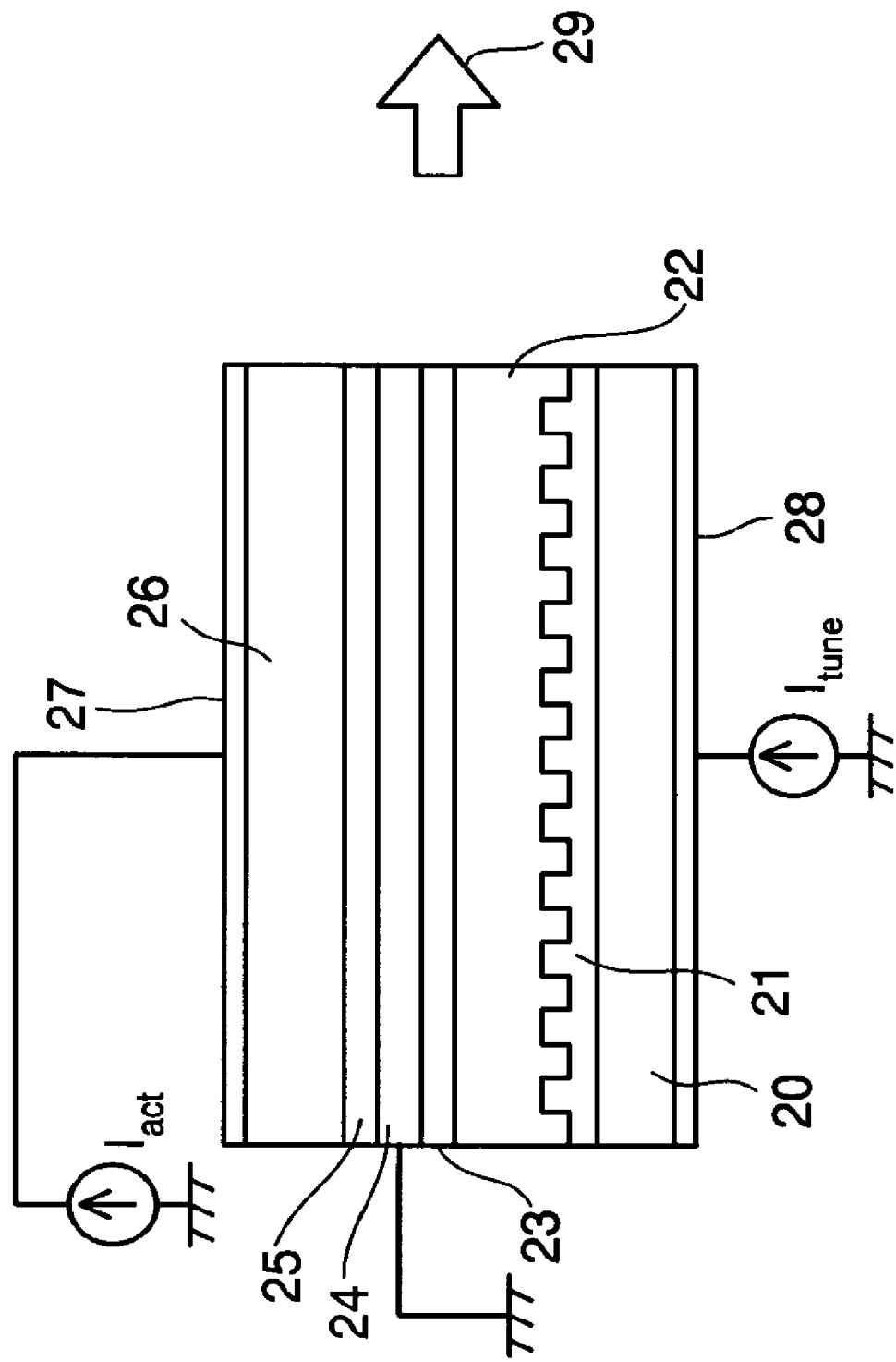
FIG. 3 is a cross-sectional view along the cavity axis of a TTG-DFB laser according to the conventional example.
Figure 4:
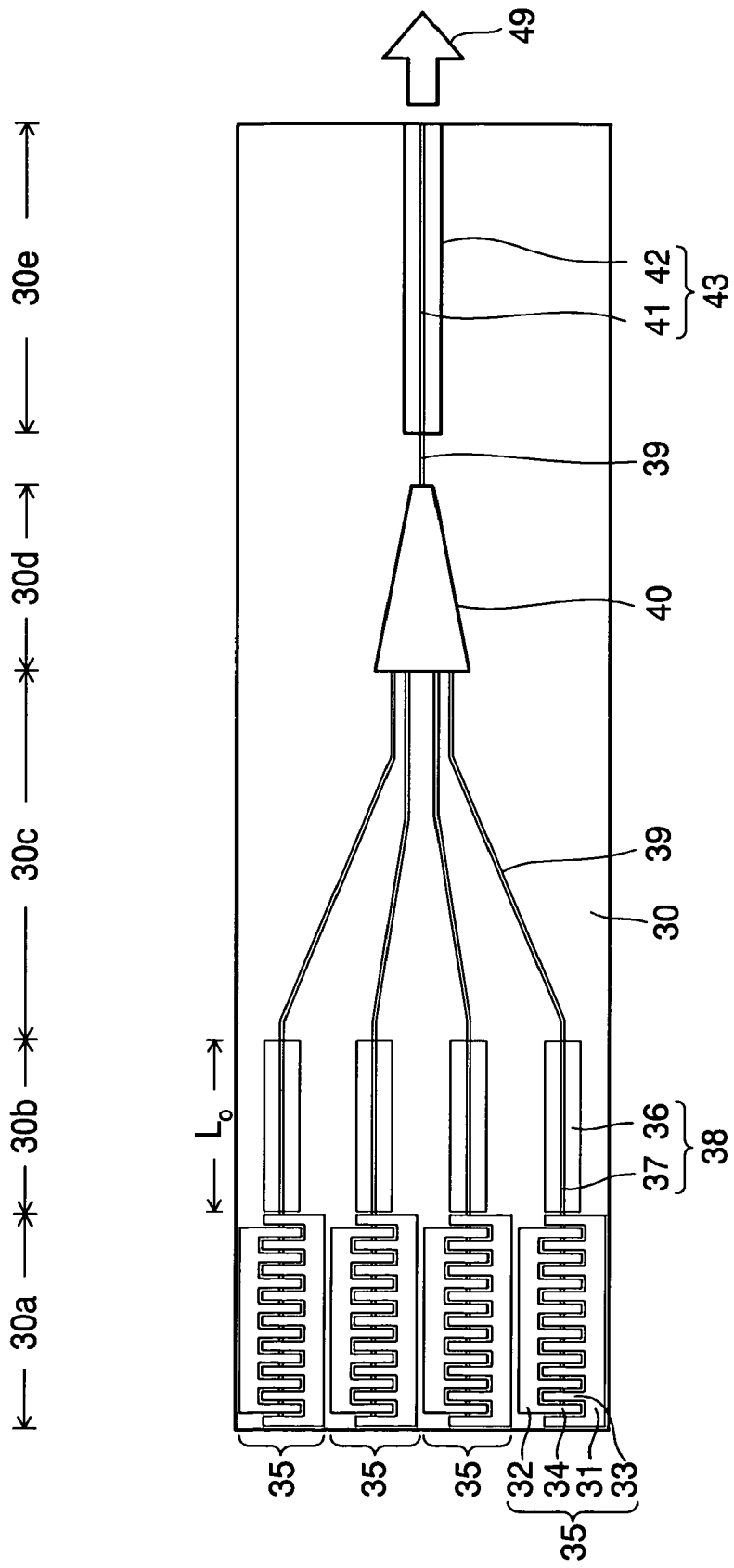
FIG. 4 is a plan view of the optical semiconductor device according to the conventional example.

Additionally, in the embodiment, the laser oscillation does not occur by absorbing spontaneously emitted light in the active layer 54 by supplying no current to the active layer 54 in the switching region X under the electrode 92c for switching. Thus, the laser element 100 is set to be in the "off" state. This is intended to absorb spontaneously emitted light at weak intensity in the active layer 54 in the switching region X, unlike the optical semiconductor device of FIG. 4, which forcibly absorbs laser light in a gate element in a state where the laser oscillation is occurring. Therefore, the lengths of the active layer 54 and the electrode 92c for switching in an axial direction of the resonator can be much shorter than the length of the gate element 38 in FIG. 4, which absorbs the laser light whose intensity is much stronger than the spontaneously emitted light. As a result, in the embodiment, the size of an optical semiconductor device can be miniaturized compared to the conventional example of FIG. 4, thus making it possible to satisfy the requirement of the miniaturization of the optical semiconductor device required in recent years.

Furthermore, the optical semiconductor device according to the embodiment can be fabricated only by separating a part of the electrode 92a for the active layer to make it the electrode 92c for, switching. For this reason, compared with a manufacturing process of a general optical semiconductor device, in which the electrode 92c for switching is not formed, it is possible to obtain the optical semiconductor device according to the embodiment without increasing the number of processes. Thus, it is made possible to fabricate the above-described high-quality optical semiconductor device without inviting an increase in manufacturing cost.

(2) Second Embodiment

This embodiment is the same as the first embodiment except for the amount of the pre-bias current for the active layer compared with the first embodiment.

Figure 11:
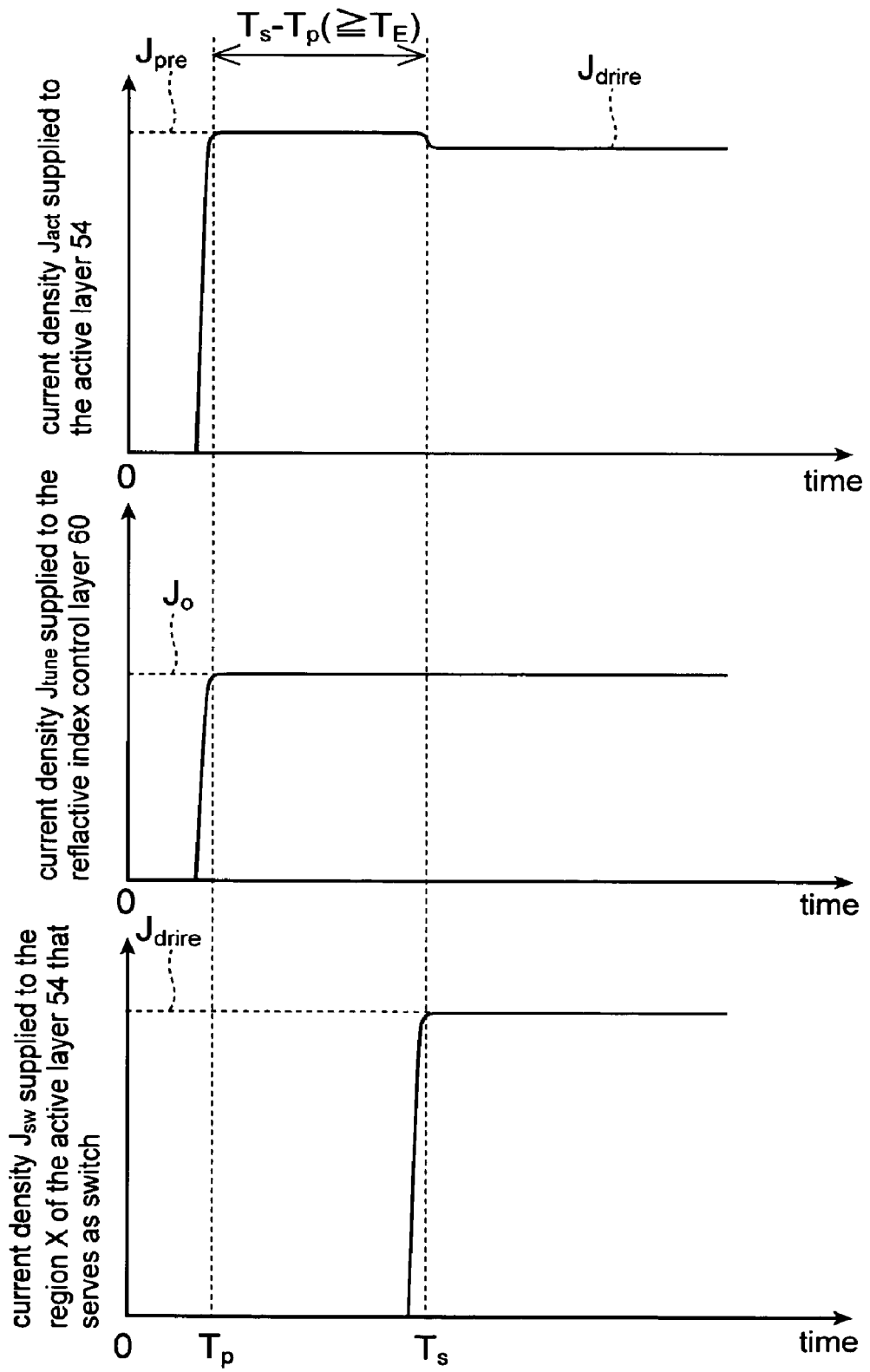
FIG. 11 is a timing chart showing timings of supplying a current to an optical semiconductor device according to a second embodiment of the present invention.

FIG. 11 is a timing chart showing timings of supplying a current to an optical semiconductor device according to this embodiment.

In the first embodiment, as shown in FIG. 9, the density of the pre-bias current for the active layer to be supplied between the time $T_p$ and the time $T_s$ is set to be $J_{drive}$ which is necessary for laser oscillation to be performed in the active layer 54.

On the contrary, in the present embodiment, the current density $J_{act}$ of the pre-bias current for the active layer, which is supplied to the active layer 54 except in the switching region X between the time $T_p$ and the time $T_s$, is set to be $J_{pre}$ which is larger than $J_{drive}$ in FIG. 9. By adopting a larger current as a pre-bias current for the active layer than the current density $J_{drive}$ to be used at the time of the laser oscillation in this manner, the active layer 54 injected with the pre-bias current is heated up to a higher temperature than a temperature of the time of the laser oscillation. Therefore, in the "off" state between the time $T_p$ and the time $T_s$, the temperature of the active layer 54 in the switching region X, where the switching current $I_{sw}$ is not supplied, is previously increased due to thermal diffusion from the active layer 54 except in the switching region X. For this reason, even if the laser element 100 is turned on at the time $T_s$, the carrier density in the active layer 54 in the switching region X reaches thermal equilibrium in a short time. Accordingly, it is possible to prevent the wavelength of the laser oscillation in the active layer 54 in the switching region X from fluctuating, thus making it possible to obtain a higher-quality laser light than a case of FIG. 9.

(3) Third Embodiment

In this embodiment, a description will be given of the switching operation of the laser output between each of the laser elements 100 to 103 in the optical semiconductor device explained in the first embodiment with reference to FIG. 6D.

It is arbitrary to switch each of the laser elements 100 to 103 in what combination. However, in order to simplify the description, a description will be given of a case of switching the output from the laser element 101 to the laser element 102 hereinafter.

Figure 12:
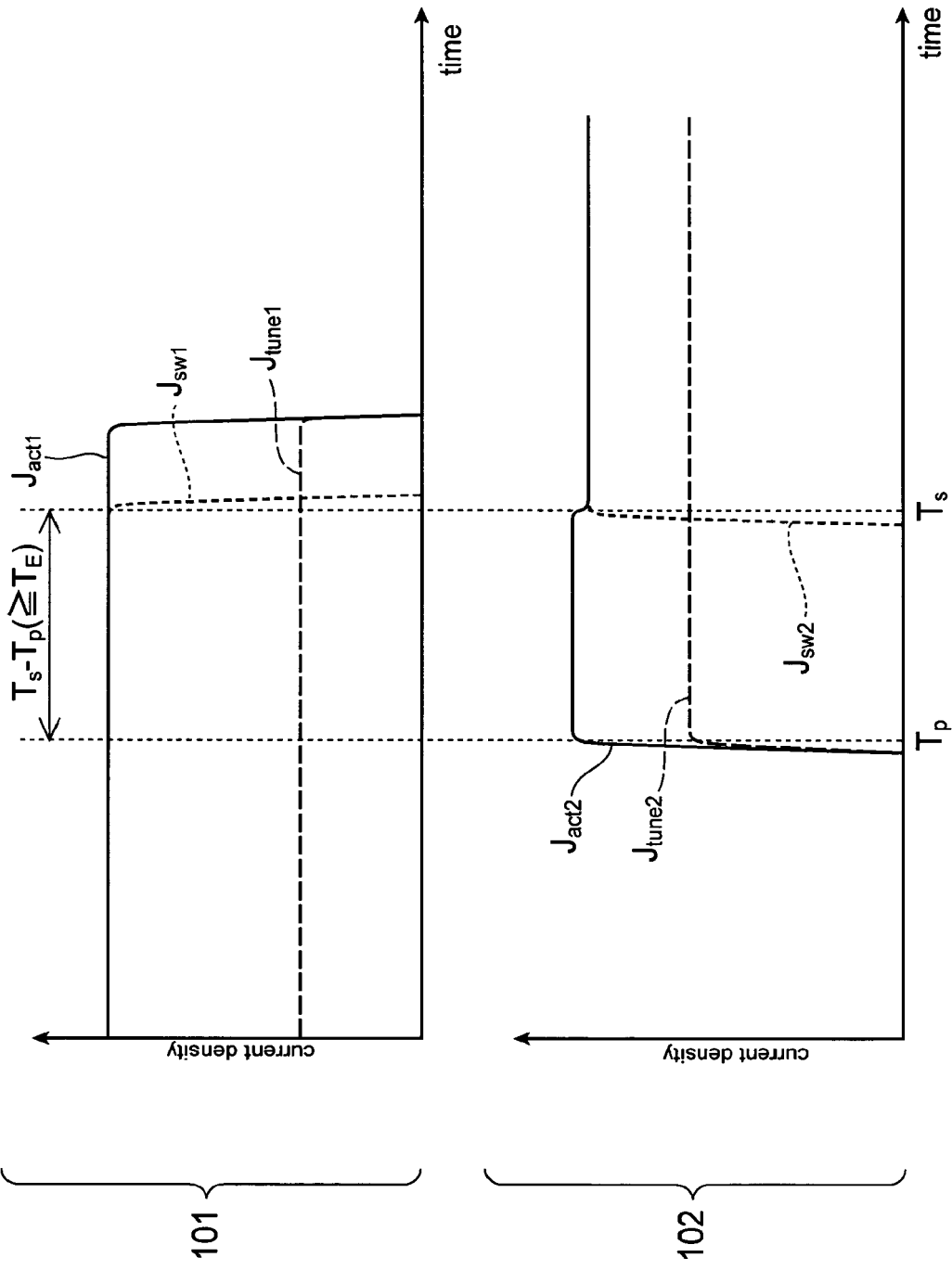
FIG. 12 is a timing chart of a case where a laser output is switched between laser elements included in an optical semiconductor device according to a third embodiment of the present invention.

FIG. 12 is a timing chart of the switching operation of the laser output in that case.

Note that regarding each current density $J_{act}$, $J_{sw}$ and $J_{tune}$, which were explained in FIG. 9 in the first embodiment, each current density in the laser element 101 is indicated as $J_{act1}$, $J_{sw1}$ and $J_{tune1}$, and each current density in the laser element 102 is indicated as $J_{act2}$, $J_{sw2}$ and $J_{tune2}$.

In an example of FIG. 12, the laser output is switched from the laser element 101 to the laser element 102 at the time $T_s$.

Before the time-$T_s$, the above-described current $T_{act}$ for activation, the current $I_{sw}$ for switching and the current $I_{tune}$ for refractive index control are supplied to the laser element 101 respectively at the current densities of $J_{act1}$, $J_{sw1}$ and $J_{tune1}$, which are shown in the FIG. 12, and the laser oscillation is performed in the laser element 101.

Then, at the time sufficiently before the time $T_s$, for example, at the time $T_p$ obtained by going back the time $T_E$ required for the carrier densities and the like to reach thermal equilibrium in the active layer 54 and the refractive index control layer 60 from the time $T_s$, the current $I_{act}$ for activation, which has a larger current density $J_{act2}$ than the above-described $J_{drive}$, is started to be supplied to the laser element 102 as the pre-bias current for the active layer.

Since the current $I_{sw}$ for switching has not yet supplied to the laser element 102 at the time $T_p$, the laser element 102 is in the "off" state. Therefore, even if the above-mentioned current $I_{act}$ for activation is supplied, the laser element 102 does not cause the laser oscillation.

Moreover, at the time $T_p$, the current for refractive index control $I_{tune}$ is started to be supplied to the laser element 102 at the current density of $J_{tune2}$. Between the time $T_p$ and the time $T_s$, the relevant current $I_{tune}$ for refractive index control serves as the pre-bias current for the refractive index control layer, and the carrier density and the like of the refractive index control layer 60 in the laser element 102 is put in thermal equilibrium.

Following this, after the carrier density and the like in the laser element 102 reach thermal equilibrium by use of the current $I_{act}$ for activation and the current $I_{tune}$ for refractive index control, the current $I_{sw}$ for switching in the laser element 102 is supplied to the laser element 102 at the current density of $J_{sw2}$ at the time $T_s$ of the switching. Thus, the laser element 102 is brought into on state, and laser light is outputted from the laser element 102.

On the other hand, at the time $T_s$, the current $I_{sw}$ for switching at the current density of $J_{sw1}$ is halted to be supplied in the laser element 101. Therefore, the laser element 101 is brought into "off" state at and after the time $T_s$, thus ceasing the laser output.

As described above, at the time $T_s$, the switching of the laser output from the laser element 101 to the laser element 102 is completed.

According to the switching operation of this kind, before the time $T_s$ to perform switching, the current $I_{act}$ for activation (the current density $J_{act2}$) is supplied to the laser element 102 as the pre-bias current for the active layer, while the current $I_{tune}$ for refractive index control (the current density $J_{tune2}$) is supplied as the pre-bias current for the refractive index control layer. Hence, at the time $T_s$, in the laser element 102, the carrier densities of the refractive index control layer 60 and the active layer 54 except in the switching region X (see FIG. 8) have already reached thermal equilibrium. Accordingly, the laser element 102 can be brought into "on" state by supplying the current $I_{sw}$ for switching (the current density of $J_{sw2}$) without waiting till the active layer 54 and the refractive index control layer 60 become thermally stable. As a result, time necessary for switching from the laser element 101 to the laser element 102 can be sped up by the time $T_E$ which is time till the carrier density reaches thermal equilibrium, as well as making it possible to output high-quality laser light whose wavelength shift associated with thermal instability is reduced. Hence, it is made possible to largely contribute to realizing the WDM with the higher performance.

(4) Fourth Embodiment

Figure 13:
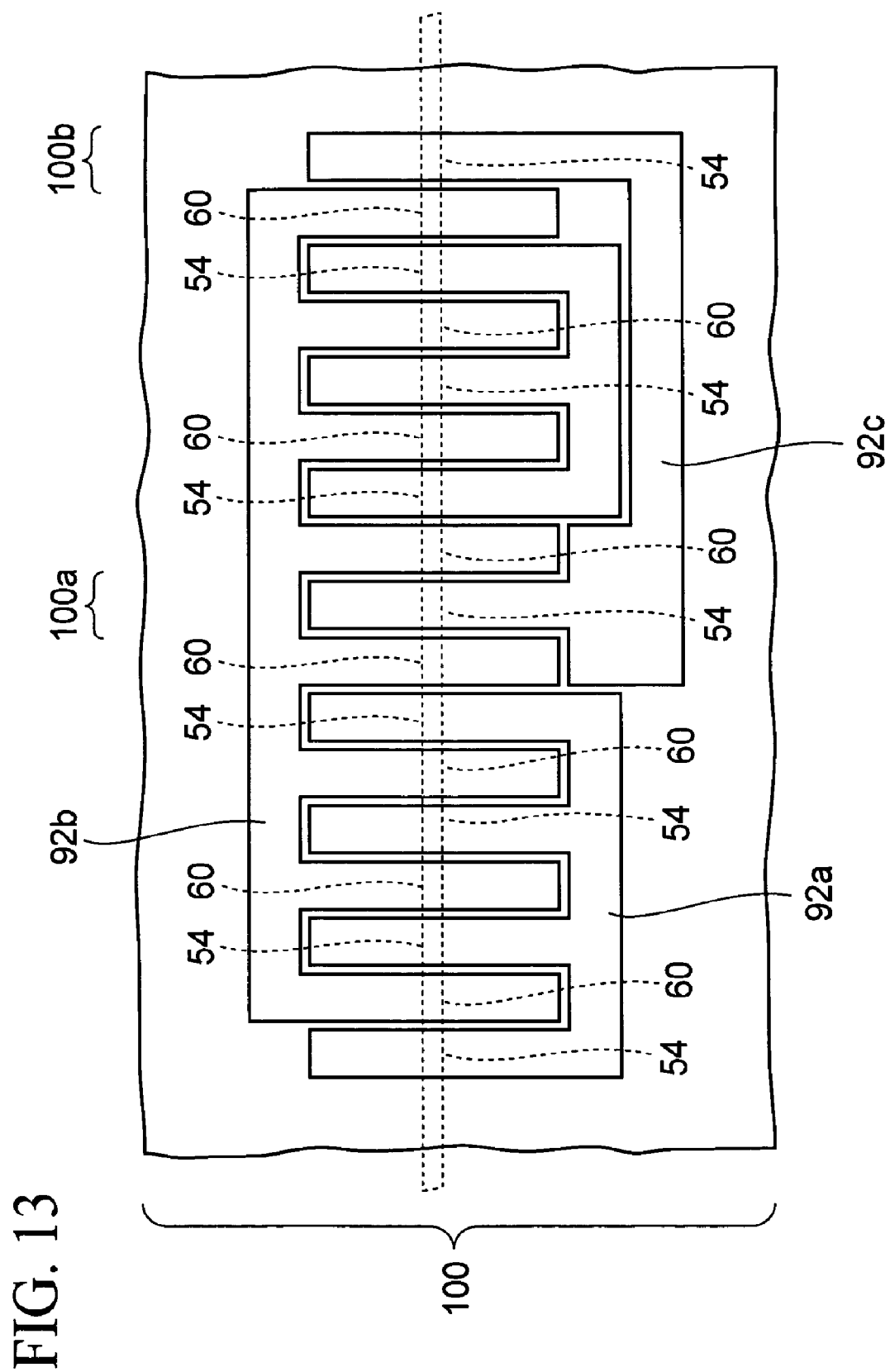
FIG. 13 is a plan view of a laser element included in an optical semiconductor device according to a fourth embodiment of the present invention.
Figure 14:
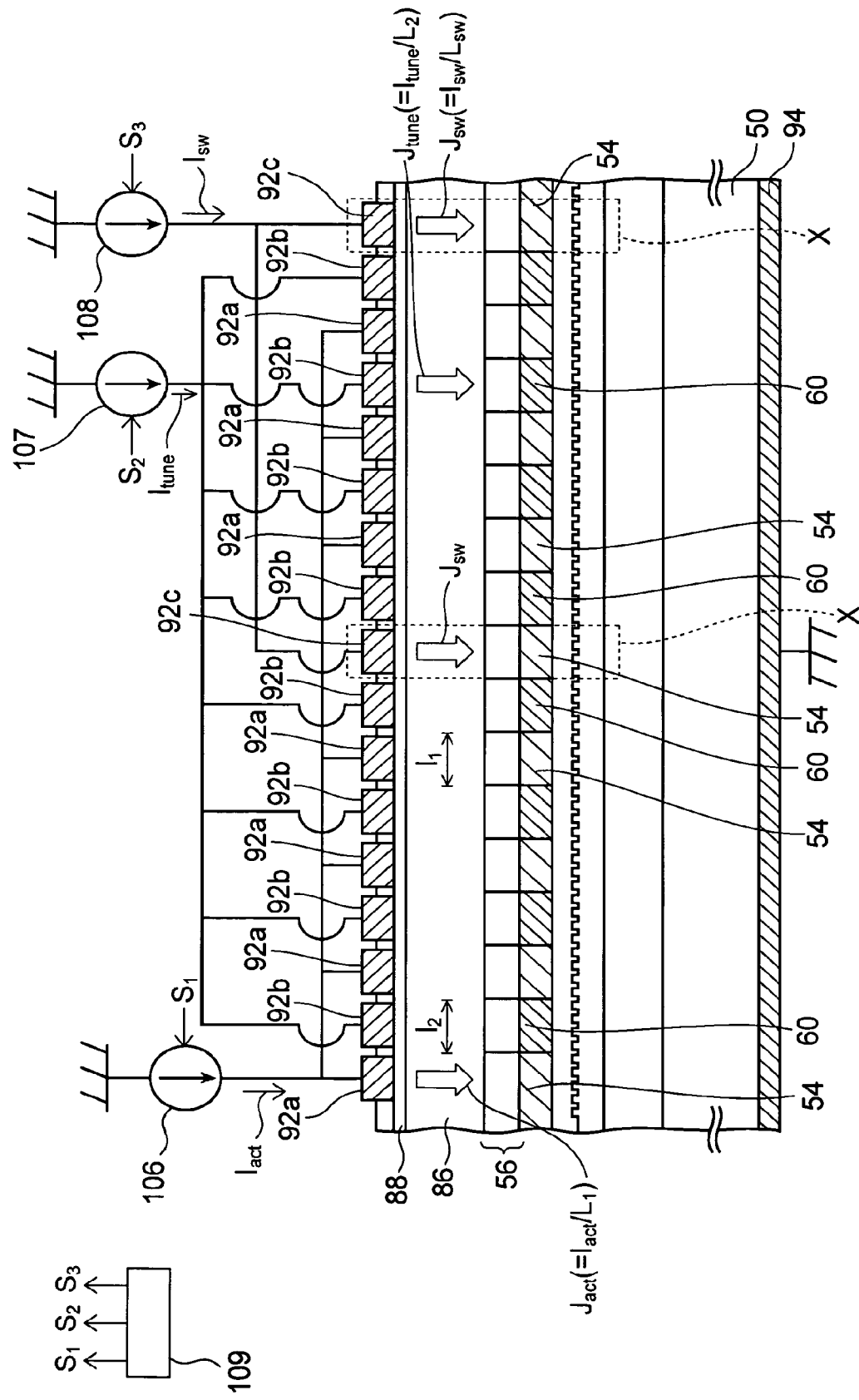
FIG. 14 is a cross-sectional view for explaining the behavior of the laser element included in the optical semiconductor device according to the fourth embodiment of the present invention.

FIG. 13 is a plan view of a laser element 100 included in an optical semiconductor device according to this embodiment. FIG. 14 is a cross-sectional view for explaining the behavior of the laser element 100. In the drawings, the same reference numerals as those of the first embodiment are allocated to the components which were described in the first embodiment, and the descriptions thereof will be omitted hereinafter.

In the above-described first embodiment, as shown in the plan view of FIG. 7, the electrode 92c for switching is formed in the central area of the laser element 100.

On the other hand, in this embodiment, as shown in FIG. 13, the electrode 92c for switching is formed above the active layer 54 at the output end 100b in addition to the central area 100a of the laser element 100. Such flat-shaped electrode 92c for switching can be formed by using a different mask for patterning from that of the first embodiment, in the patterning process of the electrode, the process being described in the first embodiment (see FIG. 5P).

As shown in FIG. 14, under practical use, the current source 106 for activation, the current source 107 for switching and the current source 108 for refractive index control, which were described in the first embodiment, are electrically connected to the respective electrodes 92a to 92c.

The timings of supplying currents by use of these current sources 106 to 108 are the same as those in the first embodiment. The currents $I_{act}$, $I_{tune}$ and $I_{sw}$ may be supplied respectively to electrodes 92a to 92c either at the timings of FIG. 9 or at those of FIG. 11. Even if either of these timings is adopted, the active layer 54 in the switching region X including the electrode 92c for switching ceases to absorb the spontaneously emitted light generated in the active layer 54 and refractive index control layer 60 in the other areas, by supplying the current $I_{sw}$ for switching. Consequently, the laser oscillation occurs in the laser element 100, thus turning on the laser element 100. On the other hand, if the current $I_{sw}$ for switching is halted to be supplied, the active layer 54 in the switching region X starts to absorb the spontaneously emitted light generated in the active layer 54 in the other areas. Therefore, the above-mentioned laser oscillation is halted, and the laser element 100 is tuned off.

In this embodiment, the electrode 92c for switching is disposed at the output end 100b of the laser element 100 as described above. Hence, when the laser element 100 is in the "off" state, the spontaneously emitted light generated in the active layer 54 before the output end 100b is absorbed in the active layer 54 at the output end. As a result, compared with the first embodiment, it is made possible to effectively prevent spontaneously emitted light from leaking to the subsequent stage of the laser element 100. Consequently, crosstalk caused by leaked light from the laser element 100 in the "off" state can be prevented, thus making it possible to provide a high-quality optical semiconductor device, in which the risk of malfunction is reduced.

(5) Fifth Embodiment

In the above-described first to fourth embodiments, a TDA type laser element is formed as the laser element 100. On the contrary, in this embodiment, a tunable twin-guide (TTG) type element is formed as a laser element included in an optical semiconductor device.

Figure 15A:
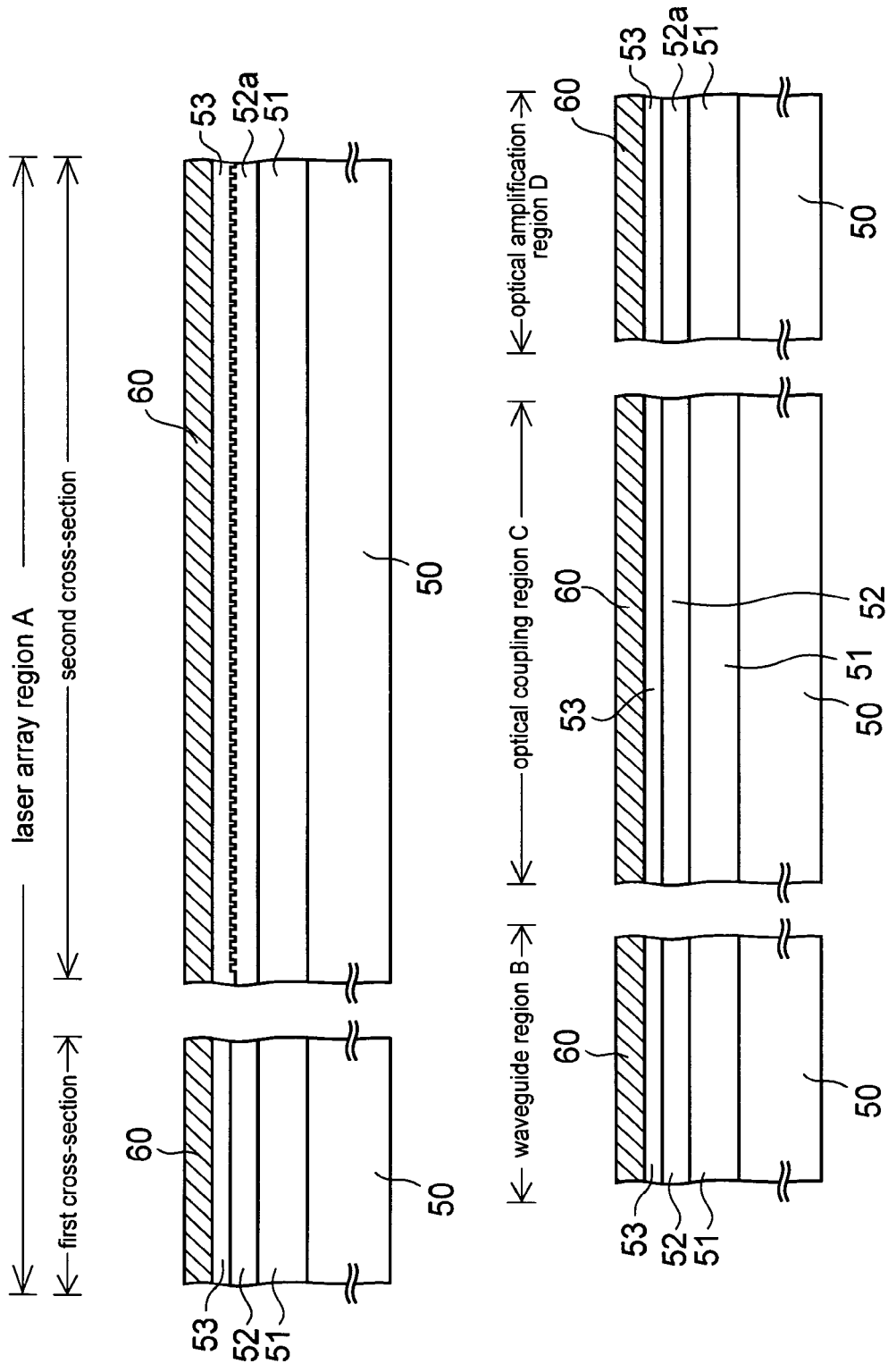
FIGS. 15A to 15O are cross-sectional views of an optical semiconductor device in course of manufacture according to a fifth embodiment of the present invention.

FIGS. 15A to 15O are cross-sectional views of an optical semiconductor device in course of manufacture according to the embodiment, and FIGS. 16A to 16D are plan views thereof. In these drawings, the components which were described in the first to fourth embodiments are allocated with the same reference numerals as those in the relevant embodiments, and the descriptions thereof will be omitted hereinafter.

Firstly, a description will be given of a process to obtaining a cross-sectional structure shown in FIG. 15A.

To begin with, by performing the processes of FIGS. 5A and 5B, which were described in the first embodiment, as shown in FIG. 15A, the buffer layer 51 made of p-type InP with a thickness of approximately 1 µm and the semiconductor layer 52 made of p-type InGaAsP with a thickness of approximately 0.07 µm are sequentially formed on the InP substrate 50. As described in the first embodiment, the semiconductor layer 52 has a composition wavelength of approximately 1.2 µm, and becomes the diffraction grating 52a with a pitch length of approximately 240 nm in the laser array region A.

Thereafter, a p-type InP layer is formed by MOCVD on the semiconductor layer 52 as the spacer layer 53, then the projections and depressions on the surface of the diffraction grating 52a is completely buried in the spacer layer 53. The thickness of the spacer layer 53 is approximately 0.1 µm on the semiconductor layer 52.

Next, on the spacer layer 53, the refractive index control layer 60 is formed by MOCVD. The refractive index control layer 60 is an InGaAsP layer, for example, with a composition wavelength of 1.3 µm and with a thickness of 200 nm.

Figure 16A:
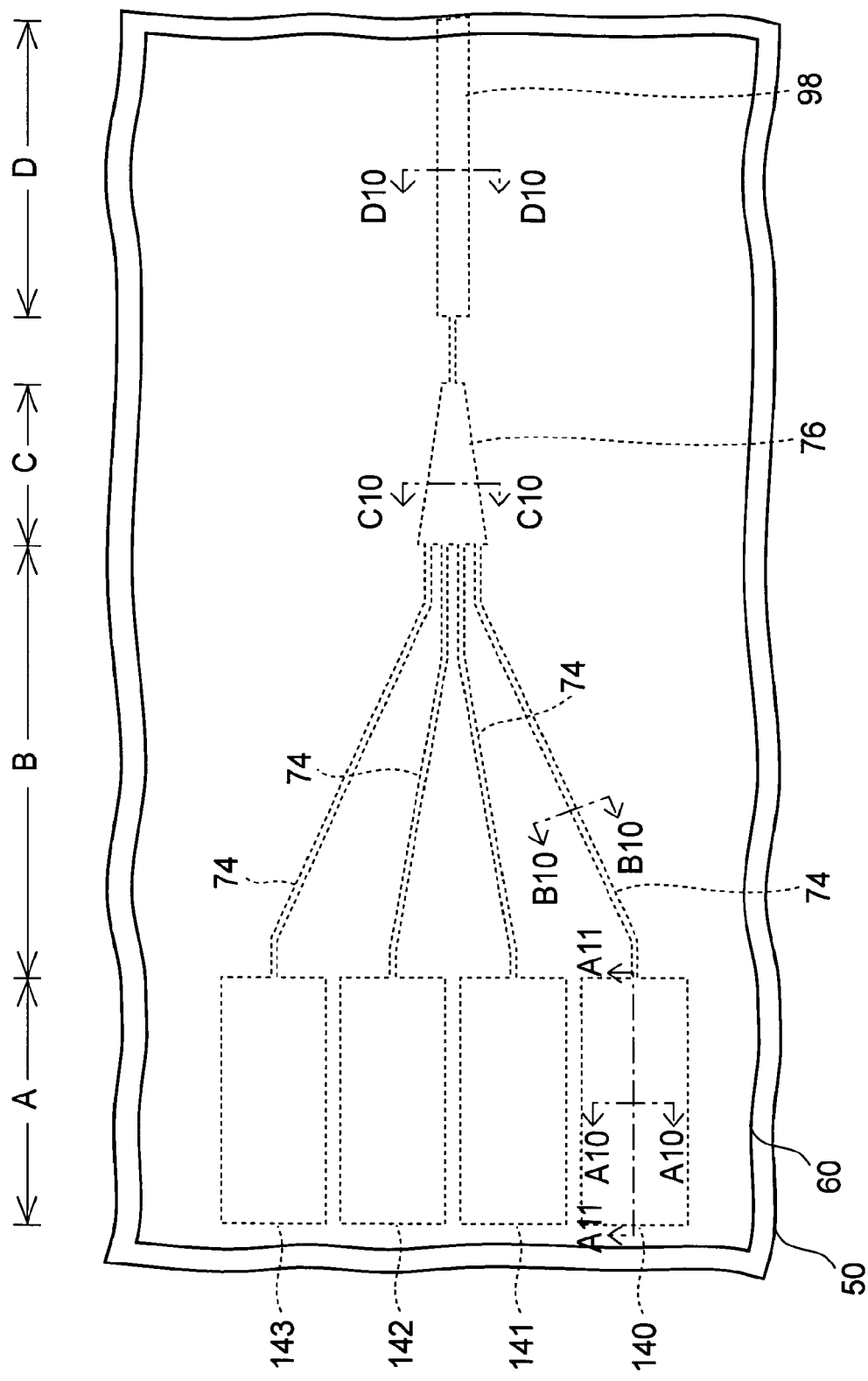
FIGS. 16A to 16D are plan views of the optical semiconductor device in course of manufacture according to the fifth embodiment of the present invention.

FIG. 16A is a plan view of after this process is completed.

As shown in FIG. 16A, on the InP substrate 50, four laser elements 140 to 143 are eventually formed in the laser array region A, while the optical waveguide 74, the optical coupler 76 and the optical amplifier 98 are formed respectively in the regions B to D which are subsequent stages of the laser array region A.

Then, in the above-mentioned FIG. 15A, a first cross-section of the laser array region A corresponds to a cross-section taken along the A10-A10 line in FIG. 16A, and a second cross-section corresponds to a cross-section taken along the A11-A11 line in FIG. 16A. In addition, the cross-sections of the waveguide region B, the optical coupling region C and the optical amplification region D in FIG. 15A correspond to cross-sectional views taken along the B10-B10 line, the C10-C10 line and the D10-D10 line in FIG. 16A, respectively.

Figure 15B:
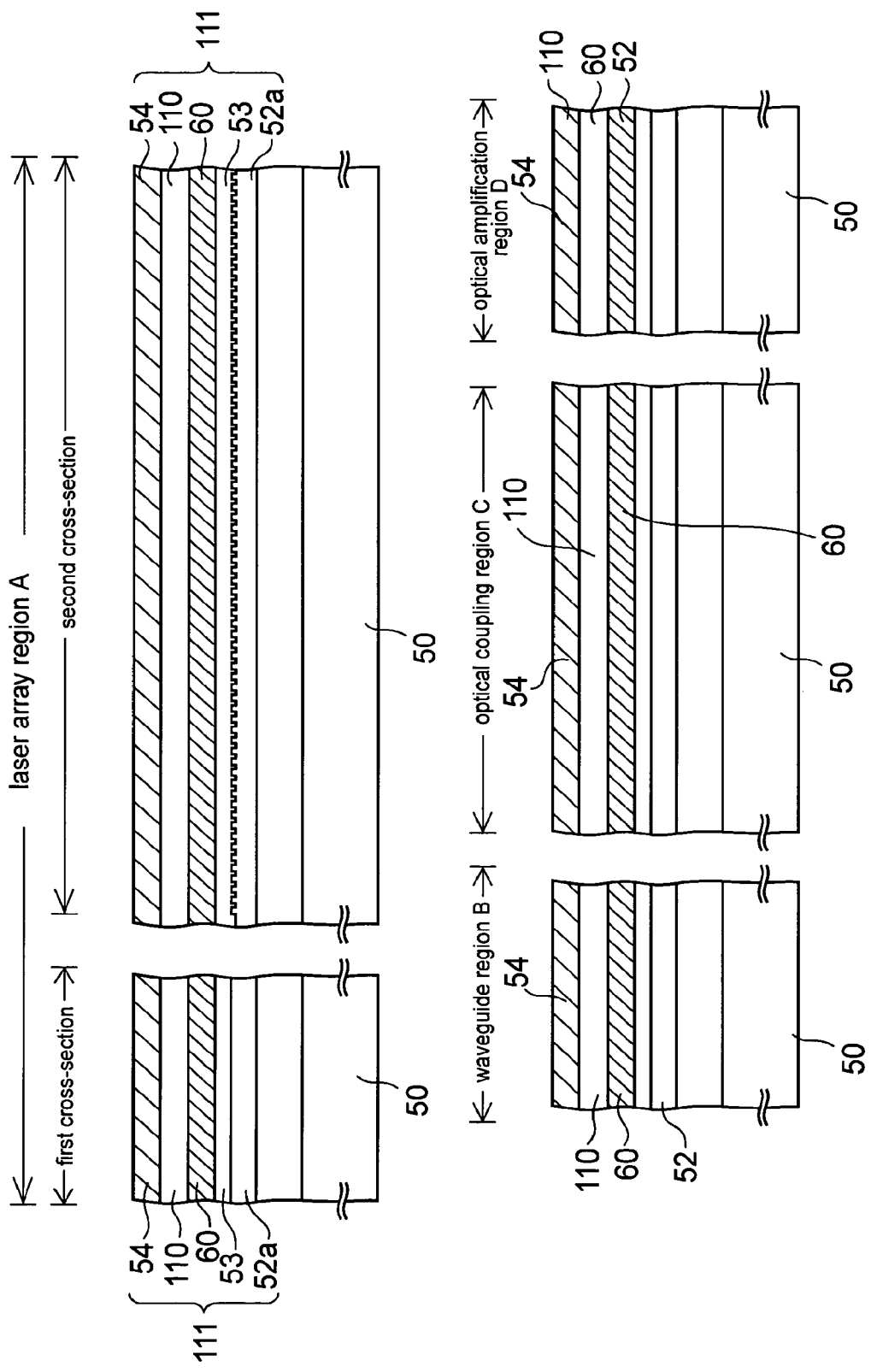

Following this, as shown in FIG. 15B, an n-type InP layer doped with S as n-type impurities is formed by MOCVD to a thickness of approximately 0.2 µm on the refractive index control layer 60, and set the n-type InP layer to be an interlayer 110.

Moreover, using MOCVD, the active layer 54 with a SCH-MQW structure is formed on the interlayer 110 by stacking a lower SCH layer, a quaternary distortion MQW layer and an upper SCH layer in this order. The lower and upper SCH layers constituting the active layer 54 are formed of an InGaAsP layer, for example, with a composition wavelength of approximately 1.15 µm and with a thickness of approximately 20 nm. Moreover, the quaternary distortion MQW layer is formed by stacking well layers and InGaAs layers one after the other till building ten layers, the well layer being an InGaAsP layer with a composition wavelength of approximately 1.58 µm and with a thickness of approximately 5 nm and the InGaAsP layer having a composition wavelength of approximately 1.3 µm and a thickness of approximately 10 nm.

Thus, a structure 111, including the diffraction grating 52a, the active layer 54 emitting light by current injection and the refractive index control layer 60 changing a refractive index by current injection, are formed on one surface of the InP substrate 50.

Figure 15C:
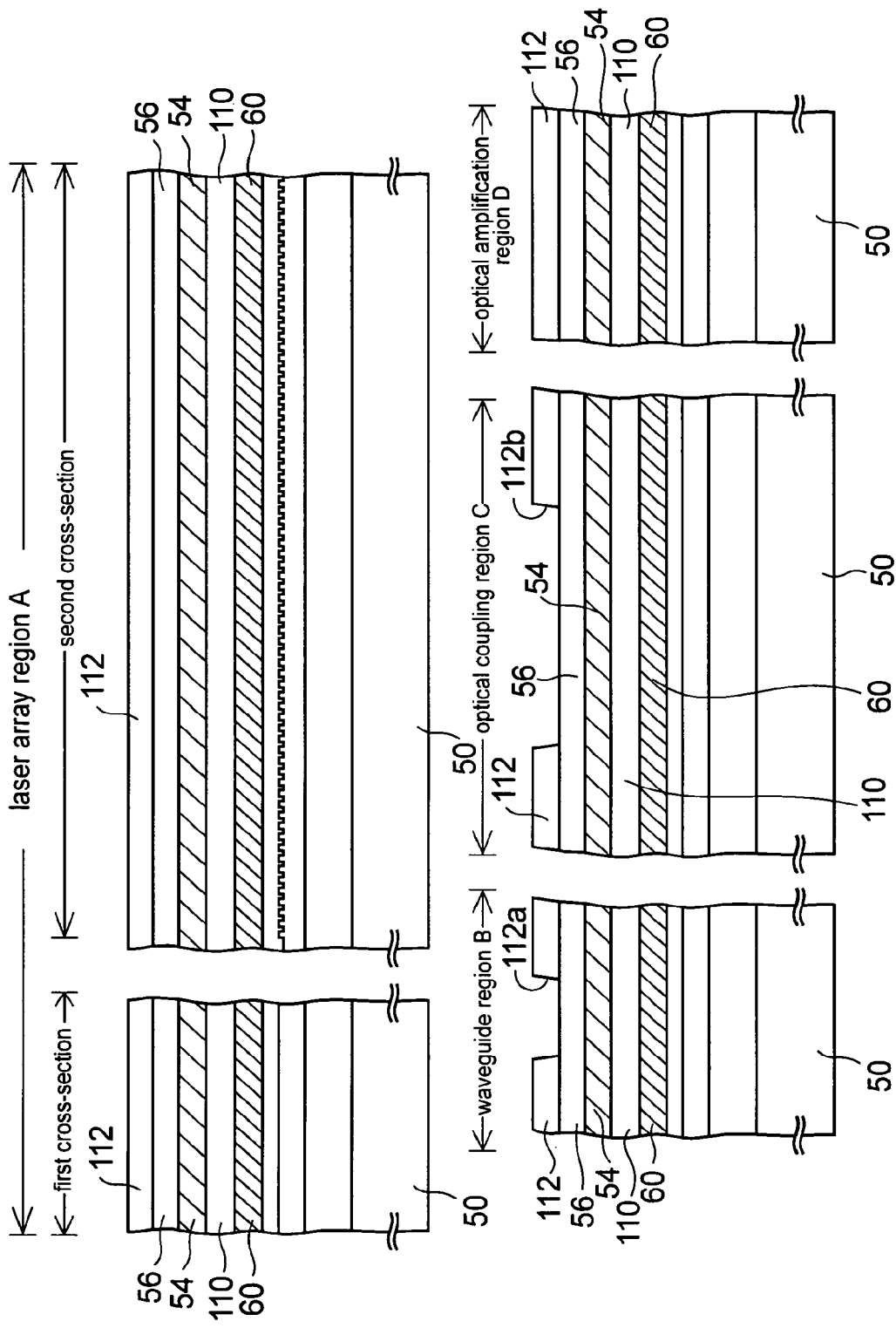

Next, as shown in FIG. 15C, the p-type InP layer is formed to a thickness of approximately 0.2 µm on the active layer 54 as the cladding layer 56. The cladding layer 56 is formed by MOCVD and is doped with, for example, Zn as p-type impurities.

Thereafter, the $SiO_2$ layer is formed by sputtering all over the surface. The $SiO_2$ layer is patterned by EB photolithography or optical photolithography to be set as a first mask layer 112.

As a result of the above-mentioned lithography, a first window 112a is formed on a portion which is to be a waveguide in the waveguide region B later, and a second window 112b is also formed in the optical coupling region C.

Figure 16B:
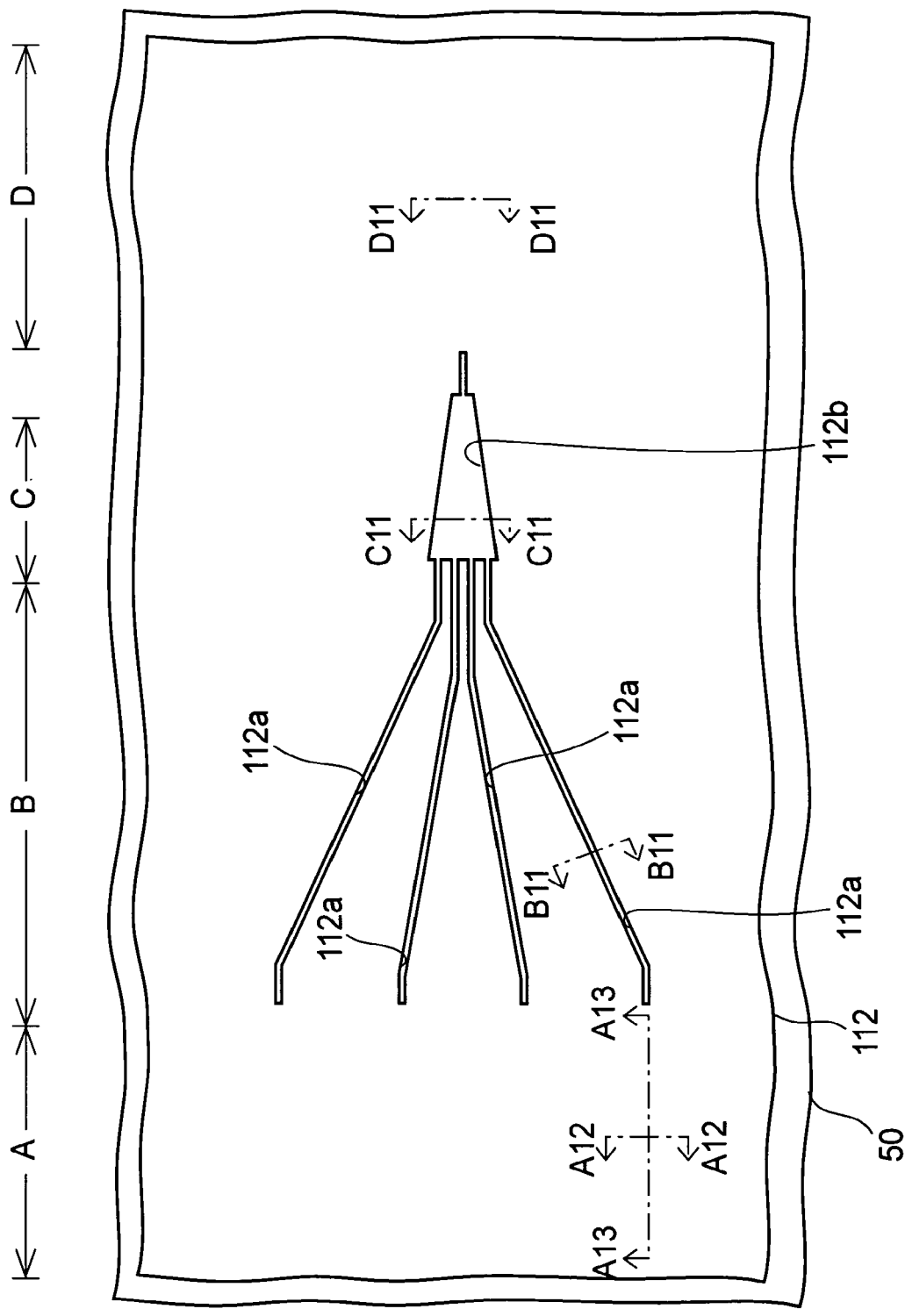

FIG. 16B is a plan view of after this process is completed. Incidentally, a first cross-section of the laser array region A in the above-mentioned FIG. 15C corresponds to a cross-sectional view taken along the A12-A12 line in FIG. 16B, and a second cross-section corresponds to a cross-sectional view taken along the A13-A13 line in FIG. 16B. In addition, the cross-sectional views of the regions B to D in FIG. 15C correspond to cross-sectional views taken along the B11-B11 line, the C11-C11 line and the D11-D11 line in FIG. 16B, respectively.

Figure 15D:
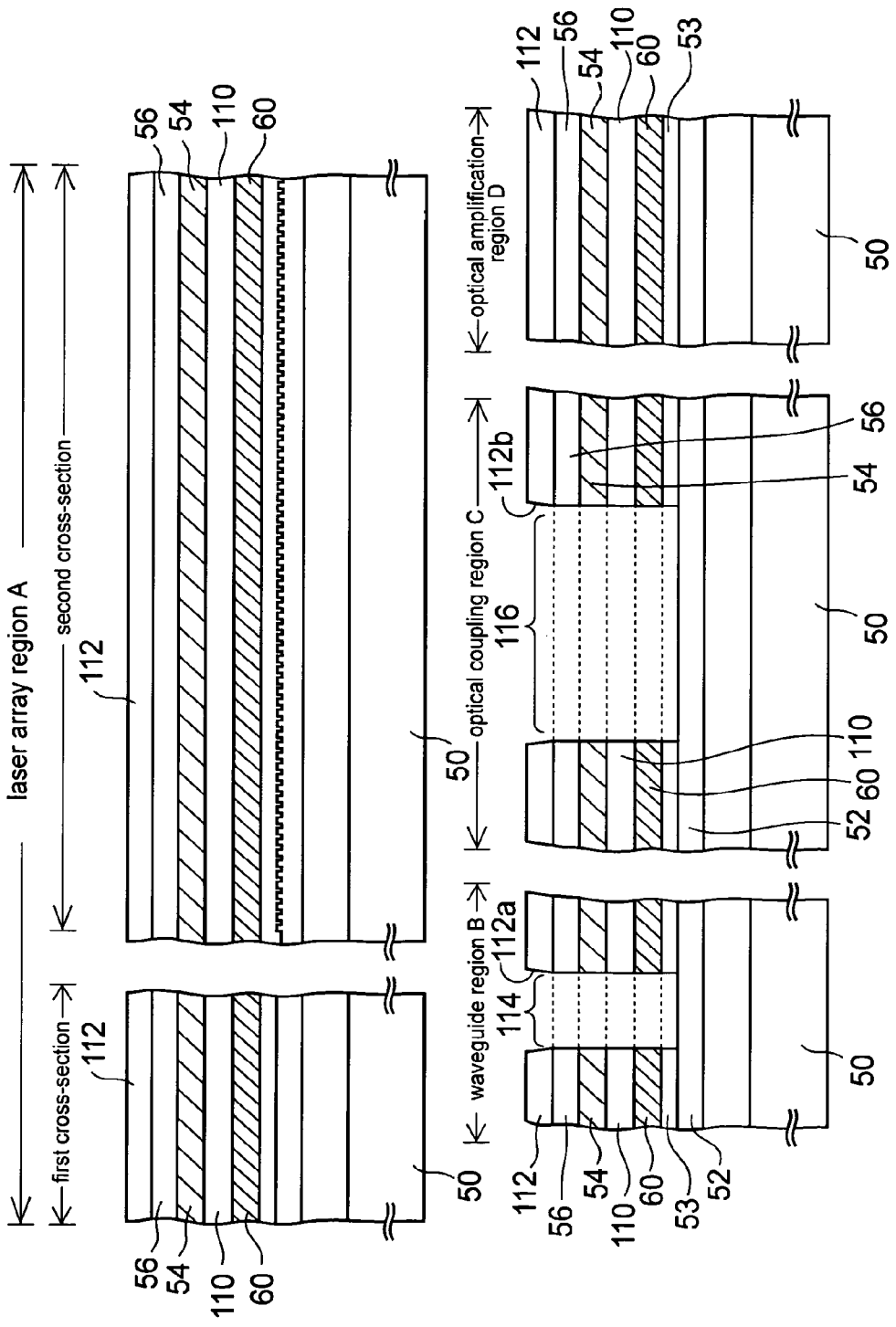

Subsequently, as shown in FIG. 15D, the layers from the cladding layer 56 to the spacer layer 53 are etched by RIE through the above-mentioned first and second windows 112a and 112b, thus forming first and second apertures 114 and 116.

Figure 15E:
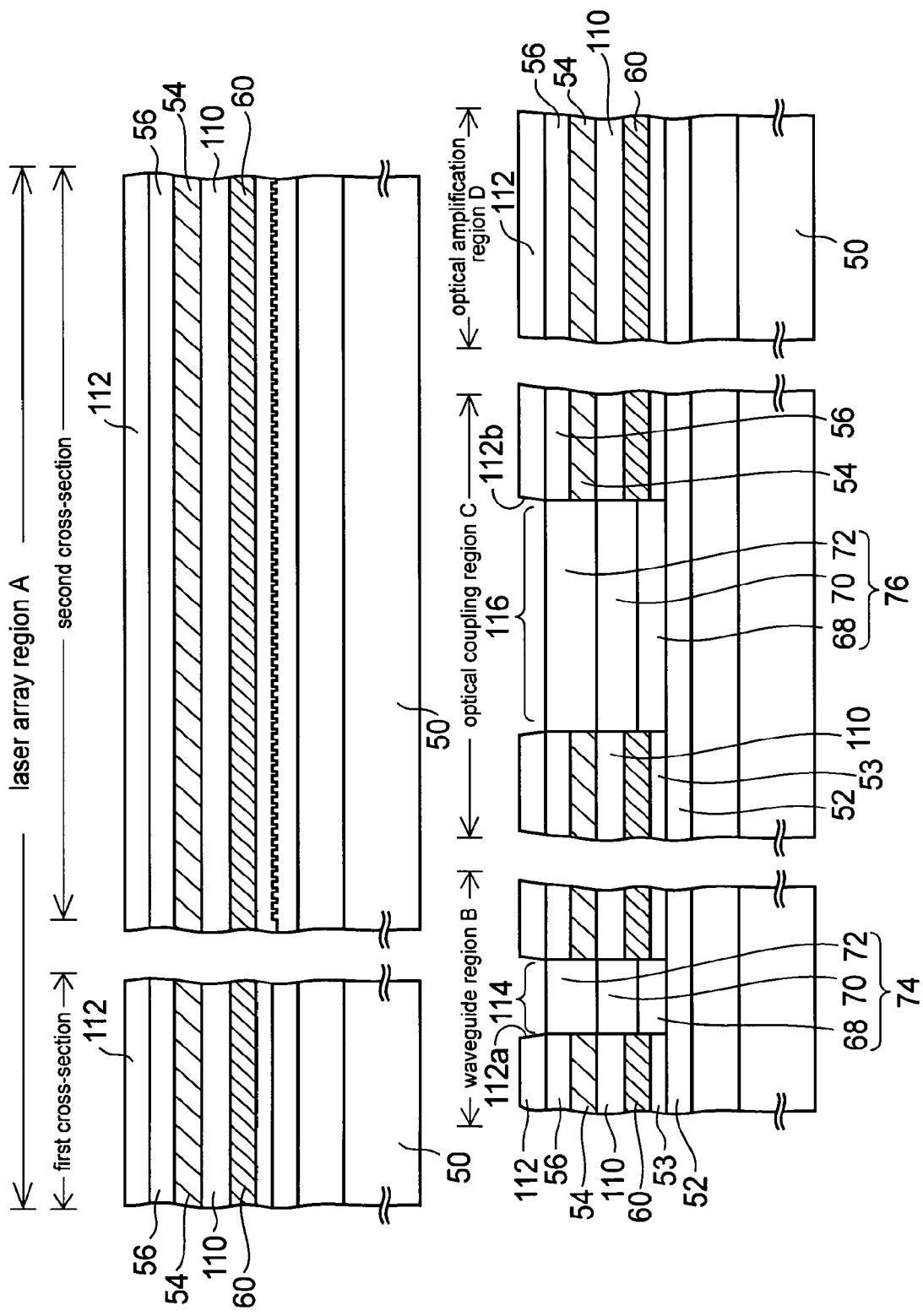

Next, as shown in FIG. 15E, an InP layer is formed by MOCVD to a thickness of approximately 0.1 µm as the lower cladding layer 68 on the semiconductor layer 52 which exposes in the first and second apertures 114 and 116. In addition, after forming an InGaAsP layer with a composition wavelength of approximately 1.2 to 1.3 µm is formed by MOCVD to a thickness of approximately 0.15 µm on the lower cladding layer 68 and is set to be the core layer 70, an InP layer with a thickness of approximately 0.2 µm is formed by MOCVD on the core layer 70 as the upper cladding layer 72.

With MOCVD described above, the InP layer and the InGaAsP layer do not grow on the first mask layer 112 made of $SiO_2$, but these layers selectively grow only in the first and second apertures 114 and 116.

Moreover, the lower cladding layer 68, the core layer 70 and the upper cladding layer 72, which have been formed as described above, constitutes the waveguide 74 in the first aperture 114 in the waveguide region B, as well as constituting the optical coupler 76 in the second aperture 116 in the optical coupling region C.

Figure 15F:
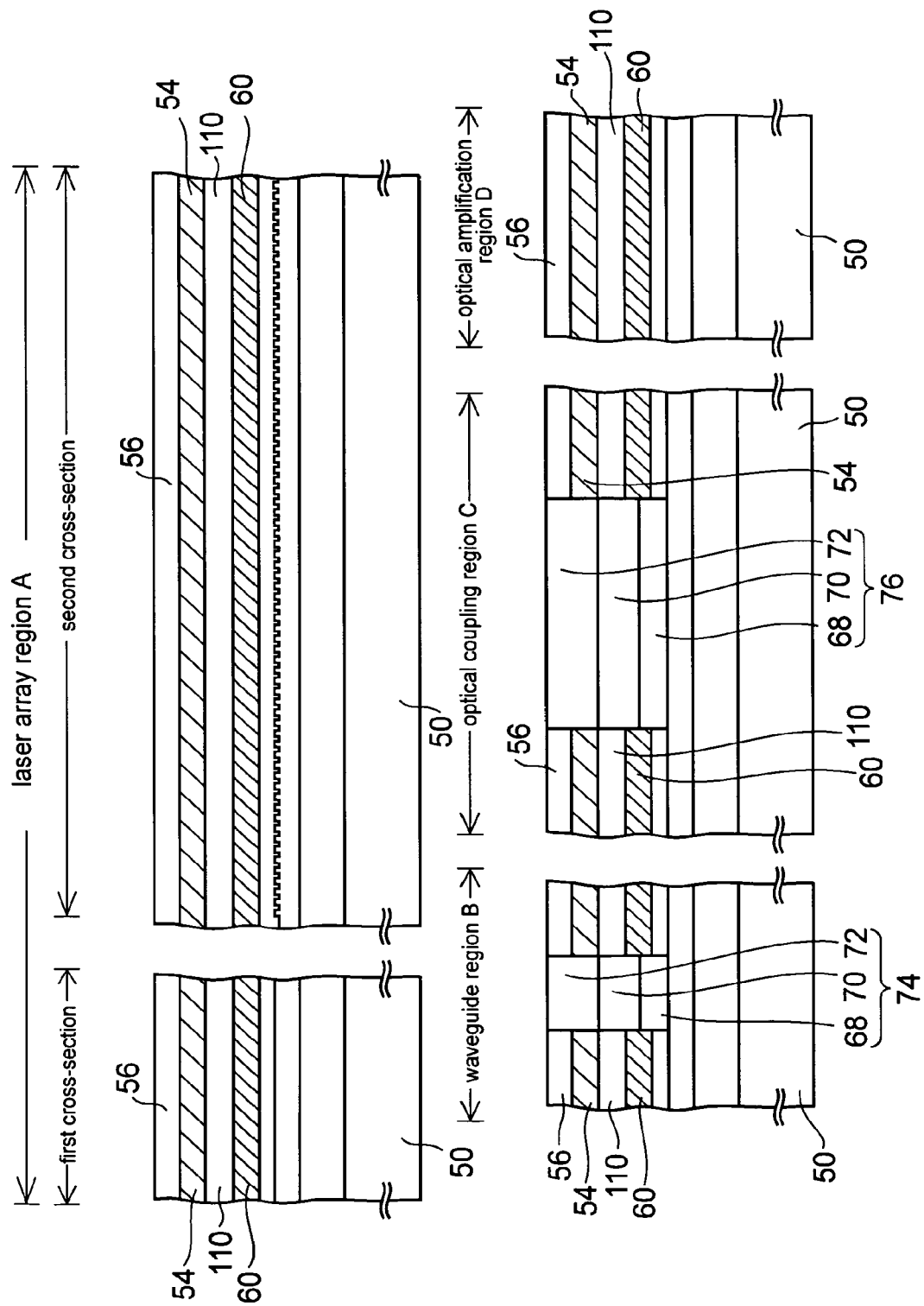

Thereafter, as shown in FIG. 15F, the first mask layer 112 made of $SiO_2$ is removed by wet etching using the buffer hydrofluoric acid solution as etchant.

Figure 15G:
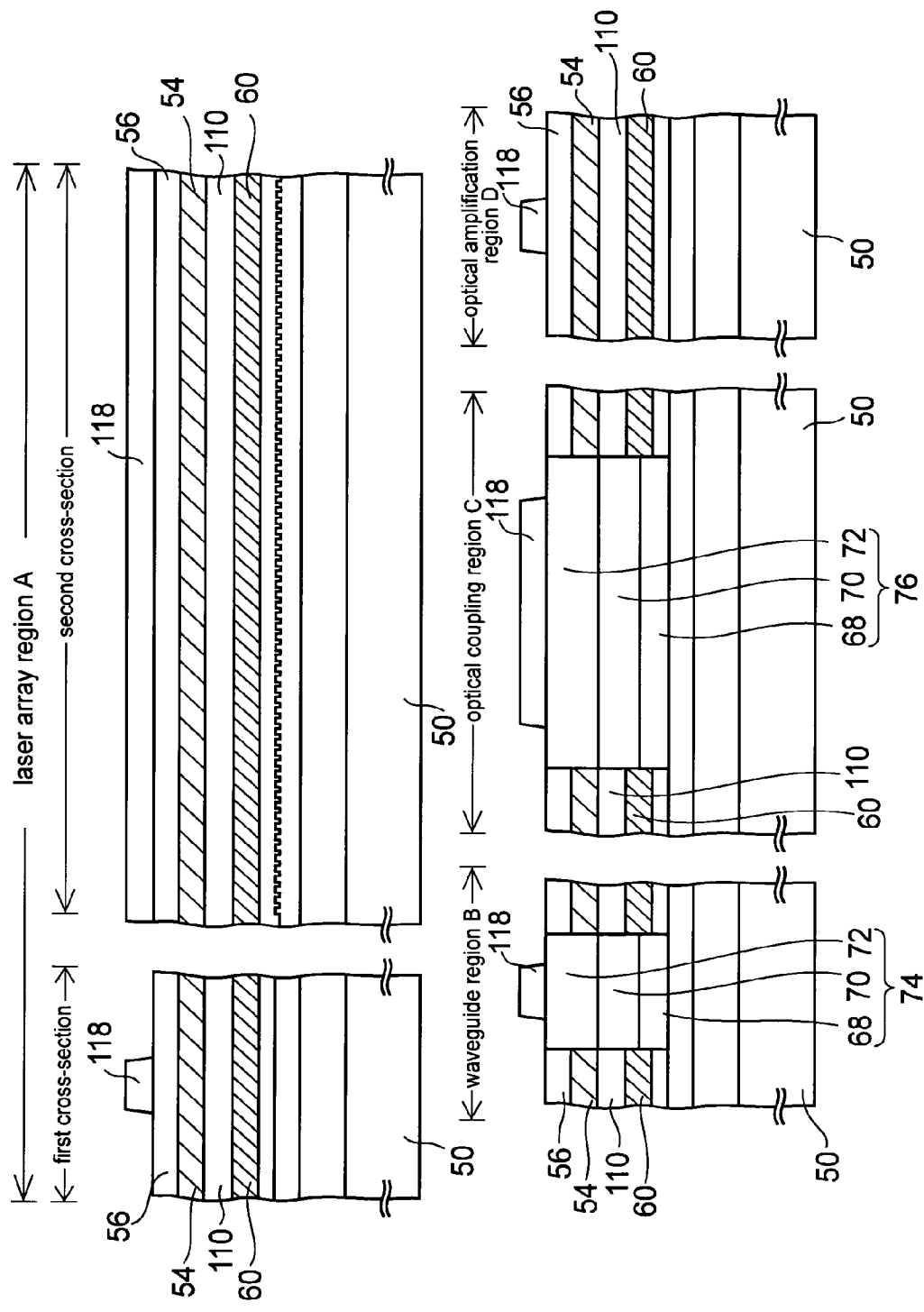

Next, as shown in FIG. 15G, a $SiO_2$ layer is formed by sputtering or the like to a thickness of approximately 300 µm all over the surface. Furthermore, the $SiO_2$ layer is patterned using EB lithography or the like to be set as a second mask layer 118. The second mask layer 118 has a striped flat shape in the laser array region A, the waveguide region B and the optical amplification region D. The width of the second mask layer 118 is, for example, approximately 1.5 µm in the laser array region A, the waveguide region B and the optical amplification region D.

Figure 15H:
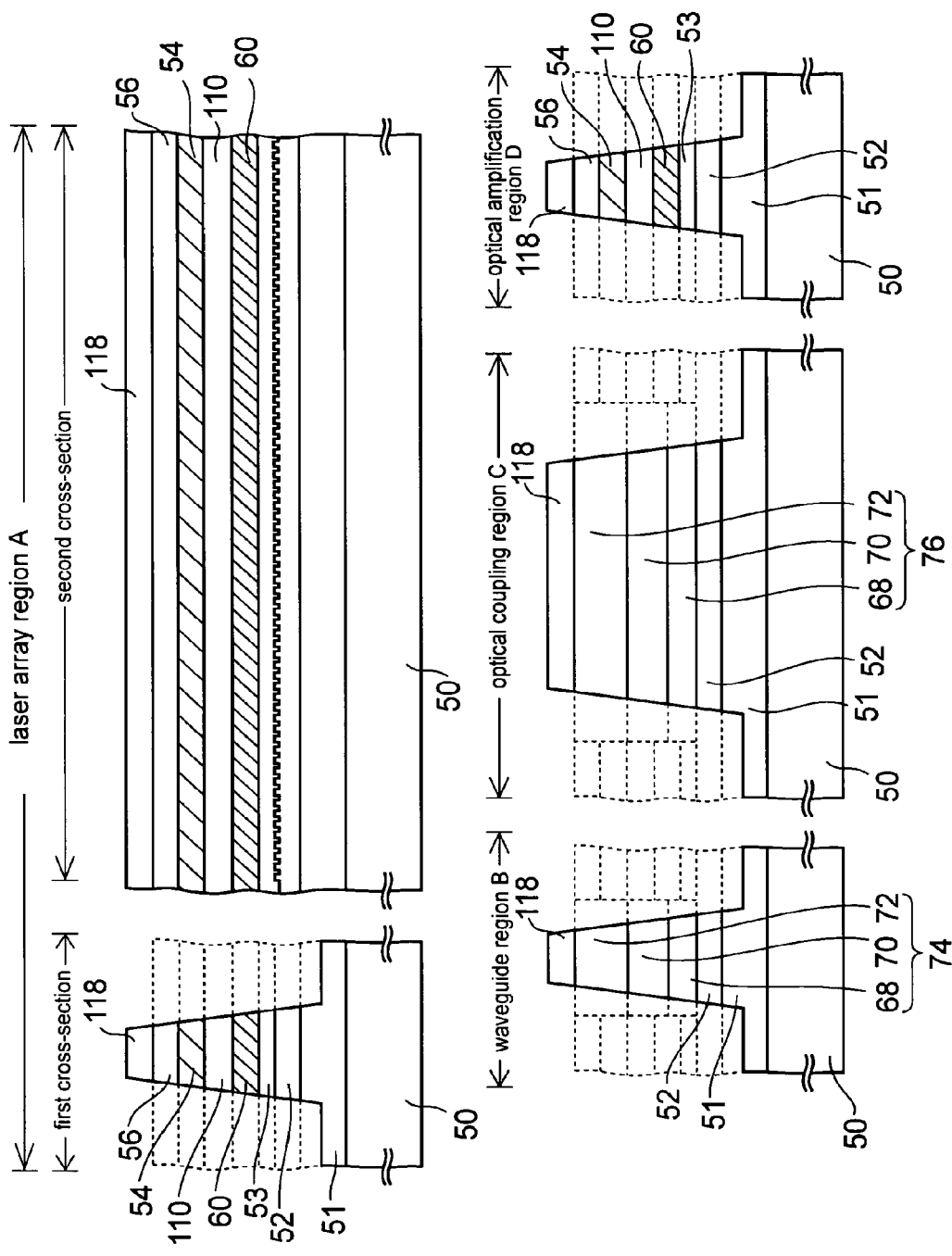

Subsequently, as shown in FIG. 15H, the layers from the cladding layer 56 to the mid-depth of the buffer layer 51 in the laser array region A and the optical amplification region D are etched by RIE in which the second mask layer 118 is used as an etching mask. Then, a layered product of these layers is made to be a mesa stripe with a height of approximately 1.5 µm. Furthermore, in this etching process, the layers from the upper cladding layer 72 to the mid-depth of the buffer layer 51 are etched in the waveguide region B and the optical coupling region C, thus making the layered products of these layers are set to be mesa stripes.

Figure 16C:
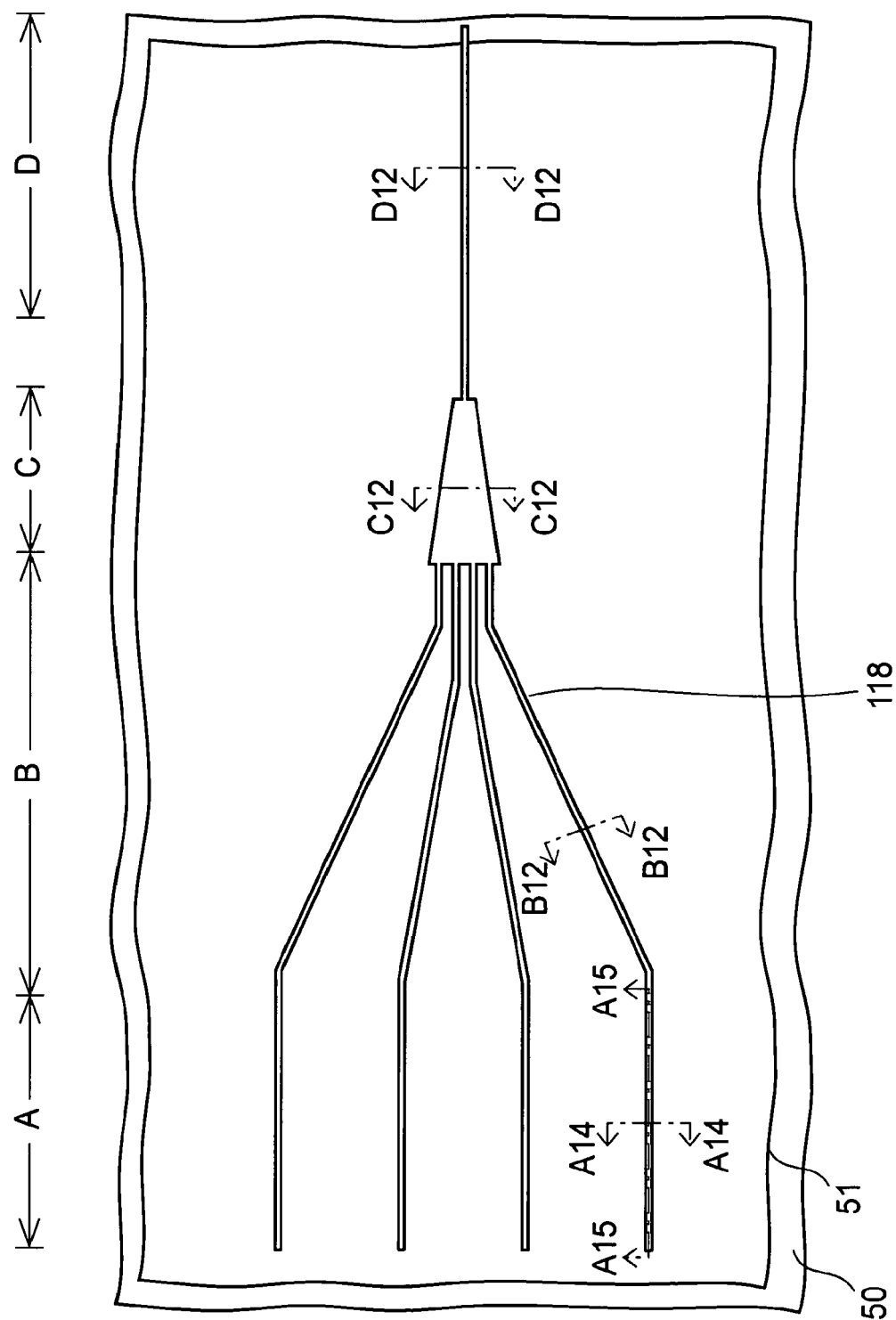

FIG. 16C is a plan view of after this process is completed. Incidentally, a first cross-section of the laser array region A in the above-mentioned FIG. 15H corresponds to a cross-sectional view taken along the A14-A14 line in FIG. 16C, and a second cross-section corresponds to a cross-sectional view taken along the A15-A15 line in FIG. 16C. In addition, the cross-sectional views of the regions. B to D in FIG. 15H correspond to cross-sectional views taken along the B12-B12 line, the C12-C12 line and the D12-D12 line in FIG. 16C, respectively.

Next, a description will be given of a process to obtaining a cross-sectional shape shown in FIG. 15I.

Firstly, a first n-type InP layer 122 and a first p-type InP layer 124, both of which being approximately 0.5 µm thick, are formed by MOCVD on both sides of the mesa stripe in each region. Moreover, with this MOCVD, a second n-type InP layer 126, which comes in contact with the interlayer 110, is formed to a thickness of approximately 1.0 µm on the first p-type InP layer 124. By further letting the growth continue using MOCVD, a second p-type InP layer 128 and a third n-type InP layer 130, both of which being approximately 0.4 µm thick, are formed on the second n-type InP layer 126.

The InP layers of five layers formed in this manner constitute a burying layer 120 next to the mesa stripes. In addition, although impurities to be doped in these InP layers are not particularly limited, S is adopted as n-type impurities, and Zn as p-type impurities, for example.

Note that the InP layers selectively grow only on the sides of the mesas and the upper surface of the buffer layer 51 in the MOCVD process for forming the burying layer 120, but these layers do not grow on the second mask layer 118 made of $SiO_2$.

Subsequently, the second mask layer 118 is removed by wet etching with buffer hydrofluoric acid solution.

Figure 15J:
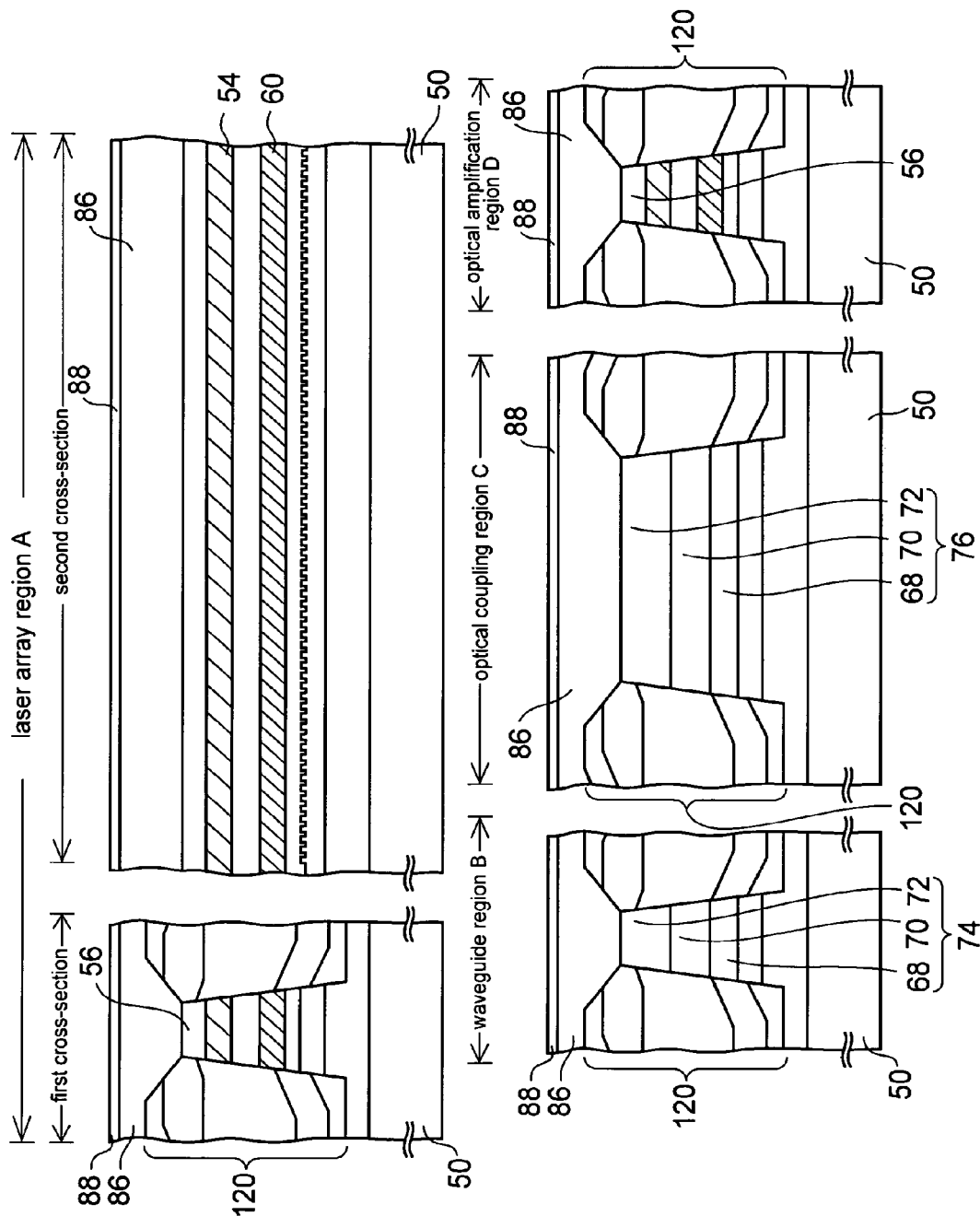

Following this, as shown in FIG. 15J, a p-type InP layer, which has been doped with Zn as p-type impurities, is formed by MOCVD to a thickness of approximately 2.5 µm on the burying layer 120 and mesas. The p-type InP layer is set to be the upper side layer 86 of the cladding layer.

Then, a p-type InGaAs layer is formed by MOCVD to a thickness of approximately 0.1 µm on the upper side layer 86 of the cladding layer as the contact layer 88. There is, for example, Zn as p-type impurities to be doped in the contact layer 88.

Figure 15K:
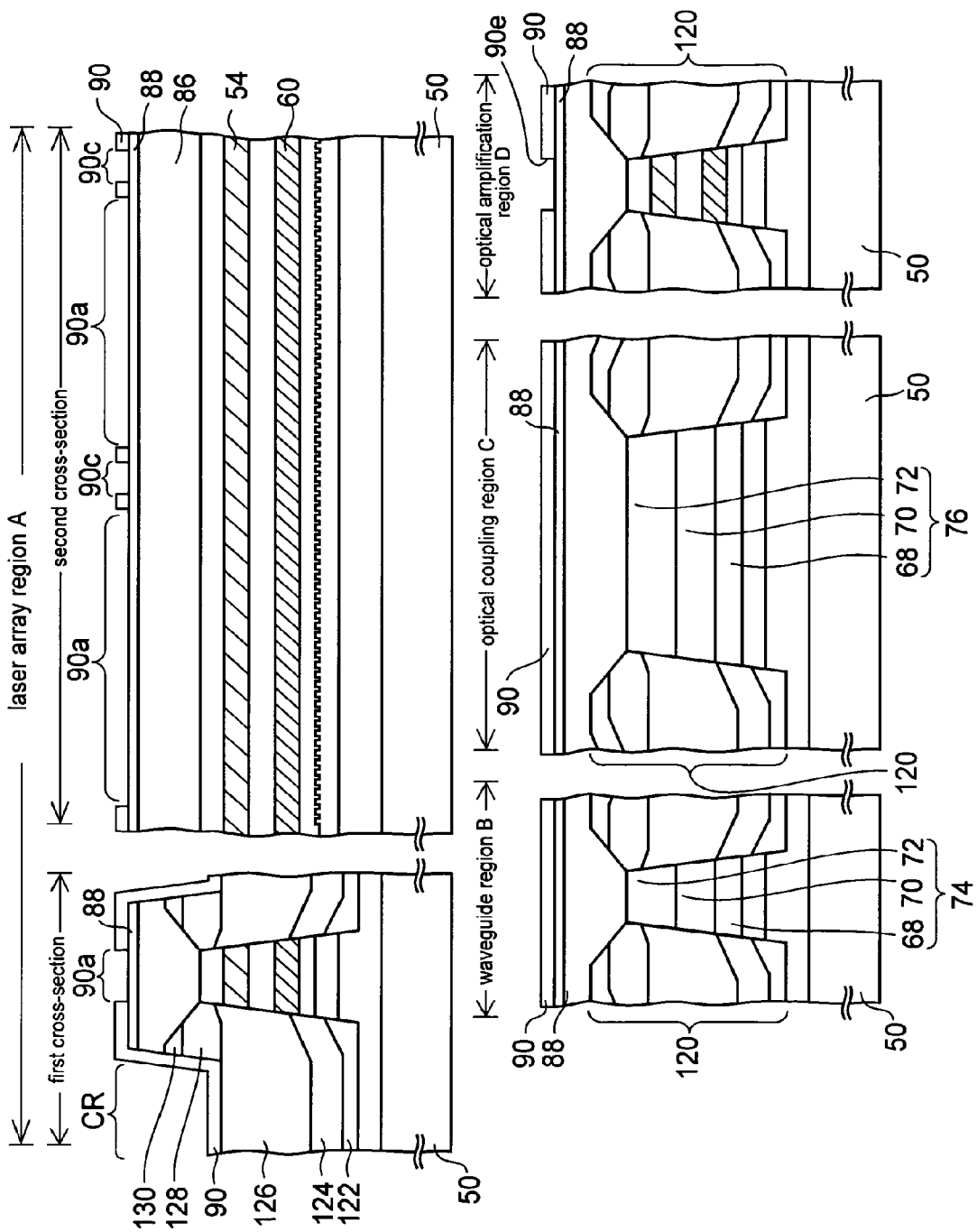

Next, a description will be given of a process to obtaining a cross-sectional shape shown in FIG. 15K.

Firstly, by RIE (or wet etching) using an unillustrated resist pattern as a mask, a portion, which is to be a contact region CR on a side of the mesa stripe in the laser array region A, is etched, thus exposing the upper surface of the second n-type InP layer 126 contacting with the interlayer 110.

Subsequently, a $SiO_2$ layer is formed to a thickness of approximately 0.5 pin by sputtering all over the surface as the protective layer 90. Then, the protective layer 90 is patterned by EB lithography or photolithography, thus forming the electrode window 90a for the active layer and the electrode window 90c for switching above the active layer 54 in the laser array region A. Furthermore, by the patterning, a window 90e for amplifier electrode is formed in the protective layer 90 in the optical amplification region D.

Figure 15L:
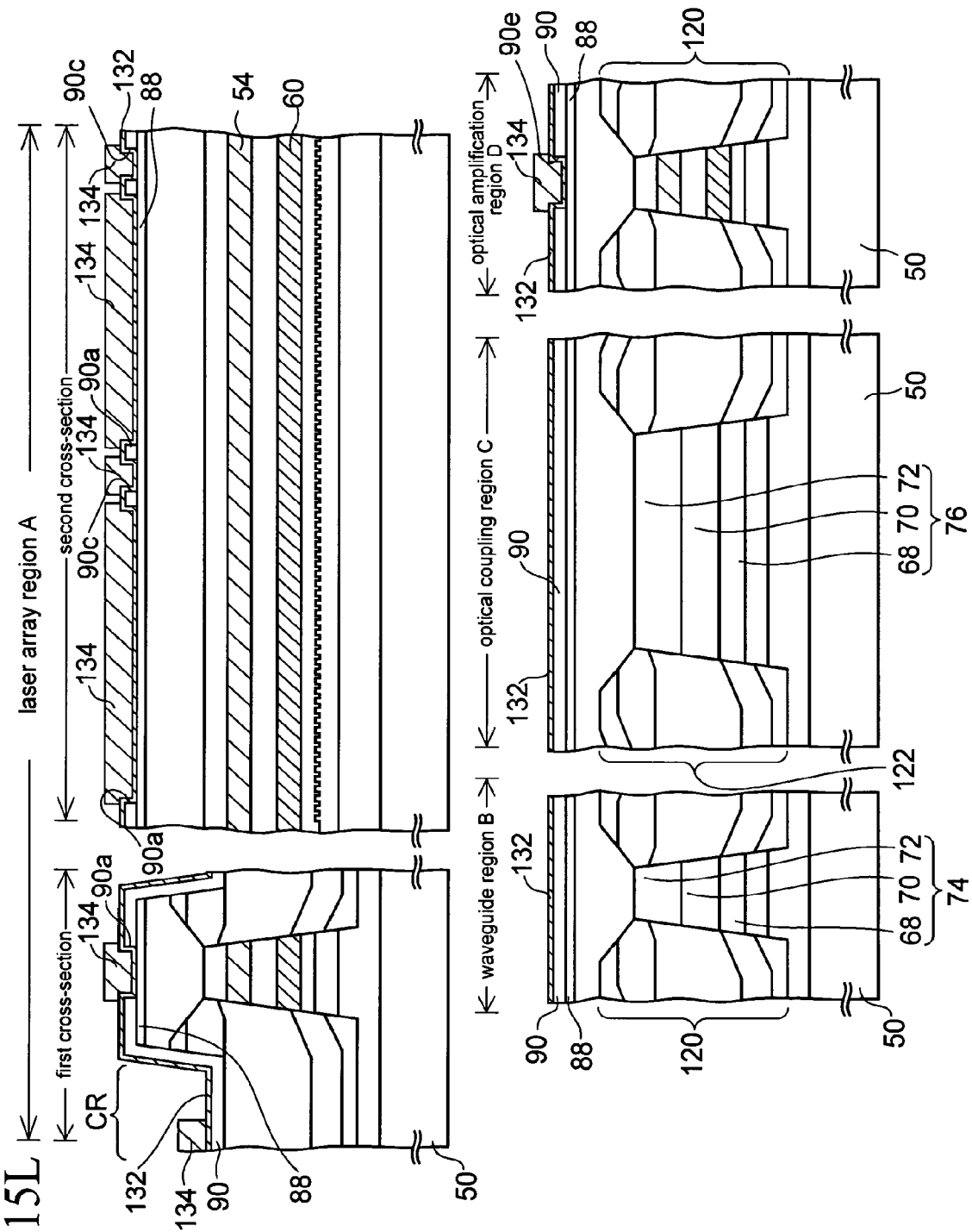

Following this, as shown in FIG. 15L, Ti and Pt layers are formed by the evaporation method in this order in the above-mentioned windows 90a, 90c and 90e and on the protective layer 90. These metal deposition films are set to be a cohesive layer 132. The thickness of the Ti layer constituting the cohesive layer 132 is, for example, 0.2 µm, and the thickness of the Pt layer is approximately 0.25 µm.

Thereafter, an unillustrated plating resist is formed on the cohesive layer 132. Then, while using the cohesive layer 132 as a power supply layer for plating, an Au layer 134 is formed by electrolytic plating to a thickness of approximately 3.0 µm on each of the above-mentioned plating resist and cohesive layer 132. Then, this plating resist is exfoliated, thus patterning the Au layer 134. As a result, the Au layer 134 remains only in the contact region CR on the side of the mesa in the laser array region A and on each of the above-mentioned windows 90a, 90c and 90e.

Figure 15M:
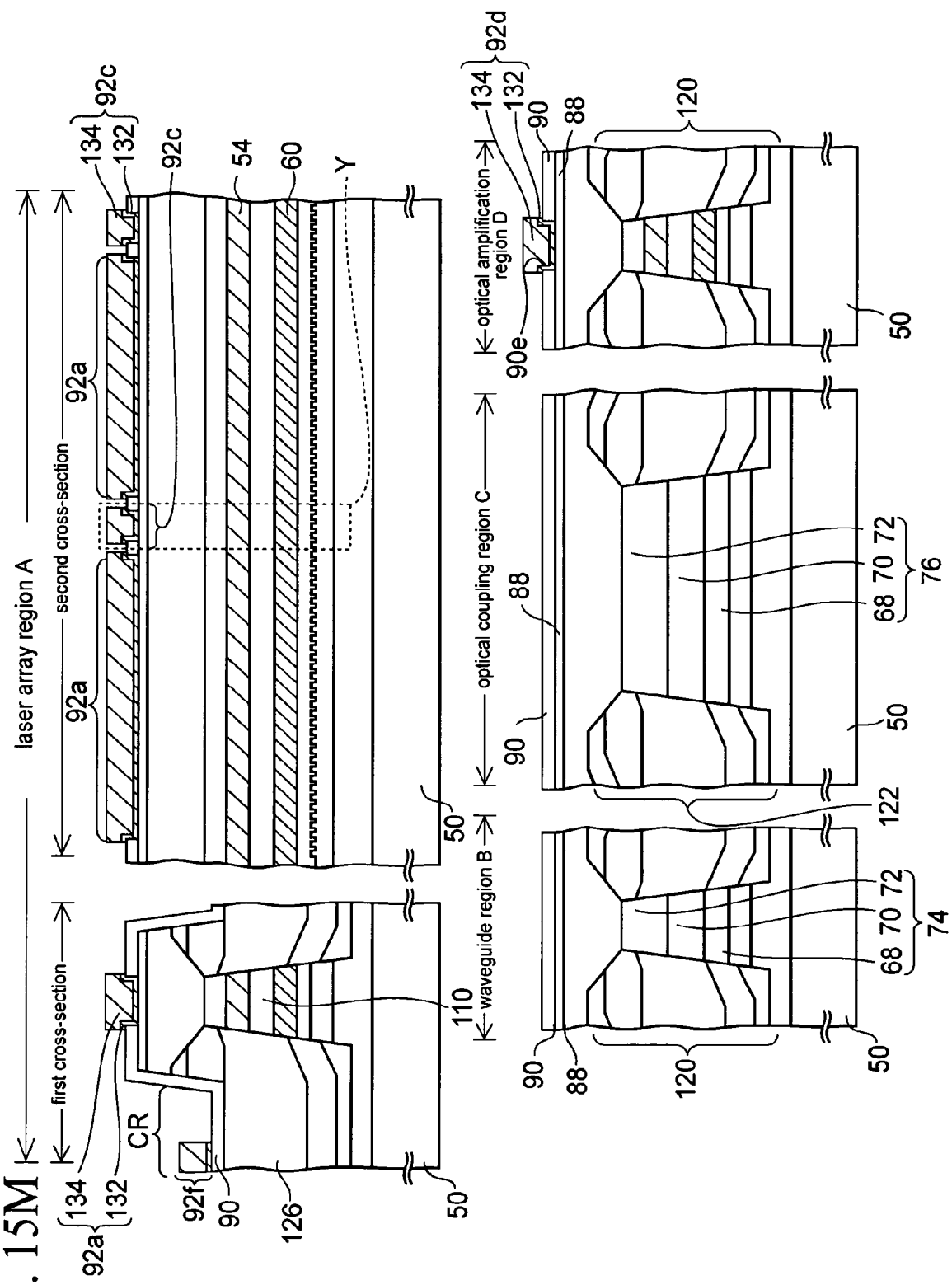

Next, as shown in FIG. 15M, the remaining Au layer 134 is used as an etching mask, thus removing the cohesive layer 132 in a portion which is not covered with the Au layer 134, by etching. The remaining cohesive layer 132 and Au layer 134, which remain since etching is not performed on the layers, are set to be the electrodes 92a for the active layer and the electrode 92c for switching respectively on the windows 90a and 90c in the laser array region A.

Out of these electrodes, the electrode 92a for the active layer functions to selectively inject a current into the active layer 54 therebelow. On the other hand, the electrode 92c for switching functions to selectively inject a current into the active layer 54 in a switching region Y of FIG. 15M, independently of the electrode 92c for the active layer. The above-mentioned region Y is called the switching region Y, too, hereinafter.

Afterwards, in the contact region CR in the laser array region A, the metal deposition films of the cohesive layer 132 and the Au layer 134 are set to be an electrode 92f for the interlayer for providing a potential to the interlayer 110 through the second n-type InP layer 126.

On the other hand, on the window 90e for amplifier electrode in the optical amplification region D, the above-mentioned metal deposition films are left as the electrode 92d for amplification.

Figure 15N:
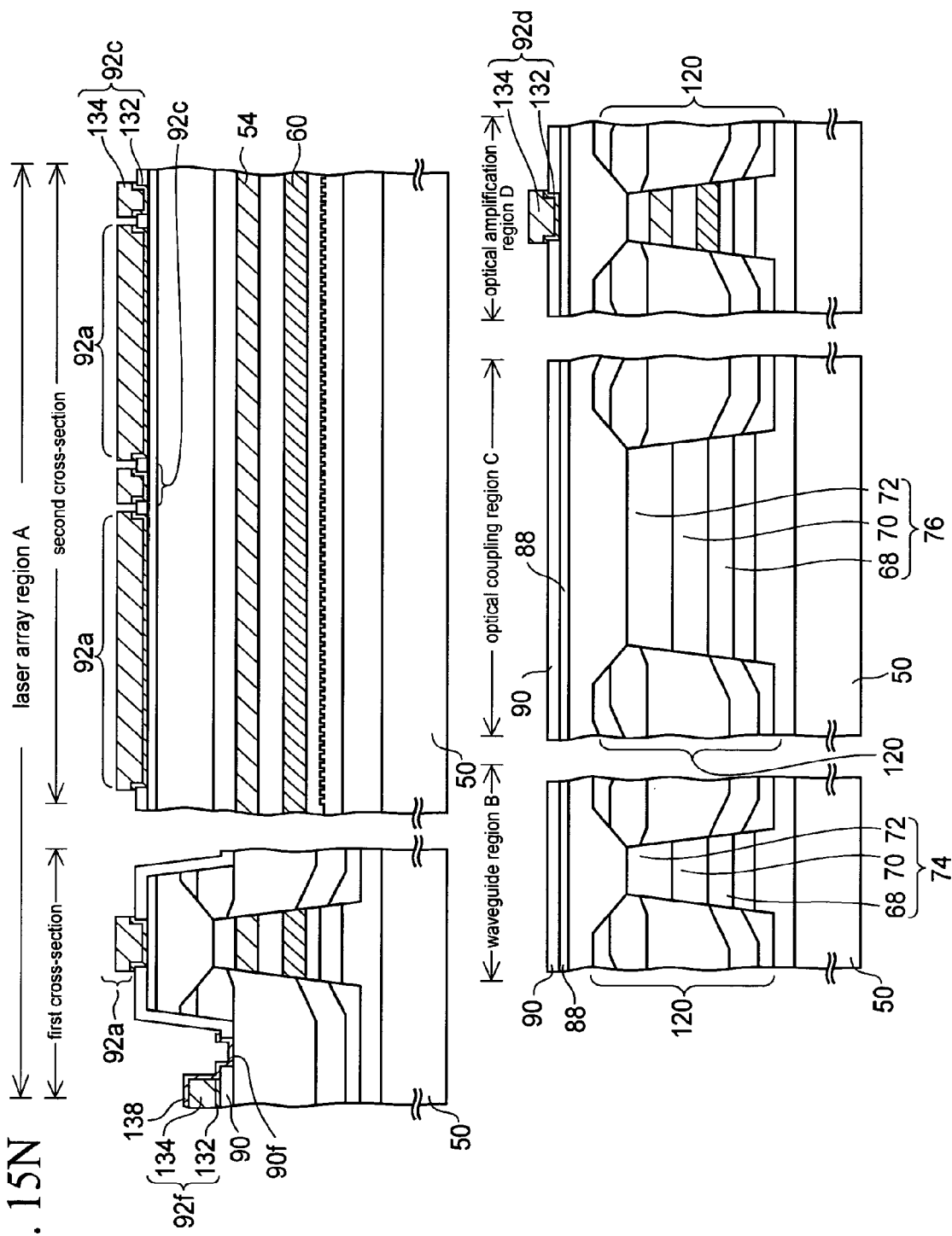
Figure 150:
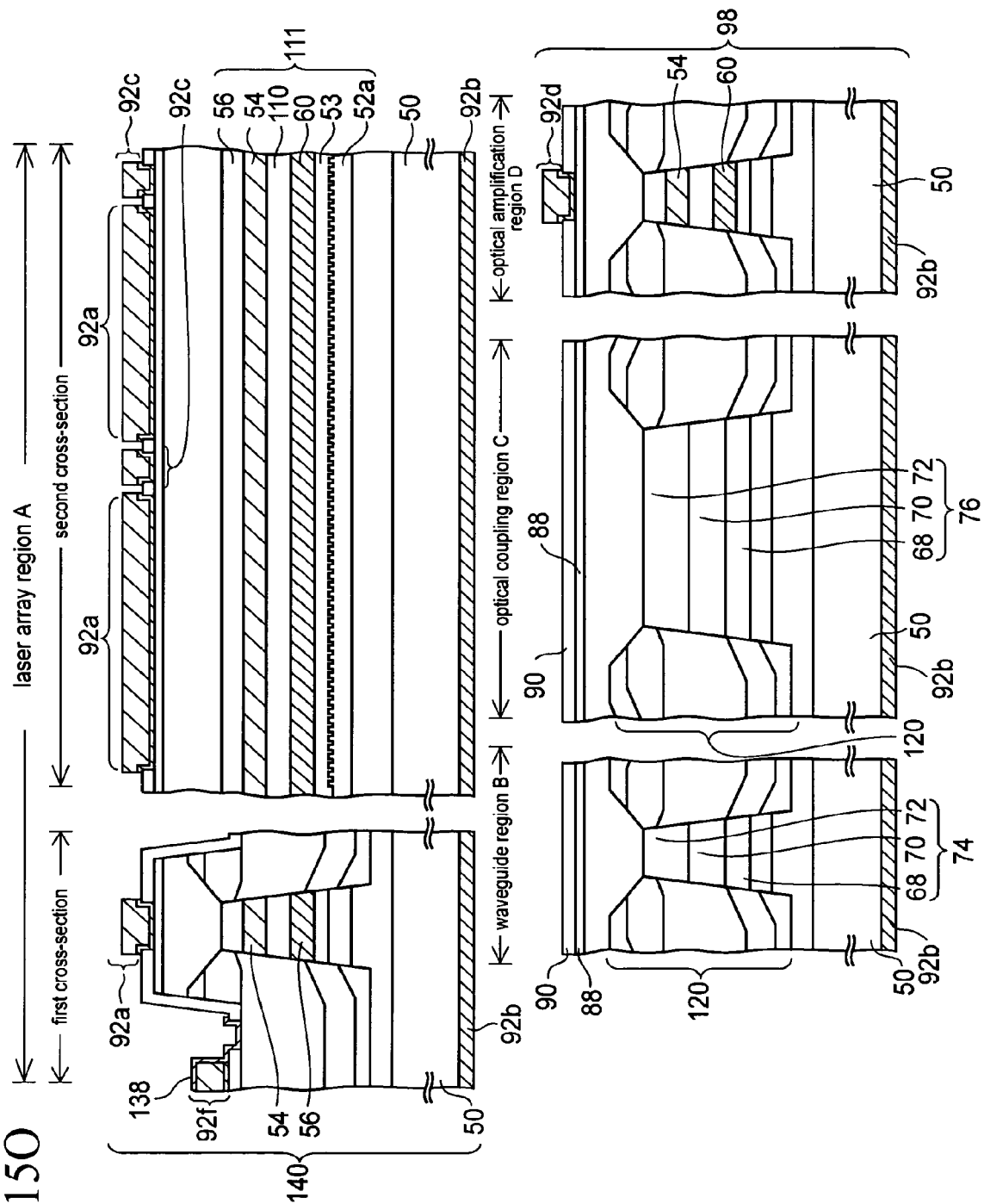

Subsequently, a description will be given of a process to obtaining a cross-sectional shape shown in FIG. 15N.

Firstly, the protective layer 90 is patterned by EB lithography or photolithography, thus forming a contact hole 90f in the protective layer 90 in the contact region CR. Then, the upper surface of the second n-type InP layer 126 is exposed in the contact hole 90f.

Next, an Au—Ge layer with a thickness of approximately 0.05 µm and an Au layer with a thickness of approximately 0.25 µm are formed by the evaporation method all over the contact region CR including the inside of the contact hole 90f. Thereafter, these metal deposition films are patterned by EB lithography or photolithography, and the metal deposition films are left as a conductive pattern 138 next to the mesa stripe in the laser array region A. The conductive pattern 138 functions to electrically connect the second n-type InP layer 126 and the electrode 92f for the interlayer through the contact hole 90f.

Following this, the back side of the InP substrate 50 is polished to make the thickness of the InP substrate as thin as 150 μm, for example.

Subsequently, as shown in FIG. 15O, on the back side of the InP substrate 50, Au, Zn and Au layers are formed by the evaporation method to thicknesses of 0.01 μm, 0.02 μm and 0.25 μm, respectively. In addition, another Au layer is formed thereon by electrolytic plating to a thickness of approximately 3 μm, thus forming the electrode 92b for the refractive index control layer, which is formed of these metal deposition films.

As described above, the basic structure of the optical semiconductor device according to this embodiment is completed.

In this optical semiconductor device, a TTG-type wavelength-tunable laser element 140 is constructed from the above-mentioned structure 111, the electrode 92a for the active layer formed above the structure 111, and the electrode 92b for the refractive index control layer formed on the back side of the InP substrate 50.

The laser oscillation is performed in the active layer 54 due to current injection from the electrode 92a for the active layer in the TTG-type wavelength-tunable laser element 140.

Upon the laser oscillation, a current is injected from the electrode 92b for the refractive index control layer to the refractive index control layer 60. By changing the amount of the current injection, the carrier density is changed in the refractive index control layer 60, thus changing the refractive index of the refractive index control layer 60 due to a plasma effect. Because of such a change in refractive index, the Bragg wavelength of the refractive index control layer 60, which is determined by the pitch of the diffraction grating 52a, is also changed. Therefore, the filter wavelength of the refractive index control layer 60 can also be changed.

Hence, among the lasers oscillated from the active layer 54, only lasers with a wavelength matching the filter wavelength of the refractive index control layer 60 are taken out. Thus, it is made possible to change the wavelength of a laser outputted from the laser element 140 by changing the amount of the current injection into the refractive index control layer 60 and changing its filter wavelength.

Figure 17:
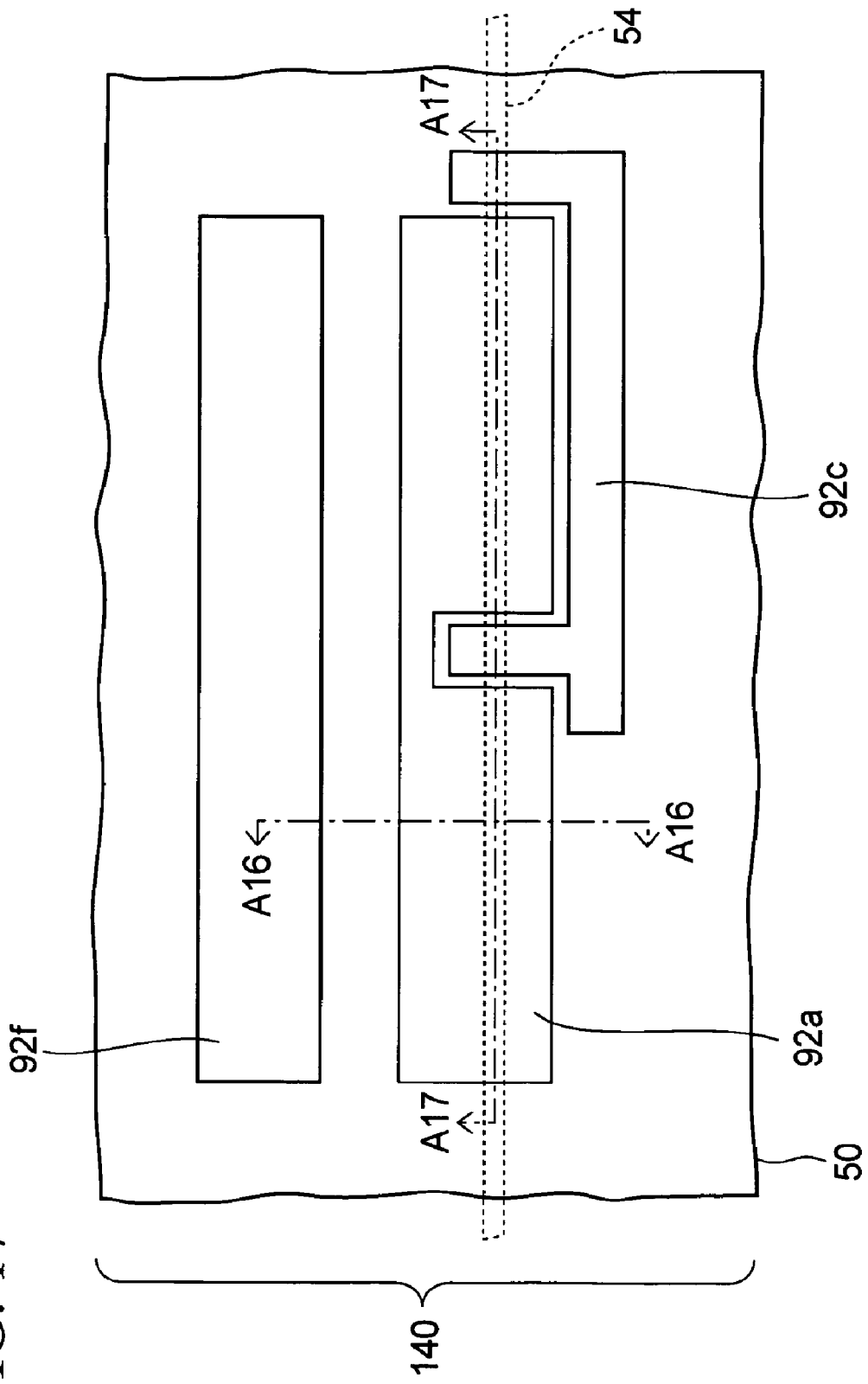
FIG. 17 is a plan view of a laser element included in the optical semiconductor device according to the fifth embodiment of the present invention.

FIG. 17 is a plan view of the TTG-type laser element 140. A first cross-section of the laser array region A in the above-mentioned FIG. 15O corresponds to a cross-sectional view taken along the A16-A16 line in FIG. 17, and a second cross-section corresponds to a cross-sectional view taken along the A17-A17 line in the same drawing.

Figure 16D:
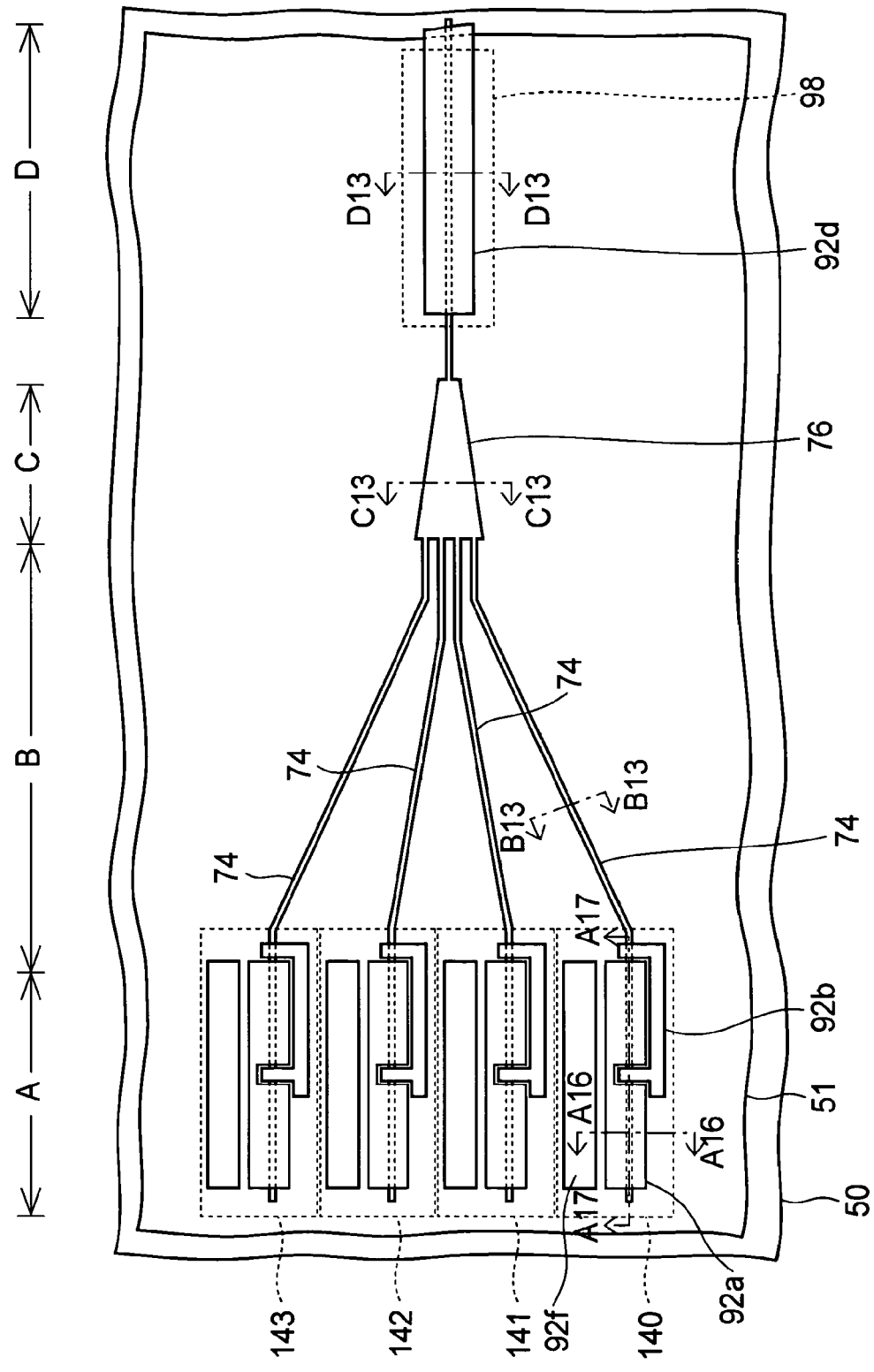

FIG. 16D is a plan view of the optical semiconductor device. Note that the cross-sectional views of the regions B, C and D in FIG. 15O correspond to those taken along the B13-B13 line, the C13-C13 line and the D13-D13 line in FIG. 16D, respectively.

As shown in FIG. 16D, three more TTG-type laser elements 141 to 143, which have the same structure as that of the laser element 140, are formed in the laser array region A of the optical semiconductor device, in addition to the above-described laser element 140.

The oscillation wavelength of each laser element 140 to 143 is slightly different from each other by changing the pitch of the diffraction grating constituting each laser element. Thus, the laser elements work for different channels from each other in the WDM. Moreover, each single laser element 140 to 143 can change their wavelengths of the laser oscillation as described above, thus even one of the laser elements 140 to 143 can work for a plurality of channels.

Then, after the lasers outputted from each laser element 140 to 143 pass through the waveguides 74, the lasers are passed through the optical coupler 76. Afterwards, the intensity of the laser is amplified in the optical amplifier 98, and the laser is outputted to the outside.

Next, a description will be given of the behavior of the optical semiconductor device.

FIG. 18 is a cross-sectional view for explaining the behavior of the above-mentioned laser element 140. Note that the remaining three laser elements 141 to 143 shown in FIG. 16D have the same structure as this. Moreover, in FIG. 18, the same reference numerals as those of the first embodiment are allocated to the components which were described in the first embodiment, and the descriptions thereof will be omitted hereinafter.

As shown in FIG. 18, under practical use, the above-described electrodes 92a, 92c and 92b are electrically connected respectively to the current source 106 for activation, the current source 107 for switching and the current source 108 for refractive index control, while the interlayer 110 is electrically grounded.

Then, out of currents to be supplied from these current sources 106 to 108 to the laser element 140, the current $I_{act}$ for activation, and the current $I_{sw}$ for switching flow between the active layer 54 and the interlayer 110 respectively at a current density of $J_{act}$ (=$I_{act}/L_3$) and $J_{sw}$ (=$I_{sw}/L_4$), and the current $I_{tune}$ for refractive index control flows between the refractive index control layer 60 and the interlayer 110 at a current density of $J_{tune}$ (=$I_{tune}/L_5$). Note that in the above, $L_3$ and $L_4$ are the total lengths of the lengths $l_3$ and $l_4$ of the electrode 92a for activation and the electrode 92c for switching in an axial direction of the resonator, respectively, and that $L_5$ is the length of the electrode 92b for the refractive index control layer in the axial direction of the resonator.

The timings of supplying these currents $I_{act}$, $I_{sw}$ and $I_{tune}$ are basically the same as those in the first embodiment, and follow the timing chart explained in FIG. 9, for example.

As described in the first embodiment, a current whose current density is $J_{drive}$ is previously supplied to the active layer 54 as a pre-bias current for the active layer at time $T_p$ which is time before the laser element 140 is oscillated by use of the timings of FIG. 9. At this point, the switching current $I_{sw}$ is not supplied. Therefore, the active layer 54 under the switching electrode 92c in the switching region Y (see FIG. 18) absorbs spontaneously emitted light, which is generated by the pre-bias current for the active layer in the active layer 54 in the other areas. Hence, during this period of time, the laser oscillation, which is caused by the spontaneously emitted light feeding back and forth inside the laser element 140, is prevented from occurring, while the spontaneously emitted light is prevented from leaking to the subsequent stage. Thus, the laser element 140 becomes "off" state.

Then, after time, which is equal to or more than time $T_E$ necessary for the carrier densities to reach thermal equilibrium in the active layer 54 and the refractive index control layer 60, elapses, the absorption of the spontaneously emitted light in the active layer 54 in the switching region Y is halted by starting the supply of the switching current $I_{sw}$. As a result, the spontaneously emitted light generated in the active layer 54 is enabled to travel freely inside the laser element 140. Thus, the stimulated emission of photons, which is attributed to the spontaneously emitted light, occurs in the active layer 54. Accordingly, the laser oscillation is performed in the laser element 140, thus turning on the laser element 140.

According to such a driving method of the laser element 140, before the laser element 140 is turned on, the pre-bias current for the refractive index control layer and the pre-bias current for the active layer are made to flow respectively to the refractive index control layer 60 and the active layer 54 except in the switching region Y. Then, after the carrier densities and the like in the active layer 54 and the refractive index control layer 60 reach thermal equilibrium, the switching current $I_{sw}$ is supplied to the laser element 140. Therefore, it is possible to prevent the laser oscillation from being performed under the state where the wavelength is unstable due to the thermal fluctuation of carrier densities. Accordingly, it is made possible to output high-quality laser light whose wavelength is stabilized.

Note that although the case of following the timing chart of FIG. 9 was described above, the timing of supplying each current $I_{act}$, $I_{sw}$ and $I_{tune}$ may be controlled following the timing chart of FIG. 11 explained in the first embodiment.

Moreover, the switching operation of the laser outputs between the plurality of laser elements 140 to 143 shown in FIG. 16D can be performed following the timing chart of FIG. 12 explained in the third embodiment. According to the switching operation of this kind, the carrier densities of the active layer 54 and the refractive index control layer 60 are put in thermal equilibrium, by previously letting the pre-bias current flow to the laser elements 140 to 143 before the switching. Therefore, it is possible to immediately switch the laser outputs without waiting for the carrier densities thereof to reach thermal equilibrium. Hence, it is made possible to provide an optical semiconductor device for the WDM which is capable of high-speed switching.

Furthermore, regarding the electrode 92c for switching shown in FIG. 17, the electrode 92c for switching covers the active layer 54 with a stripe pattern at the central area and the output end of the laser element 140. However, the plane layout of the electrode 92c for switching is not limited to this. For example, as shown in FIG. 7 in the first embodiment, the electrode 92c for switching may be disposed only in the central area of the laser element 140.

According to the present invention, before a laser element is turned on, a pre-bias current for an active layer and a pre-bias current for a refractive index control layer are supplied respectively to the active layer and the refractive index control layer of the laser element. Thus, even if the laser element is turned on by supplying a switching current thereto, it is possible to prevent a laser wavelength associated with the thermal fluctuations of the carrier densities in the active layer and the refractive index control layer from becoming unstable.

In addition, two or more laser elements of this kind are provided and the active layer is put in thermal equilibrium by supplying the pre-bias current to one laser element when the other laser element is in an "on" state. Therefore, it is made possible to perform switching to the former laser element at high speed while preventing the laser wavelength from becoming unstable.

The invention claimed is:

1. A method of driving an optical semiconductor device, where the optical semiconductor device comprising:
   a semiconductor substrate;
   a structure formed on one surface of the semiconductor substrate and including at least a diffraction grating, an active layer generating light by a current injection, and a refractive index control layer whose refractive index is allowed to be changed by a current injection; and
   a laser element including an electrode for the active layer, an electrode for the refractive index control layer, and an electrode for switching, the electrodes being formed independently of each other and formed any one of above the structure and on an other surface of the semiconductor substrate,
   and the method comprising the steps of:
   in a state of supplying no switching current from the electrode for switching to the active layer, supplying a pre-bias current for the active layer from the electrode for the active layer to the active layer, as well as supplying a pre-bias current for the refractive index control layer from the electrode for the refractive index control layer to the refractive index control layer in advance,
   turning on the laser element by supplying switching current from the electrode for switching to a part of the active layer while supplying a current for activation from the electrode for the active layer to the active layer, and turning off the laser element by halting the supply of the switching current.

2. The method of driving the optical semiconductor device according to claim 1,
   wherein the laser element is provided at least in two, and when the one laser element is in an on state, the pre-bias currents are supplied to the other laser element, and
   a laser output is switched from the one laser element to the other laser element by supplying the switching current to the other laser element and thus turning on the other laser element when the one laser element is turned off.

3. The method of driving the optical semiconductor device according to claim 1, wherein a current density of the pre-bias current for the active layer is set to be larger than a current density of the current for activation in the on state of the laser element.

4. The method of driving the optical semiconductor device according to claim 1, wherein a refractive index of the refractive index control layer is changed by supplying the current for refractive index control from the electrode for the refractive index control layer to the refractive index control layer when the laser element 100 is in the on state, and thus laser light having a wavelength in accordance with the refractive index is outputted from the laser element.

* * * * *

UNITED STATES PATENT AND TRADEMARK OFFICE
CERTIFICATE OF CORRECTION

| | | |
|---|---|---|
| PATENT NO. | : 8,073,033 B2 | Page 1 of 1 |
| APPLICATION NO. | : 12/617637 | |
| DATED | : December 6, 2011 | |
| INVENTOR(S) | : Akinori Hayakawa and Ken Morito | |

It is certified that error appears in the above-identified patent and that said Letters Patent is hereby corrected as shown below:

On the Title Page, insert the following:

--(62) Division of Application No. 11/250/434, filed on October 17, 2005, now Pat. No. 7,633,984.-- and

--(30) Foreign Application Priority Data: March 31, 2005 (JP)............2005-104750.--.

Signed and Sealed this

Seventh Day of February, 2012

David J. Kappos
*Director of the United States Patent and Trademark Office*